(12) United States Patent
Veeramani et al.

(10) Patent No.: US 12,196,781 B2
(45) Date of Patent: Jan. 14, 2025

(54) PROBES WITH PLANAR UNBIASED SPRING ELEMENTS FOR ELECTRONIC COMPONENT CONTACT, METHODS FOR MAKING SUCH PROBES, AND METHODS FOR USING SUCH PROBES

(71) Applicant: Microfabrica Inc., Van Nuys, CA (US)

(72) Inventors: Arun S. Veeramani, Vista, CA (US); Ming Ting Wu, San Jose, CA (US); Dennis R. Smalley, Newhall, CA (US)

(73) Assignee: Microfabrica Inc., Van Nuys (CA)

( * ) Notice: Subject to any disclaimer, the term of this patent is extended or adjusted under 35 U.S.C. 154(b) by 156 days.

(21) Appl. No.: 17/968,552

(22) Filed: Oct. 18, 2022

(65) Prior Publication Data

US 2024/0094256 A1 Mar. 21, 2024

Related U.S. Application Data

(63) Continuation-in-part of application No. 17/967,825, filed on Oct. 17, 2022, and a continuation-in-part of
(Continued)

(51) Int. Cl.
| | | |
|---|---|---|
| *G01R 1/073* | (2006.01) | |
| *G01R 1/067* | (2006.01) | |
| *G01R 3/00* | (2006.01) | |

(52) U.S. Cl.
CPC ..... *G01R 1/07314* (2013.01); *G01R 1/06722* (2013.01); *G01R 1/06738* (2013.01); *G01R 3/00* (2013.01)

(58) Field of Classification Search
CPC ............ G01R 1/07314; G01R 1/06722; G01R 1/06738
See application file for complete search history.

(56) References Cited

U.S. PATENT DOCUMENTS

| 4,027,935 A | 6/1977 | Byrnes et al. |
| 4,116,523 A | 9/1978 | Coberly et al. |

(Continued)

FOREIGN PATENT DOCUMENTS

| EP | 0897655 B1 | 7/2000 |
| JP | 2734412 B2 | 3/1998 |

(Continued)

OTHER PUBLICATIONS

International Search Report and Written Opinion, PCT/US2023/028698, mailed on Nov. 9, 2023.
(Continued)

*Primary Examiner* — Paresh Patel
(74) *Attorney, Agent, or Firm* — Greenberg Traurig

(57) ABSTRACT

Probes for contacting electronic components include compliant modules stacked in a serial configuration, which are supported by a sheath, exoskeleton, or endoskeleton which allows for linear longitudinal compression of probe ends toward one another wherein the compliant elements within the compliant modules include planar springs (when unbiased). Alternatively, probes may be formed from single modules or back-to-back modules that may share a common base/standoff. Modules may allow for lateral and/or longitudinal alignment relative to array structures or other modules. Planar springs may be spirals, interlaced spirals having common or offset longitudinal levels, with similar or different rotational orientations that are functionally joined, and planar springs may transition into multiple thinner spring elements along their lengths. Compression of probe tips toward one another may cause portions of spring elements to move closer together or further apart.

25 Claims, 31 Drawing Sheets

Related U.S. Application Data application No. 17/967,548, filed on Oct. 17, 2022, and a continuation-in-part of application No. 17/967,808, filed on Oct. 17, 2022, now abandoned, and a continuation-in-part of application No. 17/967,835, filed on Oct. 17, 2022, now abandoned, said application No. 17/967,548 is a continuation-in-part of application No. 17/507,598, filed on Oct. 21, 2021, said application No. 17/967,825 is a continuation-in-part of application No. 17/507,598, filed on Oct. 21, 2021, said application No. 17/967,835 is a continuation-in-part of application No. 17/507,598, filed on Oct. 21, 2021, said application No. 17/967,808 is a continuation-in-part of application No. 17/507,598, filed on Oct. 21, 2021, which is a continuation of application No. 17/139,925, filed on Dec. 31, 2020, now Pat. No. 11,761,982.

(60) Provisional application No. 63/281,555, filed on Nov. 19, 2021, provisional application No. 63/278,287, filed on Nov. 11, 2021, provisional application No. 63/275,610, filed on Nov. 4, 2021, provisional application No. 63/275,350, filed on Nov. 3, 2021, provisional application No. 63/256,137, filed on Oct. 15, 2021, provisional application No. 62/985,859, filed on Mar. 5, 2020, provisional application No. 62/955,781, filed on Dec. 31, 2019.

(56) References Cited

U.S. PATENT DOCUMENTS

| | | |
|---|---|---|
| 4,737,114 A | 4/1988 | Yaegashi |
| 4,773,877 A | 9/1988 | Kruger et al. |
| 4,821,411 A | 4/1989 | Yaegashi |
| 4,952,272 A | 8/1990 | Okino et al. |
| 5,177,438 A | 1/1993 | Littlebury et al. |
| 5,286,208 A | 2/1994 | Matsuoka |
| 5,321,685 A | 6/1994 | Nose et al. |
| 5,476,211 A | 12/1995 | Khandros |
| 5,513,430 A | 5/1996 | Yanof et al. |
| 5,599,194 A | 2/1997 | Ozawa et al. |
| 5,605,614 A | 2/1997 | Bornand |
| 5,811,982 A | 9/1998 | Beaman et al. |
| 5,865,641 A | 2/1999 | Swart et al. |
| 5,892,223 A | 4/1999 | Karpov et al. |
| 5,917,707 A | 6/1999 | Khandros et al. |
| 5,952,843 A | 9/1999 | Vinh |
| 5,967,856 A | 10/1999 | Meller |
| 5,994,152 A | 11/1999 | Khandros et al. |
| 6,043,563 A | 3/2000 | Eldridge et al. |
| 6,184,053 B1 | 2/2001 | Eldridge et al. |
| 6,190,181 B1 | 2/2001 | Affolter et al. |
| 6,208,155 B1 | 3/2001 | Barabi et al. |
| 6,218,203 B1 | 4/2001 | Khoury et al. |
| 6,250,933 B1 | 6/2001 | Khoury et al. |
| 6,255,126 B1 | 7/2001 | Mathieu et al. |
| 6,264,477 B1 | 7/2001 | Smith et al. |
| 6,268,015 B1 | 7/2001 | Mathieu et al. |
| 6,299,458 B1 | 10/2001 | Yamagami et al. |
| 6,329,827 B1 | 12/2001 | Beaman et al. |
| 6,336,269 B1 | 1/2002 | Eldridge et al. |
| 6,358,097 B1 | 3/2002 | Peters |
| 6,359,455 B1 | 3/2002 | Takekoshi |
| 6,414,501 B2 | 7/2002 | Kim et al. |
| 6,426,638 B1 | 7/2002 | Di Stefano |
| 6,471,524 B1 | 10/2002 | Nakano et al. |
| 6,482,013 B2 | 11/2002 | Eldridge et al. |
| 6,491,968 B1 | 12/2002 | Mathieu et al. |
| 6,507,207 B2 | 1/2003 | Nguyen |
| 6,520,778 B1 | 2/2003 | Eldridge et al. |
| 6,560,861 B2 | 5/2003 | Fork et al. |
| 6,573,738 B1 | 6/2003 | Matsuo et al. |
| 6,624,645 B2 | 9/2003 | Haseyama et al. |
| 6,626,708 B2 | 9/2003 | Phillips |
| 6,651,325 B2 | 11/2003 | Lee et al. |
| 6,672,876 B1 | 1/2004 | Takekoshi |
| 6,677,772 B1 | 1/2004 | Faull |
| 6,690,185 B1 | 2/2004 | Khandros et al. |
| 6,720,781 B2 | 4/2004 | Ott et al. |
| 6,758,682 B1 | 7/2004 | Kosmala |
| 6,771,084 B2 | 8/2004 | Di Stefano |
| 6,777,319 B2 | 8/2004 | Grube et al. |
| 6,783,405 B1 | 8/2004 | Yen |
| 6,784,378 B2 | 8/2004 | Zhu et al. |
| 6,787,456 B1 | 9/2004 | Kripesh et al. |
| 6,807,734 B2 | 10/2004 | Eldridge et al. |
| 6,811,406 B2 | 11/2004 | Grube |
| 6,844,748 B2 | 1/2005 | Sato et al. |
| 6,855,010 B1 | 2/2005 | Yen |
| D507,198 S | 7/2005 | Kister |
| 6,935,901 B2 | 8/2005 | Simpson et al. |
| 6,967,492 B2 | 11/2005 | Tsui et al. |
| 6,998,857 B2 | 2/2006 | Terada et al. |
| 7,047,638 B2 | 5/2006 | Eldridge et al. |
| 7,063,541 B2 | 6/2006 | Grube et al. |
| 7,091,729 B2 | 8/2006 | Kister |
| 7,098,540 B1 | 8/2006 | Mohan et al. |
| 7,126,220 B2 | 10/2006 | Lahiri et al. |
| 7,131,848 B2 | 11/2006 | Lindsey et al. |
| 7,148,709 B2 | 12/2006 | Kister |
| 7,172,431 B2 | 2/2007 | Beaman et al. |
| 7,220,134 B2 | 5/2007 | Goodman et al. |
| 7,256,593 B2 | 8/2007 | Treibergs |
| 7,273,812 B2 | 9/2007 | Kim et al. |
| 7,279,917 B2 | 10/2007 | Williams et al. |
| 7,326,327 B2 | 2/2008 | Armstrong et al. |
| 7,412,767 B2 | 8/2008 | Kim et al. |
| 7,435,102 B2 | 10/2008 | Goodman |
| 7,436,192 B2 | 10/2008 | Kister |
| 7,437,813 B2 | 10/2008 | Tunaboylu et al. |
| 7,446,548 B2 | 11/2008 | Chen |
| 7,449,910 B2 | 11/2008 | Kirby et al. |
| 7,456,642 B2 | 11/2008 | Saulnier et al. |
| 7,462,800 B2 | 12/2008 | Tunaboylu et al. |
| 7,504,839 B2 | 3/2009 | Feigenbaum et al. |
| 7,504,840 B2 | 3/2009 | Arat et al. |
| 7,531,077 B2 | 5/2009 | Cohen et al. |
| 7,533,462 B2 | 5/2009 | Gleason et al. |
| 7,557,595 B2 | 7/2009 | Chen et al. |
| 7,579,856 B2 | 8/2009 | Khandros et al. |
| 7,583,098 B2 | 9/2009 | Tunaboylu et al. |
| 7,628,620 B2 | 12/2009 | Gritters |
| 7,629,807 B2 | 12/2009 | Hirakawa et al. |
| 7,637,007 B2 | 12/2009 | Tunaboylu et al. |
| 7,638,028 B2 | 12/2009 | Tunaboylu et al. |
| 7,674,112 B2 | 3/2010 | Gritters et al. |
| 7,690,925 B2 | 4/2010 | Goodman |
| 7,721,430 B2 | 5/2010 | Chartarifsky et al. |
| 7,731,546 B2 | 6/2010 | Grube et al. |
| 7,733,101 B2 | 6/2010 | Kister |
| 7,798,822 B2 | 9/2010 | Eldridge et al. |
| 7,808,261 B2 | 10/2010 | Kimoto |
| 7,841,863 B2 | 11/2010 | Mathieu et al. |
| 7,850,460 B2 | 12/2010 | Weiland et al. |
| 7,851,794 B2 | 12/2010 | Hobbs |
| 7,888,958 B2 | 2/2011 | Souma et al. |
| 7,922,544 B2 | 4/2011 | Chung |
| 7,928,751 B2 | 4/2011 | Hsu |
| 7,956,288 B2 | 6/2011 | Kazama et al. |
| 8,012,331 B2 | 9/2011 | Lee et al. |
| 8,111,080 B2 | 2/2012 | Kister |
| 8,299,394 B2 | 10/2012 | Theppakuttai et al. |
| 8,415,963 B2 | 4/2013 | Kister |
| 8,427,186 B2 | 4/2013 | McFarland |
| 8,451,017 B2 | 5/2013 | Gleason et al. |
| 8,613,846 B2 | 12/2013 | Wu et al. |
| 8,717,054 B2 | 5/2014 | Chen et al. |
| 8,717,055 B2 | 5/2014 | Chen et al. |
| 8,723,543 B2 | 5/2014 | Chen et al. |
| 8,729,916 B2 | 5/2014 | Chen et al. |
| 8,742,272 B2 | 6/2014 | English et al. |

(56) References Cited

U.S. PATENT DOCUMENTS

| | | |
|---|---|---|
| 8,926,379 B2 | 1/2015 | Vinther |
| 9,030,222 B2 | 5/2015 | Eldridge et al. |
| 9,052,342 B2 | 6/2015 | Fan et al. |
| 9,097,740 B2 | 8/2015 | Kister |
| 9,121,868 B2 | 9/2015 | Kister |
| 9,244,101 B2 | 1/2016 | Cohen et al. |
| 9,316,670 B2 | 4/2016 | Kister |
| 9,476,911 B2 | 10/2016 | Kister |
| RE46,221 E | 11/2016 | Kister |
| 9,540,233 B2 | 1/2017 | Kumar et al. |
| 9,671,429 B2 | 6/2017 | Wu et al. |
| 9,702,904 B2 | 7/2017 | Breinlinger et al. |
| 9,972,933 B2 | 5/2018 | Kimura et al. |
| 9,991,610 B2 | 6/2018 | Kurita |
| 10,215,775 B2 | 2/2019 | Wu et al. |
| 10,416,192 B2 | 9/2019 | Chen et al. |
| 10,641,792 B2 | 5/2020 | Wu et al. |
| 10,788,512 B2 | 9/2020 | Chen et al. |
| 10,877,067 B2 | 12/2020 | Chen et al. |
| 11,131,690 B2 | 9/2021 | Crippa |
| 11,761,982 B1 | 9/2023 | Veeramani |
| 2002/0013085 A1 | 1/2002 | Boyle et al. |
| 2002/0196038 A1 | 12/2002 | Okuno et al. |
| 2003/0001606 A1 | 1/2003 | Bende et al. |
| 2004/0051541 A1 | 3/2004 | Zhou et al. |
| 2005/0070170 A1 | 3/2005 | Zhang et al. |
| 2005/0088192 A1* | 4/2005 | Haga ............... G01R 1/06716 438/17 |
| 2005/0104609 A1 | 5/2005 | Arat et al. |
| 2005/0130456 A1 | 6/2005 | Haga |
| 2005/0176285 A1 | 8/2005 | Chen et al. |
| 2005/0179458 A1 | 8/2005 | Chen et al. |
| 2005/0184748 A1 | 8/2005 | Chen et al. |
| 2005/0189958 A1 | 9/2005 | Chen et al. |
| 2005/0200375 A1 | 9/2005 | Sudin |
| 2005/0253606 A1 | 11/2005 | Kim et al. |
| 2006/0006888 A1 | 1/2006 | Kruglick et al. |
| 2006/0051948 A1 | 3/2006 | Kim et al. |
| 2006/0053625 A1 | 3/2006 | Kim et al. |
| 2006/0170440 A1 | 8/2006 | Sudin |
| 2006/0238209 A1 | 10/2006 | Chen et al. |
| 2006/0279301 A1 | 12/2006 | Treibergs |
| 2007/0144841 A1 | 6/2007 | Chong et al. |
| 2007/0200576 A1 | 8/2007 | Laurent et al. |
| 2008/0106280 A1 | 5/2008 | Chen et al. |
| 2008/0108221 A1 | 5/2008 | Kim et al. |
| 2008/0111573 A1 | 5/2008 | Chen et al. |
| 2008/0174332 A1 | 7/2008 | Arat et al. |
| 2008/0211524 A1 | 9/2008 | Chen et al. |
| 2009/0066351 A1 | 3/2009 | Arat et al. |
| 2009/0079455 A1 | 3/2009 | Gritters |
| 2009/0256583 A1 | 10/2009 | Chen et al. |
| 2010/0088888 A1 | 4/2010 | Mathieu et al. |
| 2010/0134131 A1 | 6/2010 | Chen et al. |
| 2010/0155253 A1 | 6/2010 | Kim et al. |
| 2010/0176834 A1 | 7/2010 | Chen et al. |
| 2010/0207654 A1 | 8/2010 | Hsu |
| 2011/0050263 A1 | 3/2011 | Sato et al. |
| 2011/0147223 A1 | 6/2011 | Kumar et al. |
| 2011/0187397 A1 | 8/2011 | Chen et al. |
| 2011/0187398 A1 | 8/2011 | Chen et al. |
| 2012/0176122 A1 | 7/2012 | Hirata et al. |
| 2014/0065893 A1 | 3/2014 | Vinther |
| 2014/0231264 A1 | 8/2014 | Chen et al. |
| 2017/0219623 A1 | 8/2017 | Choi et al. |
| 2020/0064373 A1 | 2/2020 | Treibergs et al. |
| 2020/0241042 A1 | 7/2020 | Jeong et al. |
| 2021/0285984 A1 | 9/2021 | Cho et al. |
| 2024/0094255 A1 | 3/2024 | Veeramani et al. |
| 2024/0094257 A1 | 3/2024 | Veeramani et al. |
| 2024/0094258 A1 | 3/2024 | Veeramani et al. |

FOREIGN PATENT DOCUMENTS

| | | |
|---|---|---|
| JP | 2001337110 A | 12/2001 |
| JP | 2004156993 A | 6/2004 |
| JP | 2004340617 A | 12/2004 |
| JP | 2004340654 A | 12/2004 |
| JP | 4014040 B2 | 11/2007 |
| JP | 2008032400 A | 2/2008 |
| KR | 20070017935 | 2/2007 |
| WO | 2007097559 A1 | 8/2007 |
| WO | 2023080533 | 5/2023 |
| WO | 2023196428 | 10/2023 |

OTHER PUBLICATIONS

International Search Report and Written Opinion, PCT/US2023/028700, mailed on Nov. 9, 2023.
International Search Report and Written Opinion, PCT/US2023/076942, mailed on Feb. 22, 2024.
International Search Report and Written Opinion, PCT/US2023/076943, mailed on Feb. 23, 2024.
International Search Report & Written Opinion, PCT/US2023/076944, mailed on Feb. 23, 2024.
International Search Report & Written Opinion, PCT/US2023/077033, mailed on Feb. 26, 2024.
Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161-168.
Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.
"Microfabrication—Rapid Prototyping's Killer Application", Rapid Prototyping Report, CAD/CAM Publishing, Inc., Jun. 1999, pp. 1-5.
Adam L. Cohen, "3-D Micromachining by Electrochemical Fabrication", Micromachine Devices, Mar. 1999, pp. 6-7.
Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.
F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.
Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.
F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999, pp. 55-60.
Adam L. Cohen, "Electrochemical Fabrication (EFABTM)", Chapter 19 of the MEMS Handbook, edited by Mohamed Gad-El-Hak, CRC Press, 2002, p. 19/1-19/23.
Hill, Dr. Steve, "An E-FAB Way for Making the Micro World", Materials World is the journal of The Institute of Materials, Sep. 1999, vol. 7, No. 9, pp. 538-539.
Madden, John D. et al., "Three-Dimensional Microfabrication by Localized, Electrochemical Deposition", J. of Micro. Sys., Mar. 1996, 5(1):24-32.
Madou, Mark J., "Fundamentals of Microfabrication—The Science of Miniaturization", 2nd ed., 2001, pp. 402-412.
Marques, et al., "Fabrication of High-Aspect-Ratio Microstructures on Planar and Nonplanar Surfaces Using a Modified LIGA Process", Dec. 1997, 6(4):329-336.
Weeden, Otto, Keithley Instruments, Inc. "Probe Card Tutorial", pp. 1-40.

* cited by examiner

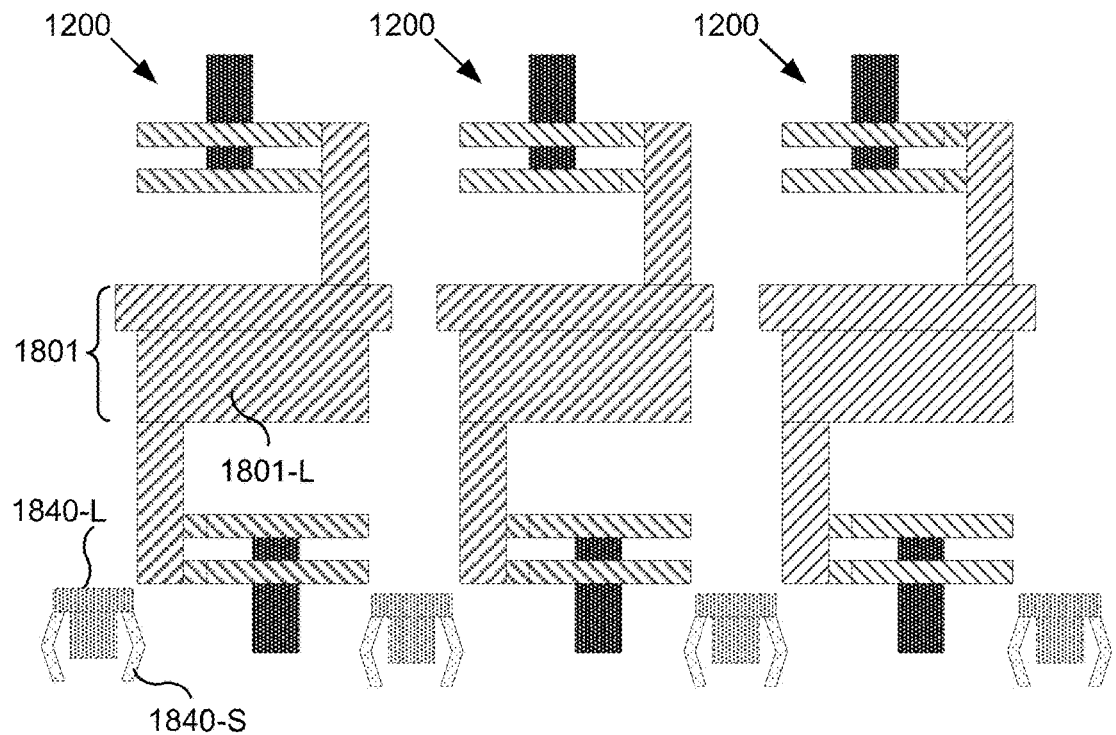
FIG. 18F1
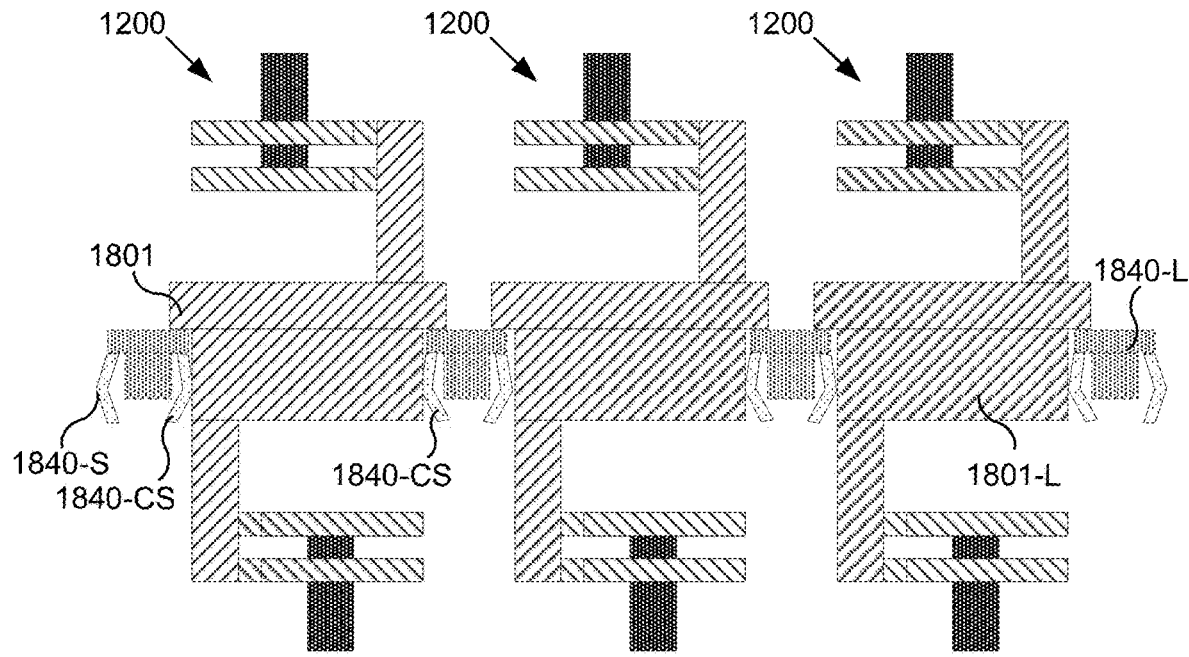
FIG. 18F2

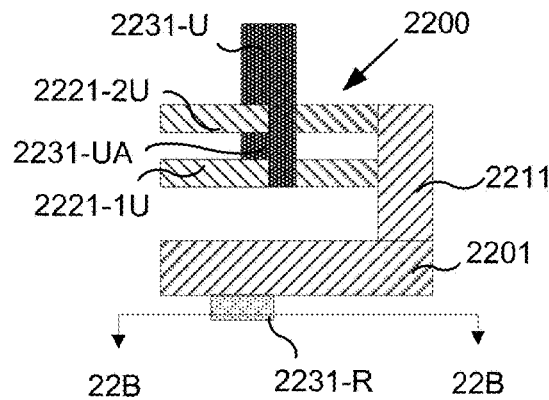
FIG. 22A
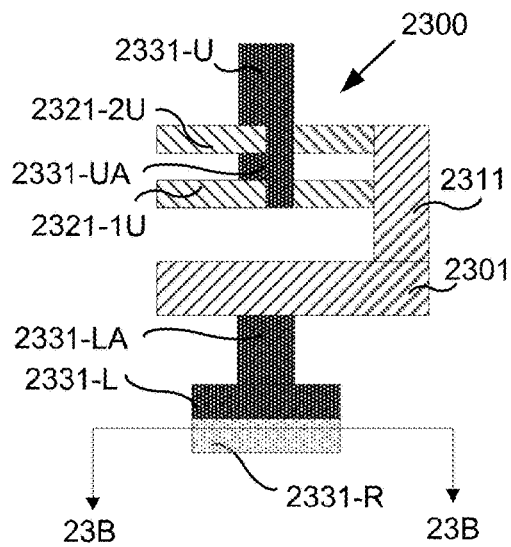
FIG. 23A
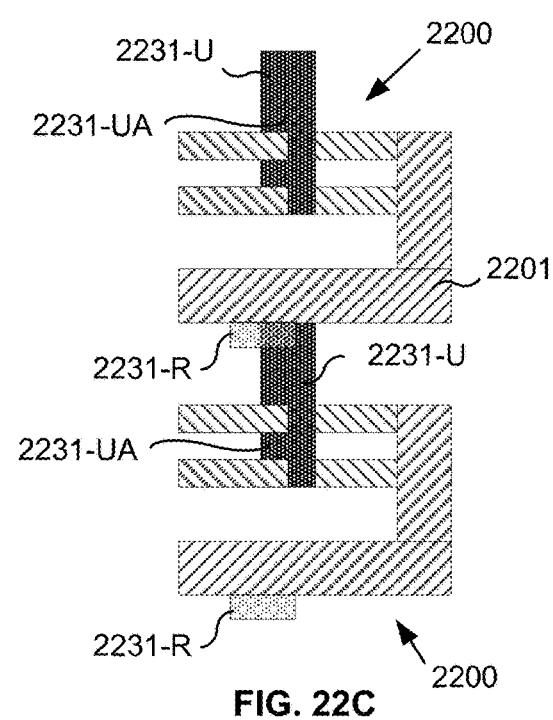
FIG. 22C
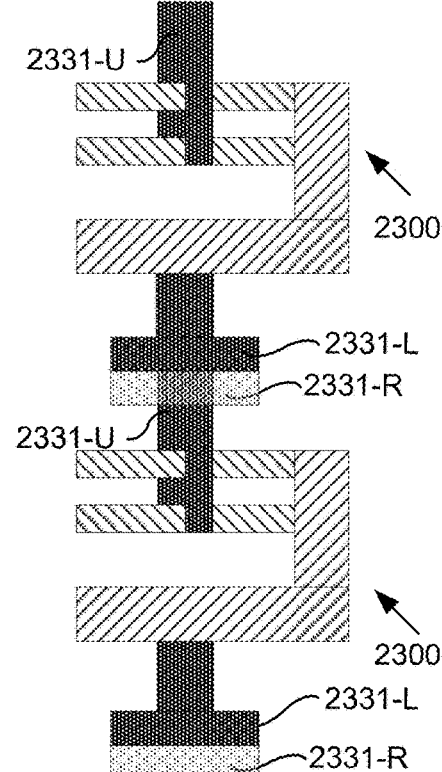
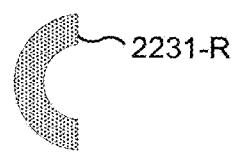
FIG. 22B
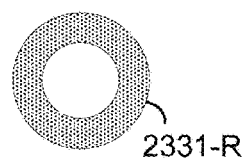
FIG. 23B
FIG. 23C

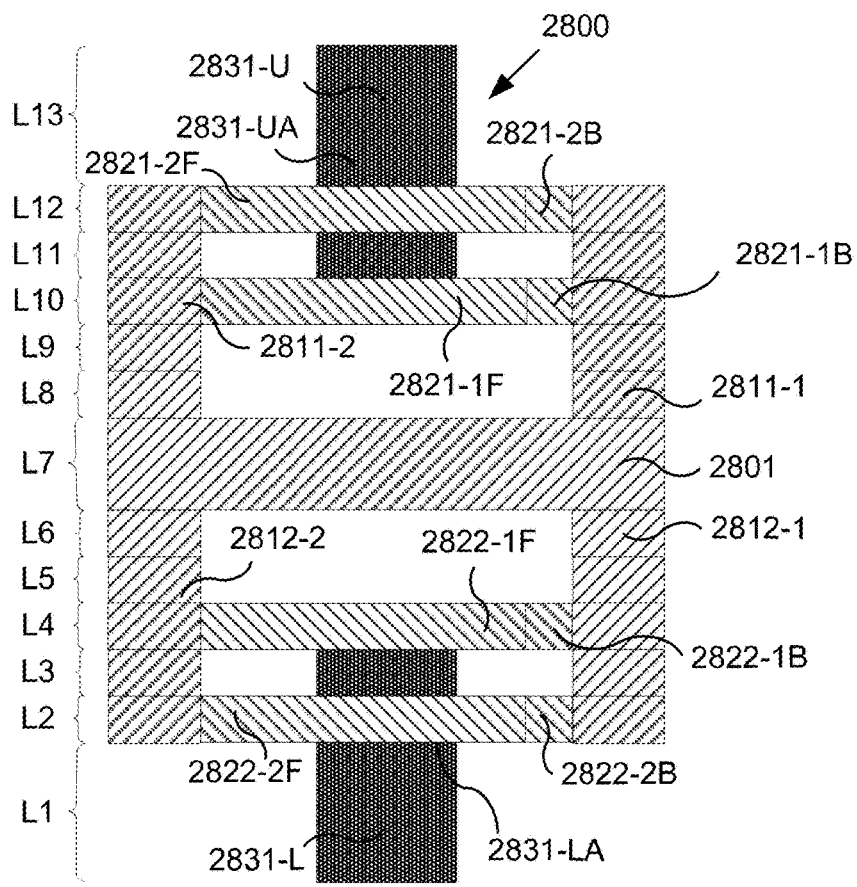
FIG. 28A
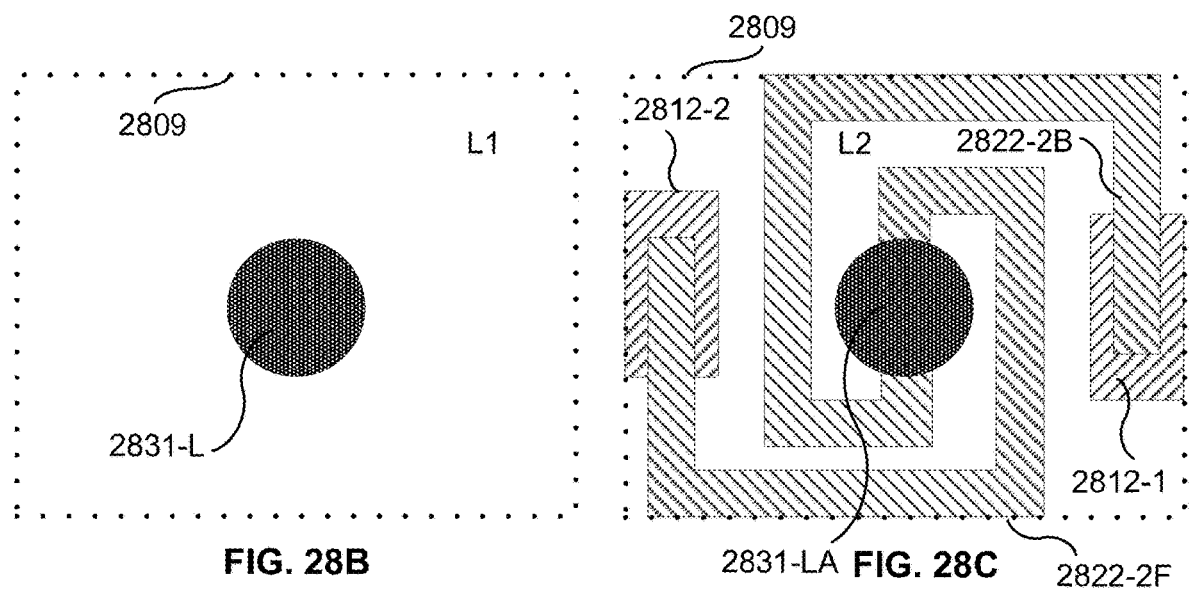
FIG. 28B
FIG. 28C

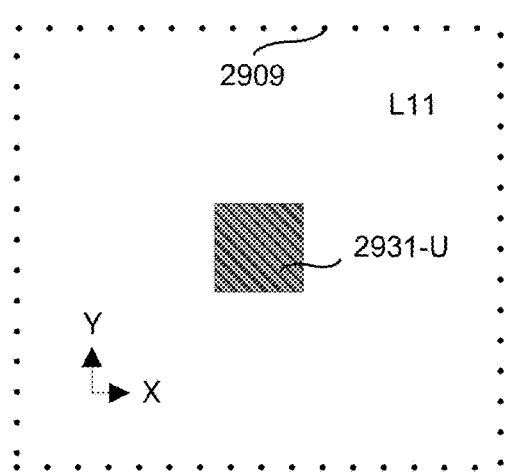
FIG. 29L
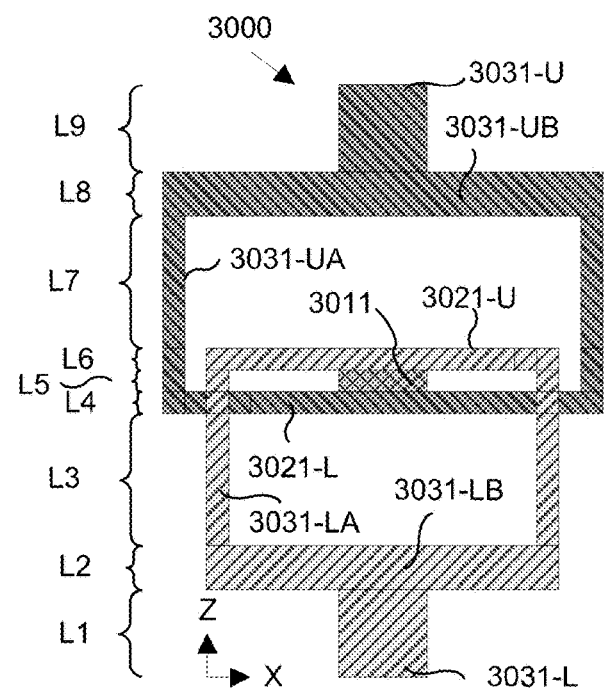
FIG. 30A1
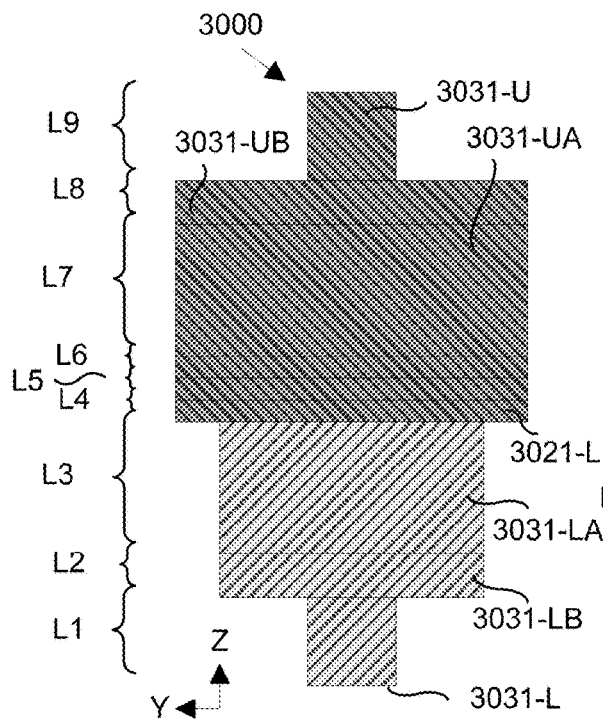
FIG. 30A2
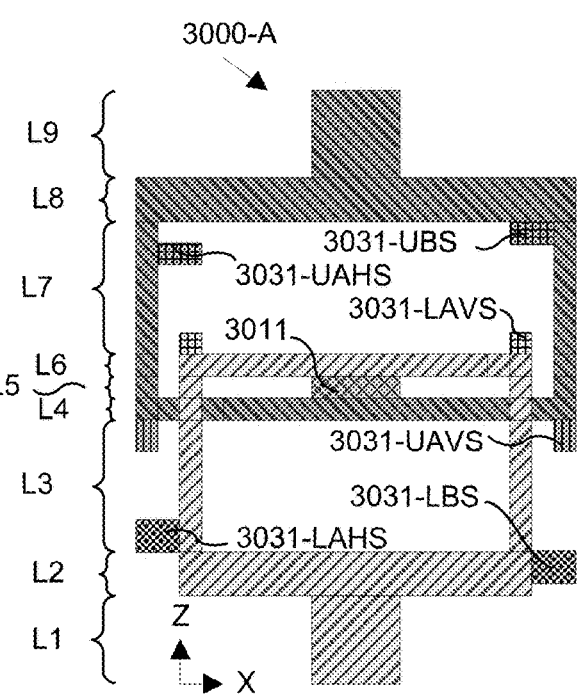
FIG. 30A3

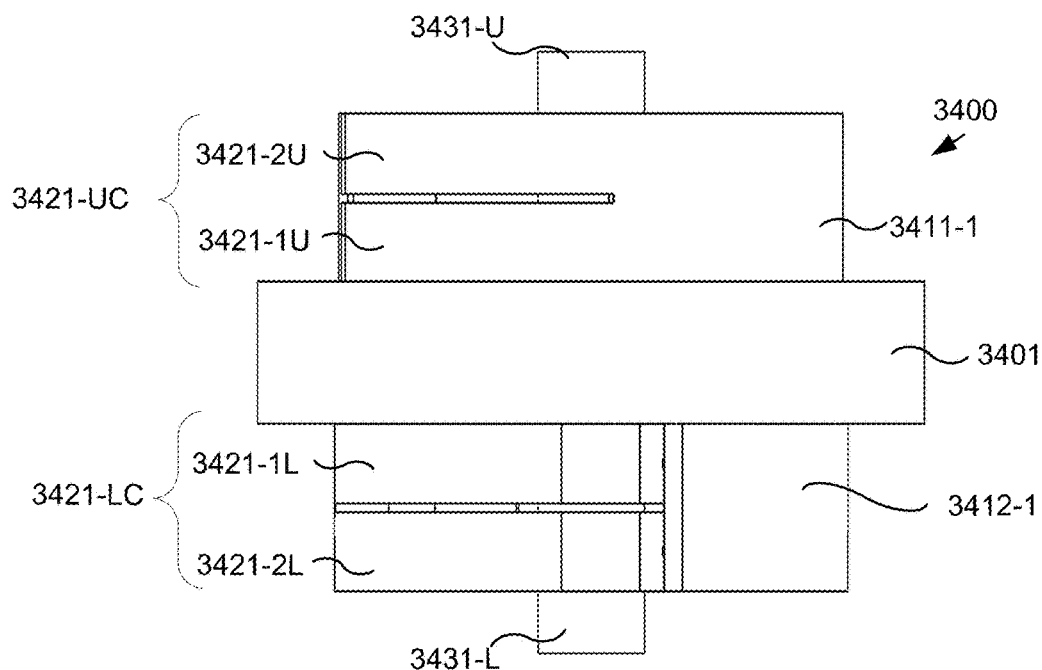
FIG. 34A
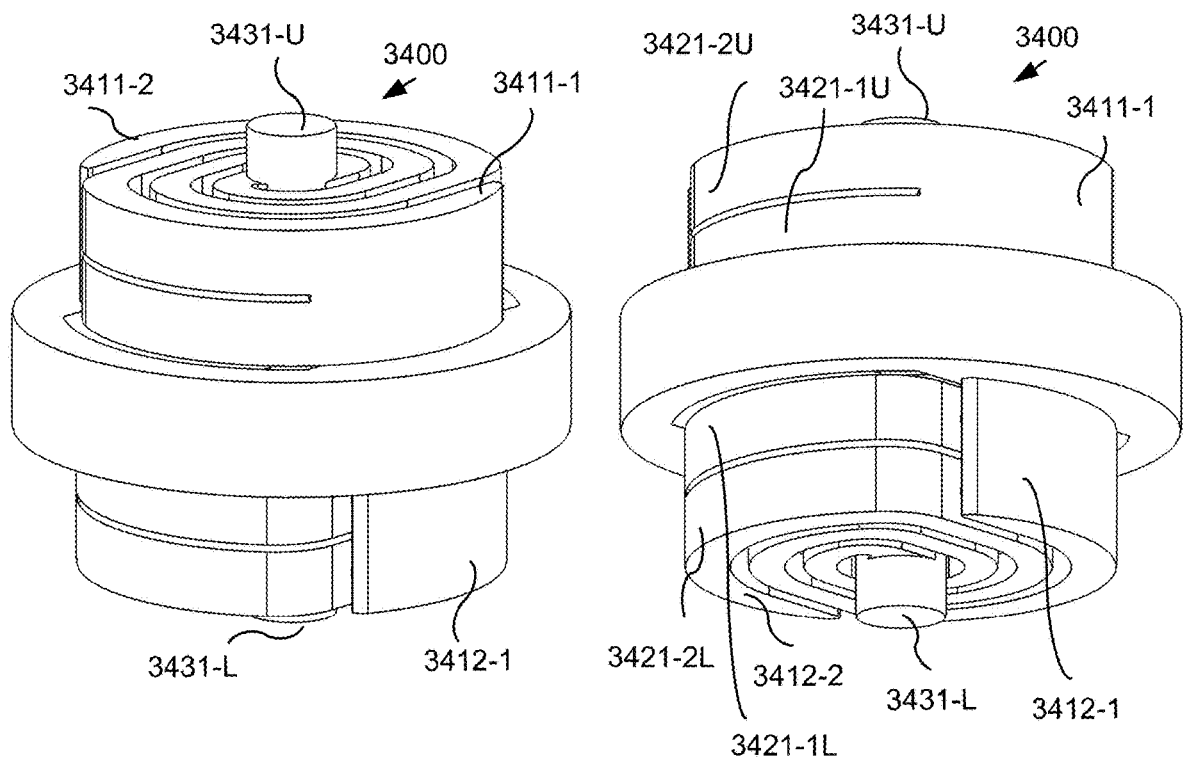
FIG. 34B1    FIG. 34B2

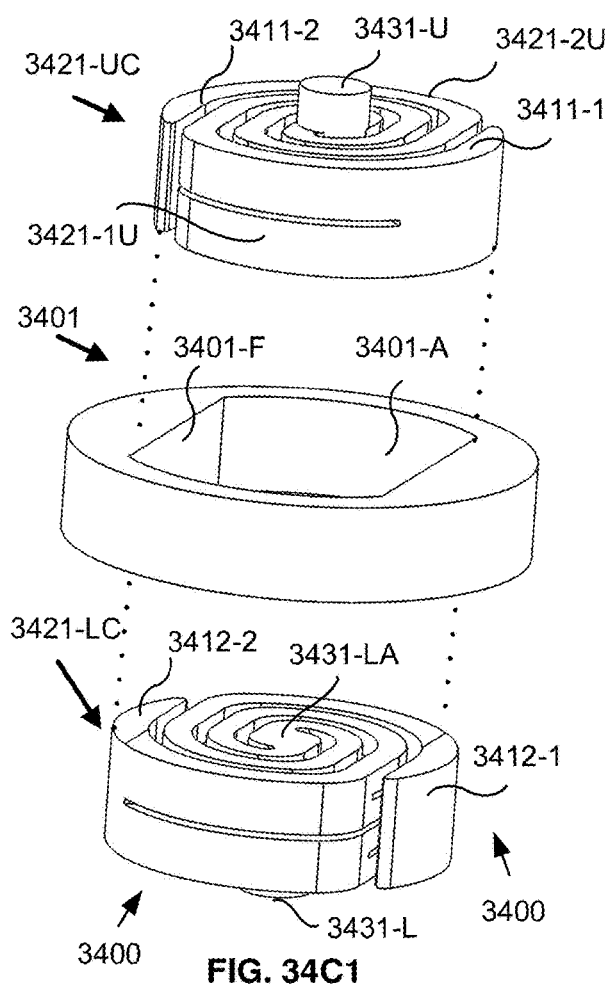
FIG. 34C1
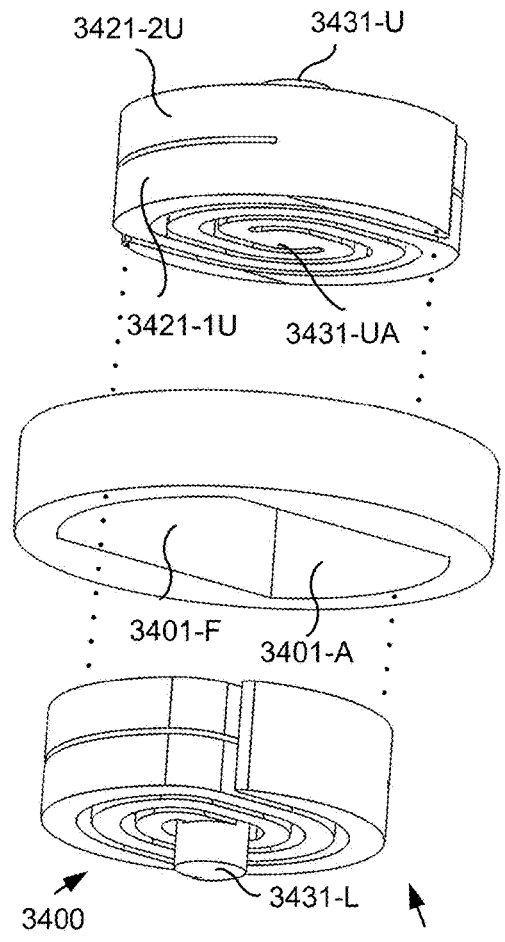
FIG. 34C2
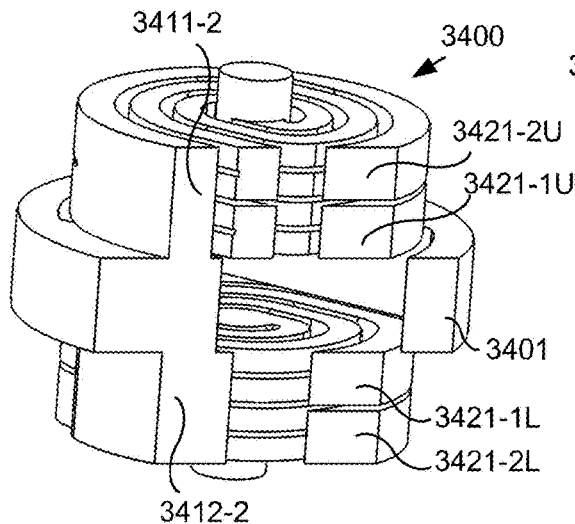
FIG. 34D1
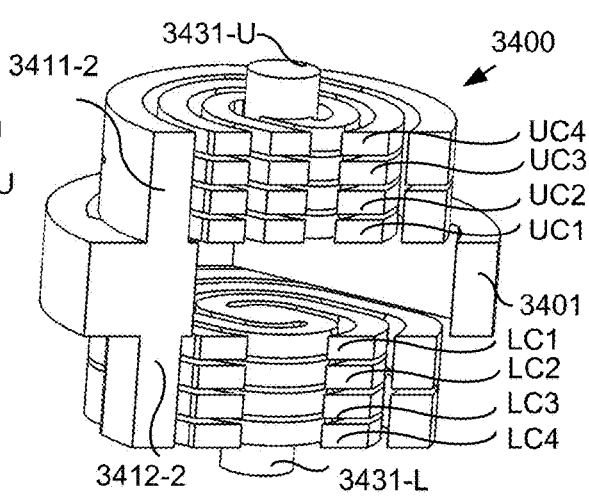
FIG. 34D2

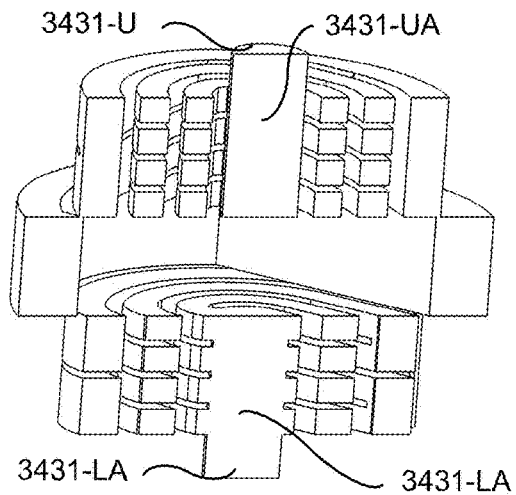
FIG. 34D3
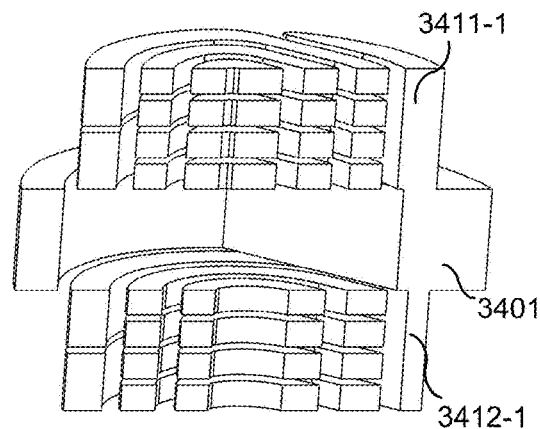
FIG. 34D4
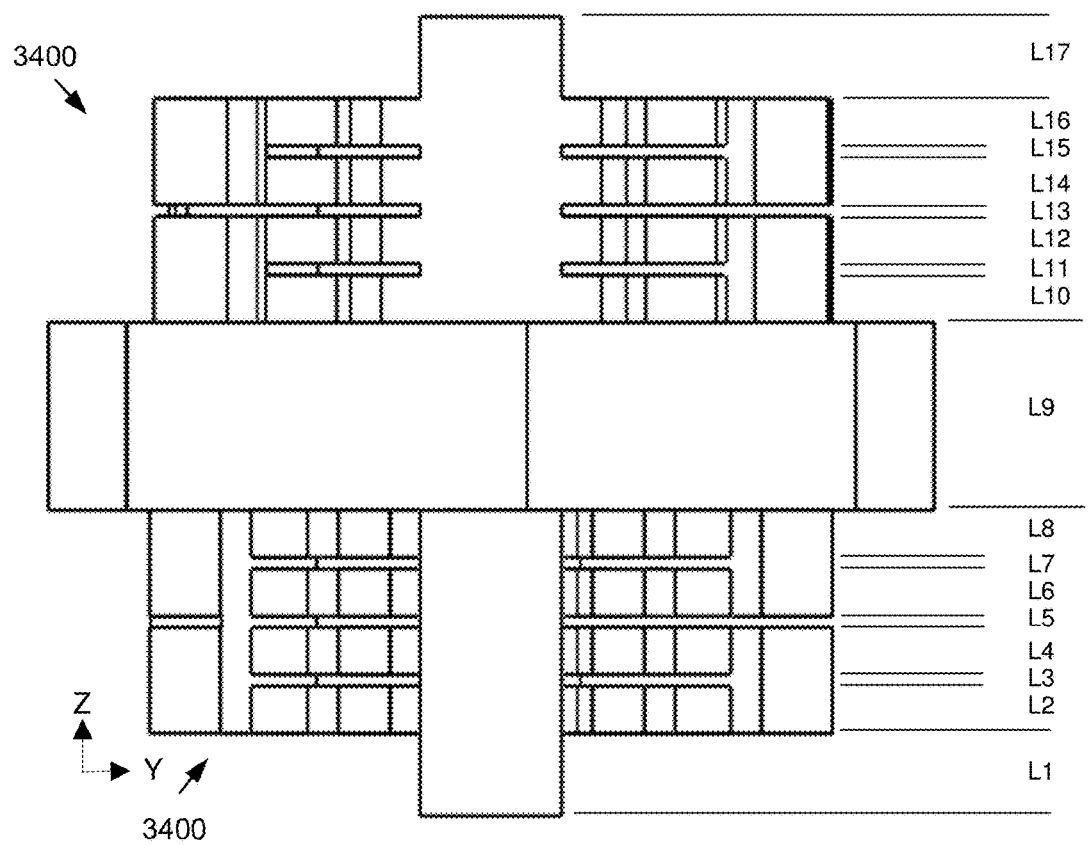
FIG. 34E1

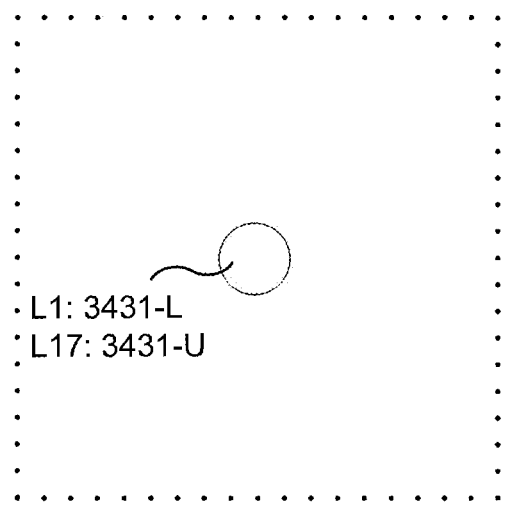
FIG. 34E2-A
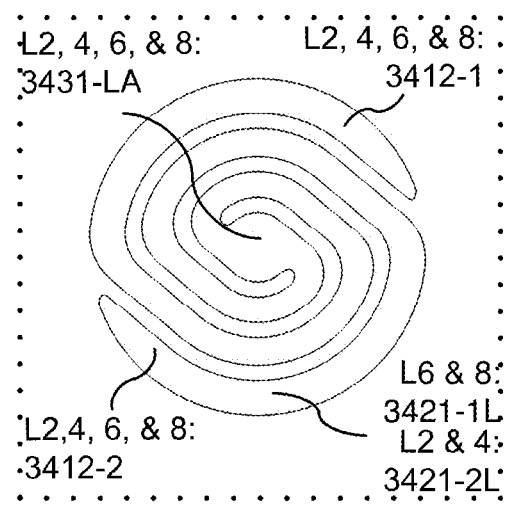
FIG. 34E3-A
FIG. 34E2-B
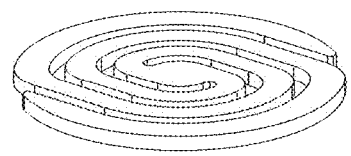
FIG. 34E3-B
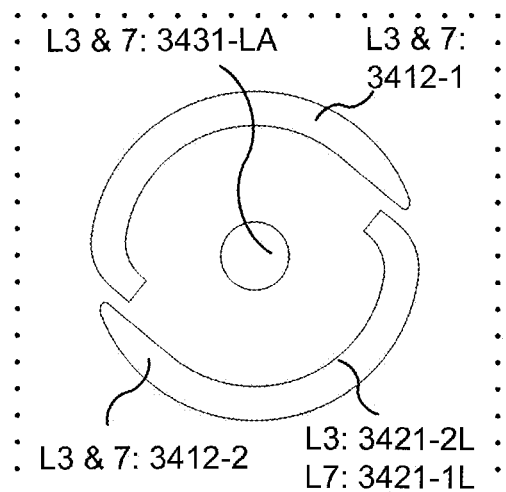
FIG. 34E4-A
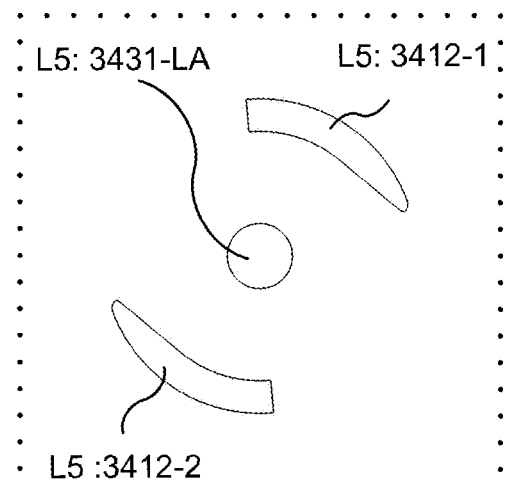
FIG. 34E5-A
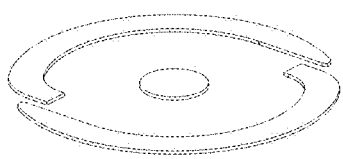
FIG. 34E4-B
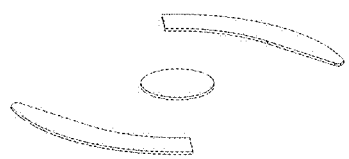
FIG. 34E5-B

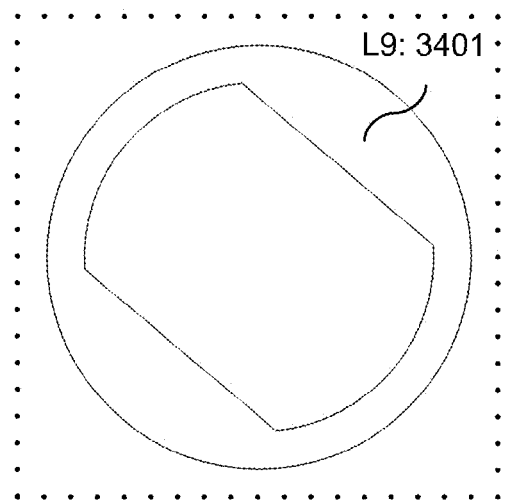
FIG. 34E6-A
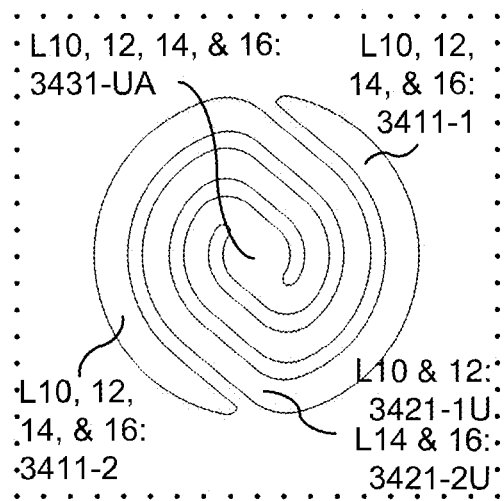
FIG. 34E7-A
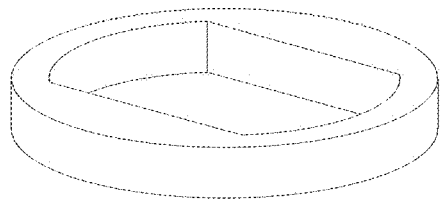
FIG. 34E6-B
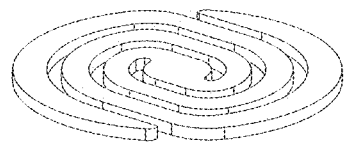
FIG. 34E7-B
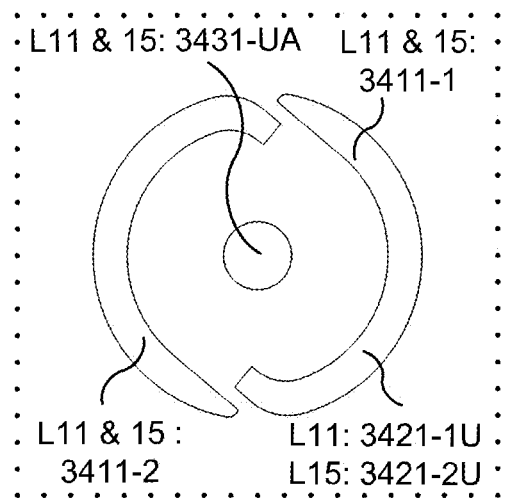
FIG. 34E8-A
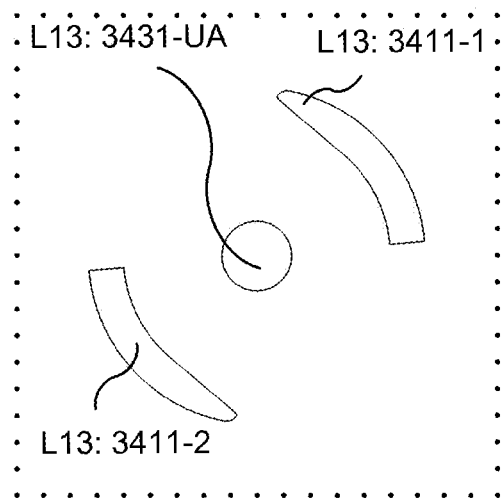
FIG. 34E9-A
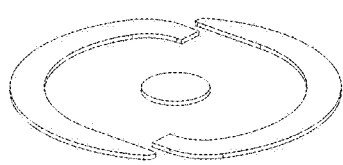
FIG. 34E8-B
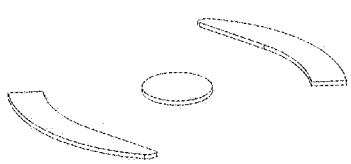
FIG. 34E9-B

PROBES WITH PLANAR UNBIASED SPRING ELEMENTS FOR ELECTRONIC COMPONENT CONTACT, METHODS FOR MAKING SUCH PROBES, AND METHODS FOR USING SUCH PROBES

RELATED APPLICATIONS

The below table sets forth the priority claims for the instant application and includes application numbers, filing dates, patent numbers, and issue dates as appropriate. Each of the listed applications is incorporated herein by reference as if set forth in full herein.

| App. No. | Continuity Type | App. No. | Which was Filed | Which is now | Dkt No. Fragment |
|---|---|---|---|---|---|
| This application | is a CIP of | 17/967,548 | Oct. 17, 2022 | pending | 439-A |
| 17/967,548 | claims benefit of | 63/275,350 | Nov. 3, 2021 | pending | 411-B |
| 17/967,548 | claims benefit of | 63/256,137 | Oct. 15, 2021 | expired | 411-A |
| 17/967,548 | is a CIP of | 17/507,598 | Oct. 21, 2021 | pending | 398-B |
| 17/507,598 | is a CNT of | 17/139,925 | Dec. 31, 2020 | pending | 398-A |
| 17/139,925 | claims benefit of | 62/985,859 | Mar. 5, 2020 | expired | 379-B |
| 17/139,925 | claims benefit of | 62/955,781 | Dec. 31, 2019 | expired | 379-A |
| This application | is a CIP of | 17/967,808 | Oct. 17, 2022 | pending | 440-A |
| 17/967,808 | claims benefit of | 63/275,610 | Nov. 4, 2021 | pending | 412-A |
| 17/967,808 | claims benefit of | 63/275,350 | Nov. 3, 2021 | pending | 411-B |
| 17/967,808 | claims benefit of | 63/256,137 | Oct. 15, 2021 | expired | 411-A |
| 17/967,808 | is a CIP of | 17/507,598 | Oct. 21, 2021 | pending | 398-B |
| 17/507,598 | is a CNT of | 17/139,925 | Dec. 31, 2020 | pending | 398-A |
| 17/139,925 | claims benefit of | 62/985,859 | Mar. 5, 2020 | expired | 379-B |
| 17/139,925 | claims benefit of | 62/955,781 | Dec. 31, 2019 | expired | 379-A |
| This application | is a CIP of | 17/967,825 | Oct. 17, 2022 | pending | 441-A |
| 17/967,825 | claims benefit of | 63/278,287 | Nov. 11, 2021 | pending | 413-A |
| 17/967,825 | claims benefit of | 63/275,350 | Nov. 3, 2021 | pending | 411-B |
| 17/967,825 | claims benefit of | 63/256,137 | Oct. 15, 2021 | expired | 411-A |
| 17/967,825 | is a CIP of | 17/507,598 | Oct. 21, 2021 | pending | 398-B |
| 17/507,598 | is a CNT of | 17/139,925 | Dec. 31, 2020 | pending | 398-A |
| 17/139,925 | claims benefit of | 62/985,859 | Mar. 5, 2020 | expired | 379-B |
| 17/139,925 | claims benefit of | 62/955,781 | Dec. 31, 2019 | expired | 379-A |
| This application | is a CIP of | 17/967,835 | Oct. 17, 2022 | pending | 442-A |
| 17/967,835 | claims benefit of | 63/281,555 | Nov. 19, 2021 | pending | 414-A |
| 17/967,835 | claims benefit of | 63/275,350 | Nov. 3, 2021 | pending | 411-B |
| 17/967,835 | claims benefit of | 63/256,137 | Oct. 15, 2021 | expired | 411-A |
| 17/967,835 | is a CIP of | 17/507,598 | Oct. 21, 2021 | pending | 398-B |
| 17/507,598 | is a CNT of | 17/139,925 | Dec. 31, 2020 | pending | 398-A |
| 17/139,925 | claims benefit of | 62/985,859 | Mar. 5, 2020 | expired | 379-B |
| 17/139,925 | claims benefit of | 62/955,781 | Dec. 31, 2019 | expired | 379-A |

FIELD OF THE INVENTION

Embodiments of the present invention relate to microprobes (e.g., for use in the wafer level testing or socket testing of integrated circuits, or for use in making electrical connections to PCBs or other electronic components) and more particularly to pin-like microprobes (i.e., microprobes that have vertical or longitudinal heights that are greater than their widths (e.g. greater by a factor of 5 in some embodiments, a factor of 10 in others and a factor of 20 in still others) or button-like probes wherein spring elements have planar configurations when in an unbiased state. In some embodiments, the microprobes are produced, at least in part, by electrochemical fabrication methods and more particularly by multi-layer, multi-material electrochemical fabrication methods, and wherein, in some embodiments, a plurality of probes are put to use while held in array formations including one or more plates with through holes that engage features of the probes and/or other array retention structures.

BACKGROUND OF THE INVENTION

Probes:

Numerous electrical contact probe and pin configurations have been commercially used or proposed, some of which may qualify as prior art and others of which do not qualify as prior art. Examples of such pins, probes, and methods of making are set forth in the following patent applications, publications of applications, and patents. Each of these applications, publications, and patents is incorporated herein by reference as if set forth in full herein.

| U.S patent application No., Filing Date U.S application Pub No., Pub Date U.S patent No., Pub Date | First Named Inventor, "Title" | Docket Fragment |
|---|---|---|
| 10/772,943-Feb. 4, 2004 2005-0104609-May 19, 2005 | Arat, et al., "Microprobe Tips and Methods for Making" | 097-A |

-continued

| U.S patent application No., Filing Date<br>U.S application Pub No., Pub Date<br>U.S patent No., Pub Date | First Named Inventor, "Title" | Docket Fragment |
|---|---|---|
| 10/949,738-Sep. 24, 2019<br>2006-0006888-Jan. 12, 2006 | Kruglick, et al., "Electrochemically Fabricated Microprobes" | 119-A |
| 11/028,945-Jan. 3, 2005<br>2005-0223543-Oct. 13, 2005<br>7,640,651-Jan. 5, 2010 | Cohen, et al., "A Fabrication Process for Co-Fabricating a Multilayer Probe Array and a Space Transformer | 134-A |
| 11/028,960-Jan. 3, 2005<br>2005-0179458-Aug. 18, 2005<br>7,265,565-Sep. 4, 2007 | Chen, et al. "Cantilever Microprobes for Contacting Electronic Components and Methods for Making Such Probes | 140-A |
| 11/029,180-Jan. 3, 2005<br>2005-0184748-Aug. 25, 2005 | Chen, et al. "Pin-Type Probes for Contacting Electronic Circuits and Methods for Making Such Probes" | 139-A |
| 11/029,217-Jan. 3, 2005<br>2005-0221644-Oct. 6, 2005<br>7,412,767-Aug. 19, 2008 | Kim, et al., "Microprobe Tips and Methods for Making" | 122-A |
| 11/173,241-Jun. 30, 2005<br>2006-0108678-May 25, 2006 | Kumar, et al., Probe Arrays and Method for Making | 137-A |
| 11/178,145-Jul. 7, 2005<br>2006-0112550-Jun. 1, 2006<br>7,273,812-Sep. 25, 2007 | Kim, et al., "Microprobe Tips and Methods for Making" | 136-B |
| 11/325,404-Jan. 3, 2006<br>2006-0238209-Oct. 26, 2006 | Chen, et al., "Vertical Microprobes for Contacting Electronic Components and Method for making Such Probes" | 153-A |
| 14/986,500-Dec. 31, 2015<br>2016-0231356-Aug. 11, 2016<br>10,215,775-Feb. 26, 2019 | Wu, et al. "Multi-Layer, Multi-Material Micro-Scale and Millimeter-Scale Devices with Enhanced Electrical and/or Mechanical Properties" | 296-D |
| 16/584,818-Sep. 26, 2019<br>—<br>11,262,383-Mar. 1, 2022 | Smalley, "Probes Having Improved Mechanical and/or Electrical Properties for Making Contact between Electronic Circuit Elements and Methods for Making" | 376-A |
| 16/584,863-Sep. 26, 2019 | Frodis, "Probes Having Improved Mechanical and/or Electrical Properties for Making Contact between Electronic Circuit Elements and Methods for Making" | 377-A |
| 16/791,288-Feb. 14, 2020 | Frodis, "Multi-Beam Vertical Probes with Independent Arms Formed of a High Conductivity Metal for Enhancing Current Carrying Capacity and Methods for Making Such Probes" | 385-A |
| 17/139,933-Dec. 31, 2020 | Wu, "Compliant Pin Probes with Multiple Spring Segments and Compression Spring Deflection Stabilization Structures, Methods for Making, and Methods for Using" | 399-A |
| 17/139,936-Dec. 31, 2020 | Wu, et al., "Probes with Multiple Springs, Methods for Making, and Methods for Using" | 400-A |
| 17/139,940-Dec. 31, 2020 | Wu, "Compliant Pin Probes with Flat Extension Springs, Methods for Making, and Methods for Using" | 401-A |
| 17/240,962-Apr. 26, 2021 | Lockard, et al., "Buckling Beam Probe Arrays and Methods for Making Such Arrays Including Forming Probes with Lateral Positions Matching Guide Plate Hole Positions" | 405-A |
| 17/384,680-Jul. 23, 2021 | Yaglioglu, "Methods for Making Probe Arrays Utilizing Lateral Plastic Deformation of Probe Preforms" | 407-A |
| 17/390,835-Jul. 30, 2021 | Yaglioglu, "Methods for Making Probe Arrays Utilizing Deformed Templates" | 408-A |
| 17/401,252-Aug. 12, 2021 | Lockard, et al., "Probe Arrays and Improved Methods for Making and Using Longitudinal Deformation of Probe Preforms" | 409-A |
| 17/967,548-Oct. 17, 2022 | Veeramani, et al., "Probes with Planar Unbiased Spring Elements for Electronic Component Contact, Methods for Making Such Probes, and Methods for Using Such Probes" | 439-A |
| 62/805,589-Feb. 14, 2019 | Frodis, "Multi-Beam Vertical Probes with Independent Arms Formed of a High Conductivity Metal for Enhancing Current Carrying Capacity and Methods for Making Such Probes" | 370-A |

-continued

| U.S patent application No., Filing Date U.S application Pub No., Pub Date U.S patent No., Pub Date | First Named Inventor, "Title" | Docket Fragment |
|---|---|---|
| 62/956,016-Dec. 31, 2019 | Veeramani, et al., "Compliant Pin Probes with Multiple Spring Segments and Compression Spring Deflection Stabilization Structures, Methods for Making, and Methods for Using" | 381-A |
| 62/956,122-Dec. 31, 2019 | Wu, "Compliant Pin Probes with Flat Extension Springs, Methods for Making, and Methods for Using" | 383-A |
| 62/956,124-Dec. 31, 2019 | Wu, "Probes with Multiple Springs, Methods for Making, and Methods for Using | 382-A |
| 62/961,672-Jan. 15, 2020 | Wu, "Compliant Pin Probes with Multiple Spring Segments and Compression Spring Deflection Stabilization Structures, Methods for Making, and Methods for Using" | 381-B |
| 62/961,675-Jan. 15, 2020 | Wu, et al., "Probes with Multiple Springs, Methods for Making, and Methods for Using" | 382-B |
| 62/961,678-Jan. 15, 2020 | Wu, "Compliant Pin Probes with Flat Extension Springs, Methods for Making, and Methods for Using" | 383-B |
| 63/015,450-Apr. 24, 2020 | Lockard, et al., "Buckling Beam Probe Arrays and Methods for Making Such Arrays Including Forming Probes with Lateral Positions Matching Guide Plate Hole Positions and Integrating Guides" | 390-A |
| 63/055,892-Jul. 23, 2022 | Yaglioglu, "Methods for Making Probe Arrays Utilizing Lateral Plastic Deformation" | 392-A |
| 63/064,888-Aug. 12, 2020 | Lockard, et al., "Probe Arrays and Improved Methods for Making and Using Spring Preforms That Undergo Longitudinal Deformation and/or Stretching While in Array Formation" | 388-A |

Electrochemical Fabrication:

Electrochemical fabrication techniques for forming three-dimensional structures from a plurality of adhered layers have been, or are being, commercially pursued by Microfabrica® Inc. (formerly MEMGen Corporation) of Van Nuys, California under the process names EFAB and MICA FREEFORM®.

Various electrochemical fabrication techniques were described in U.S. Pat. No. 6,027,630, issued on Feb. 22, 2000, to Adam Cohen.

Another method for forming microstructures using electrochemical fabrication techniques was taught in U.S. Pat. No. 5,190,637 to Henry Guckel, entitled "Formation of Microstructures by Multiple Level Deep X-ray Lithography with Sacrificial Metal Layers".

Electrochemical Fabrication provides the ability to form prototypes and commercial quantities of miniature objects, parts, structures, devices, and the like at reasonable costs and in reasonable times. In fact, Electrochemical Fabrication is an enabler for the formation of many structures that were hitherto impossible to produce. Electrochemical Fabrication opens the spectrum for new designs and products in many industrial fields. Even though Electrochemical Fabrication offers this new capability, and it is understood that Electrochemical Fabrication techniques can be combined with designs and structures known within various fields to produce new structures, certain uses for Electrochemical Fabrication provide designs, structures, capabilities and/or features not known or obvious in view of the state of the art.

A need exists in various fields for miniature devices having improved characteristics, reduced fabrication times, reduced fabrication costs, simplified fabrication processes, greater versatility in device design, improved selection of materials, improved material properties, more cost effective and less risky production of such devices, and/or more independence between geometric configuration and the selected fabrication process.

SUMMARY OF THE INVENTION

It is an object of some embodiments of the invention to provide improved probes that include compliant elements formed from a plurality of compliant modules that include planar but non-linear (i.e., not straight) spring configurations (i.e. the spring configurations are not straight bars without bends or angles but have some two-dimensional configuration within the plane of at least one layer that provides bends or curves), when unbiased, where the planes of the springs are perpendicular to a longitudinal axis of the probes and provide for compliance along the longitudinal axis of the probes wherein the compliant modules are stacked in a serial manner. The probes with non-linear spring configurations may provide linear spring return forces or non-linear return forces upon biasing.

It is an object of some embodiments of the invention to provide improved probes that include compliant elements formed from one or more compliant modules that include planar but non-linear (i.e., not straight) spring configurations, when unbiased, where the normals to planes of the springs are not perpendicular to a longitudinal axis of the probes and deflection of the springs out of the planes of the undeflected springs provide a majority of the compliance along the longitudinal axis of the probes. In some cases, the probe springs may extend laterally in the plane or planes of the layers from which the probe or probes are formed (i.e. the planes of the springs are perpendicular to a stacking direction of the layers from which the probe is formed) while the probe axis (extending from tip-to-tip) may not be perpendicular to the planes of the spring or springs (e.g., due to an intentional lateral offset between the opposing ends of the probe). In some variations, the probe axis may be substantially perpendicular to the plane or planes of the springs where "substantially" refers to an angular mismatch of less than 20°, less than 10°, less than 5°, less than 2°, or less than 1° and should be interpreted as the broadest of these unless specially indicated otherwise.

It is an object of some embodiments of the invention to provide an improved method of forming probes.

It is an object of some embodiments of the invention to use individual compliant modules as probes with a single contact tip.

It is an object of some embodiments of the invention to use individual compliant modules as probes with two oppositely facing contact tips.

It is an object of some embodiments of the invention to provide two or more compliant modules with reversed orientations to provide probes with two oppositely oriented contact surfaces or tips.

It is an object of some embodiments of the invention to provide probes and/or compliant modules with base features for engaging array structures or for engaging tips of other compliant modules.

It is an object of some embodiments of the invention to provide probes and/or compliant modules with tip features for engaging tips or base structures of other compliant modules.

It is an object of some embodiments of the invention to provide array structures (e.g., guide plates, mounting bases, or the like) with features for engaging probes.

It is an object of some embodiments of the invention to provide probes and/or modules with structural features for engaging array structures (e.g., guide plates, mounting bases, or the like).

It is an object of some embodiments of the invention to provide probe arrays with compliant modules extending from one surface of an array structure (e.g., an array substrate).

It is an object of some embodiments of the invention to provide probe arrays with compliant modules extending from an upper surface and from a lower surface of an array structure.

It is an object of some embodiments to provide dielectric array structures with at least one surface (e.g., an upper surface, a lower surface) or both an upper surface and a lower surface configured for receiving compliant modules.

It is an object of some embodiments to provide a dielectric array structure that includes at least one surface with electrically conductive regions for engaging compliant modules (e.g., a top surface, a bottom surface, or both surfaces having electrical contact or connection regions for engaging probes and/or having traces that electrically connect probes to one another or that provide connections between individual probes and other circuit elements).

It is an object of some embodiments to provide a conductive array structure that includes at least one surface with dielectric regions for providing electrical isolation of compliant modules (e.g., dielectric regions located on a top surface, a bottom surface, both surfaces, or even in through surfaces or holes extending through the array structure).

It is an object of some embodiments to provide an array structure with electrically conductive paths that extend from one side of the structure to another side of the structure wherein at least one or more conductive paths are isolated from one or more other conductive paths.

It is an object of some embodiments of the invention to provide array structures with recesses or raised features for engaging compliant modules without regard to rotational orientation about a longitudinal axis of the module, only with regard to selected longitudinal orientations, or with regard to a single longitudinal orientation.

It is an object of some embodiments of the invention to provide array structures with through holes configured for accepting inserted probes or compliant modules, for retaining probes or compliant modules by limiting extent of insertion from at least one direction based, at least in part, on at least one feature of the array structure.

It is an object of some embodiments of the invention to provide probes or compliant modules with features for engaging through holes in array structures such that the probes or the compliant modules are retained by limiting extent of insertion from at least one direction based, at least in part, on one or more features of the probes or compliant modules.

It is an object of some embodiments of the invention to provide methods for making probe arrays that include multiple probes formed from stacked compliant modules.

It is an object of some embodiments of the invention to provide methods for making probe arrays that include probes formed from single compliant modules.

It is an object of some embodiments of the invention to provide methods for making probe arrays that include probes formed from pairs of back-to-back compliant modules that may or may not share a common base or that may not include a base at all.

It is an object of some embodiments of the invention to provide methods for making probe arrays that include probes formed from compliant modules that include multiple spring elements wherein the spring elements support probe arms that support probe tips with at least two probe tips pointing in opposite directions which are configured for contacting different electronic components (e.g. a DUT to be tested and a component that is part of, or is connected to, a tester for testing the DUT).

Other objects and advantages of various embodiments of the invention will be apparent to those of skill in the art upon review of the teachings herein. The various embodiments of the invention, set forth explicitly herein or otherwise ascertained from the teachings herein, may address one or more of the above objects alone or in combination, or alternatively may address some other object ascertained from the teachings herein without necessarily addressing any particular object set forth above. As such, it is not necessarily intended that all objects set forth above, or even a majority of the objects set forth above, or even a plurality of the objects set forth above, be addressed by any single aspect of the invention or embodiment of the invention even though that may be the case regarding some aspects or embodiments.

In a first aspect of the invention, a probe is provided with at least one planar elastic/compliant element and a second elastic/compliant element that provide compliance and elastic return forces in opposite directions along a longitudinal axis of the probe. More specifically, in the first aspect of the invention, a probe for making contact between two electronic circuit elements via a proximal probe end and a distal probe end, includes: (a) at least one compliant structure including: (i) at least one standoff having a proximal end and a distal end (e.g. the standoff would be relatively rigid with a spring constant of the standoff along the longitudinal axis being greater than that of a compliant element, e.g. by greater than a factor of two, by greater than a factor of 5, by greater than a factor of 10, by a factor greater than 20, by a factor greater than 50, or by a factor greater than 100; alternatively, a fraction of the longitudinal compression of a probe during usage that is attributable to deformation of (1) a single standoff or (2) deformation of all the standoffs is an amount selected from less than 20%, less than 10%, less than 5%, less than 2%, or less than 1%); (ii) at least one first compliant element that has a non-linear substantially planar configuration (i.e. is not a straight beam, e.g. has a rotational change in direction, from end-to-end, about a longitudinal axis greater than 90°, greater than 180°, greater than 270°, greater than 360°, greater than 540°, or even greater than 720°) when not biased and that provides compliance in a direction substantially perpendicular to the planar configuration of the first compliant element, wherein a first portion of the first compliant element functionally joins the at least one standoff at a location closer to the proximal probe end than the distal probe end and a second portion of the at least one first compliant element that functionally joins a first module tip that can compliantly move relative to the at least one standoff, wherein the first module tip extends longitudinally beyond a proximal end of the at least one standoff when the compliant element is not biased; (iii) at least one second compliant element that provides compliance in a direction substantially perpendicular to the planar configuration of the first compliant element, wherein a first portion of the second compliant element functionally joins the at least one standoff at a location closer to the distal end than the proximal end and a second portion of the second compliant element functionally joins a second module tip that can compliantly move wherein the second tip extends longitudinally beyond the distal end of the at least one standoff when the second compliant element is not biased, wherein the at least one first and at least one second compliant elements are spaced from one another along at least a portion of a longitudinal length of the at least one standoff and undergo opposite longitudinal changes when the first and second module tips are relatively compressed toward one another.

Numerous variations of the first aspect exist and include, for example: (1) the second compliant element having a non-linear substantially planar configuration (i.e. is not a straight beam, e.g. has a change in direction, from end-to-end, about a longitudinal axis greater than 90°, greater than 180°, greater than 270°, greater than 360° rotational, greater than 540°, or even greater than 720°) when not biased and providing compliance in a direction substantially perpendicular to the planar configuration of both the first and second compliant elements; (2) the first compliant element including at least two longitudinally spaced compliant elements which are functionally joined to the first module tip such that they move together upon longitudinal compression of the first module tip toward the second module tip; (3) the second compliant element including at least two longitudinally spaced compliant elements which are functionally joined to the second module tip such that they move together upon longitudinal compression of the second module tip toward the first module tip; (4) the first compliant element joining the proximal end of the at least one standoff; (5) the second compliant element joining the distal end of the at least one standoff; (6) the at least one standoff including a laterally extended structure at an intermediate longitudinal position between the first and second compliant elements that provides a stop structure that inhibits excessive longitudinal motion of at least one of the first and second compliant elements (e.g. to inhibit motion that might exceed the elastic range of motion of one or both of the compliant elements) upon compression; (7) the sixth variation wherein the laterally extended portion of the standoff is also relatively rigid; (8) the probe including a second module that is laterally aligned and longitudinally stacked with respect to the first module; (9) the eighth variation further including a structure for retaining the first and second modules in lateral alignment and inhibiting excessive lateral displacement of the first and second modules relative to one another (e.g. displacement that could damage one or both of the modules or cause contact between an element of the probe with any other neighboring probe) while still allowing compliant movement of the module tips, wherein excessive lateral displacement would be a displacement of the modules that would inhibit their full longitudinal elastic function, e.g. by binding, by changing orientation between the modules, or by causing a significant shift in compliance over the working range of the probe that would take the probe out of a performance specification range set by a customer or user for acceptable probe performance; (10) the eighth or ninth variation including a first, or proximal, probe tip that functionally engages the first module tip of the first compliant module; (11) the ninth variation further including a second, or distal, probe tip that functionally engages the second module tip of the second module; (12) the first compliant element including at least two co-planar spring elements that are intertwined and each is attached to the first module tip and each is attached to a separate standoff or to a different position on the standoff; (13) the second compliant element including at least two co-planar spring elements that are intertwined and each is attached to the second module tip and each is attached to a separate standoff or to a different position on the standoff; (14) the first module tip being the proximal probe tip, (15) the second module tip being the distal probe tip; and (16) a combination of two or more of the prior variations, mutatis mutandis, to the extent the combination does not eliminate the functionality of the probe.

In a second aspect of the invention, a probe is provided with at least two planar elastic/compliant elements that provide compliance in opposite directions with the elastic elements being deflected toward each other upon compression of the tips toward one another. More particularly, in the second aspect of the invention, a probe for making contact between two electronic circuit elements via a proximal probe end and a distal probe end, includes: (a) at least one compliant structure including: (i) at least one relatively rigid standoff having a proximal end and a distal end; (ii) at least one first compliant element that has a non-linear, substantially planar configuration when not biased and that provides compliance in a direction substantially perpendicular to the planar configuration of the first compliant element, wherein a first portion of the first compliant element functionally joins the standoff at a location closer to the proximal probe end than the distal probe end and a second portion of the first compliant element that functionally joins a first module tip that can compliantly move relative to the standoff, wherein the first module tip extends longitudinally beyond a proximal end of the at least one standoff when the compliant element is not biased; (iii) at least one second compliant element that has a non-linear, substantially planar configuration when not biased, and that provides compliance in a direction substantially perpendicular to the planar configuration of the second compliant element, wherein a first portion of the second compliant element functionally joins the standoff at a location closer to the distal end than the proximal end and a second portion of the second compliant element functionally joins a second module tip that can compliantly move wherein the second tip extends longitudinally beyond the distal end of the at least one standoff when the second compliant element is not biased, wherein the at least one first and at least one second compliant elements are spaced from one another (e.g. exist in substantially parallel planes when not biased) along at least a portion of a longitudinal length of the at least one standoff and undergo opposite longitudinal changes when the first and second module tips are compressed longitudinally toward one another, wherein the at least one first compliant element includes at least one first elastic spring element with at least one portion configured to provide an elastic return force on compression of the tips toward one another, and wherein the at least one second compliant element includes at least one second elastic spring element with at least one portion configured to provide an elastic return force on relative compression of the tips toward one another.

Like the first aspect, numerous variations of the second aspect exist and include, mutatis mutandis, the variations associated with the first aspect.

In a third aspect of the invention, a probe or probe module for making contact between two electronic circuit elements, includes: (a) at least one compliant structure including: (i) a relatively rigid base; (ii) at least one standoff connected to the base; and (iii) a first compliant element that has a substantially planar configuration when not biased, and a non-linear configuration (i.e. not straight) that provides a compliance in a direction substantially perpendicular to the planar configuration, wherein a first portion of the first compliant element functionally joins the standoff and a second portion of the compliant element functionally joins a module tip that can compliantly move relative to the base and wherein the tip extends beyond a height of the at least one standoff when the compliant element is not biased.

Like the first and second aspects, numerous variations of the third aspect exist and include, for example: (1) the at least one compliant element including at least one inward rotating spiral that extends from the at least one standoff to the at least one module tip; (2) the second variation wherein the spiral has a configuration selected from the group consisting of: (i) a circular spiral, (ii) a rectangular spiral, (iii) a hexagonal spiral, (iv) an octagonal spiral, (v) a counterclockwise rotating inward spiral, (vi) a clockwise inward rotating spiral, and (vii) a spiral substantially having the shape of one of the options (i)-(vi) with a radially extending connection to the tip; (3) either the first or second variations with the spiral having a rotational extent selected from the group consisting of: (i) at least 180°, (ii) at least 360°, (iii) at least 540°, and (iv) at least 720°; (4) the first compliant element including at least two compliant elements that are longitudinally spaced from one another, are functionally joined by the tip and the standoff, and move together when there is a relative compression of the tip and the base; (5) the first compliant element including at least two compliant elements that are longitudinally spaced from one another, are functionally joined by the tip and the standoff, move together when there is a relative compression of the tip and the base, and have the same rotational configuration; (6) the first compliant element including at least two compliant elements that are longitudinally spaced from one another, are functionally joined by the tip and the standoff, move together when there is a relative compression of the tip and the base, and have opposite rotational configurations (i.e. one is counterclockwise while the other is clockwise); (7) the probe additionally including a second compliant structure that is laterally aligned to the first compliant structure with both having the same longitudinal orientation and wherein the tip of one is functionally joined to, physically contacts, or rigidly but indirectly contacts the base of the other; (8) the probe of the seventh variation additionally including at least one additional compliant structure with a similar orientation to that of the first and second compliant structures; (9) the probe of the seventh or eighth variation wherein at least one of the at least one additional compliant structure is oppositely oriented to the first and second structures such that it is joined, or abutted, back-to-back with another one of the compliant structures; (10) the probe of the seventh or eighth variation wherein at least one of the at least one additional compliant structure is oppositely oriented to the first and second structures and shares a base with another of the compliant structures; (11) the probe additionally including at least one additional compliant structure that is oppositely oriented to the first structure such that it is joined, or abutted, back-to-back with another one of the compliant structures; (12) the probe additionally including at least one additional compliant structure that is oppositely oriented to the first structure and shares a common base with another one of the compliant structures; (13) any of the features or variations associated with the first or second aspects to the extent they are compatible with the features of this aspect; and (14) a combination of two or more of the prior variations, mutatis mutandis, to the extent the combination does not eliminate the functionality of the probe.

In a fourth aspect of the invention, a probe for making contact between two electronic circuit elements, includes: (a) at least one compliant structure, including: (i) at least one standoff having a first end and a second end that are longitudinally separated; (ii) at least one first compliant element including a two-dimensional, substantially planar spring when not biased, wherein the first compliant element provides compliance in a direction substantially perpendicular to the planar configuration, wherein a first portion of the first compliant element functionally joins the at least one standoff and a second portion of the first compliant element functionally joins a first tip arm that can elastically move relative to the at least one standoff, wherein the first tip arm directly or indirectly holds a first tip end that extends longitudinally beyond the first end of the at least one standoff when the first compliant element is not biased; and (iii) at least one second compliant element including a spring, wherein the second compliant element provides compliance in a direction substantially perpendicular to the planar configuration, wherein a first portion of the second compliant element functionally joins the at least one standoff and a second portion of the second compliant element functionally joins a second tip arm that can elastically move relative to the at least one standoff, wherein the second tip arm directly or indirectly holds a second tip end that extends longitudinally beyond the second end of the at least one standoff when the second compliant element is not biased, wherein the first portions of the first and second compliant elements are longitudinally spaced from one another by the at least one standoff and wherein upon biasing of at least one of the first and second tip ends toward the other, the second portions of the first and second compliant elements move longitudinally closer together.

Numerous variations of the fourth aspect of the invention exist and include, for example: (1) the first portion of the first compliant element being located closer to the first end of the at least one standoff than is the first portion of the second compliant element and the first portion of the second compliant element is located closer to the second end of the at least one standoff than is the first portion of the first compliant element; (2) the spring of the second compliant element having a two-dimensional substantially planar configuration, when not biased, that is substantially parallel to the planar configuration of the planar spring of the first compliant element; (3) the first compliant element including at least two longitudinally spaced compliant elements which are functionally joined to the first tip such that they move together upon longitudinal compression of the first tip end toward the second tip end; (4) the second compliant element including at least two longitudinally spaced compliant elements which are functionally joined to the second tip such that they move together upon longitudinal compression of the second tip end toward the first tip end; (5) the first portion of the first compliant element joining the first end of the at least one standoff; (6) the first portion of the second compliant element joining the second end of the at least one standoff; (7) the at least one standoff including a laterally extended structure at an intermediate longitudinal position between the at least one first and at least one second compliant elements that provides a stop structure that inhibits excessive longitudinal motion of at least one of the first and second compliant elements upon longitudinal compression of the respective tip end toward the other tip end; (8) variation seven wherein the laterally extended portion of the standoff is longitudinally relatively rigid compared to a longitudinal rigidity of at least one of the at least one first compliant element and the at least one second compliant element; (9) the at least one compliant structure including at least a first compliant structure and a second compliant structure that are laterally aligned and longitudinally stacked with respect to one another and wherein each of the first and second compliant structures include first and second tips; (10) variation nine wherein the probe further includes a structure for retaining the first and second compliant structures in lateral alignment and inhibiting excessive lateral displacement of the first and second compliant structures relative to one another while still allowing longitudinal elastic movement of the tips; (11) either of variations nine or ten wherein the probe includes a first probe tip that functionally engages the first tip of the first compliant structure; (12) any of variations nine to eleven wherein the probe further incudes a second probe tip that functionally engages the second tip of the second compliant structure; (13) the first compliant element including at least two co-planar cantilever springs at a same longitudinal height that are laterally interleaved with one another and are attached to the first tip arm and with each being attached to laterally displaced locations on the at least one standoff; (14) variation thirteen wherein the laterally displaced locations are located on the two laterally separated portions of at least one standoff that are in turn functionally and rigidly connected to one another via at least one laterally extending bridge element; (15) variation fourteen wherein at least one bridge functions as at least a portion of the at least one standoff as it provides at least a portion of a longitudinal separation between the first and second compliant elements and wherein the at least one first compliant element includes at least one planar spiral that extends at least in part from the at least one standoff to the first tip arm; (16) variation fifteen wherein the at least one first planar spiral has a configuration selected from the group consisting of: (i) an inward rotating circular spiral, (ii) an inward rotating rectangular spiral, (iii) an inward rotating hexagonal spiral, (iv) an inward rotating octagonal spiral, (v) an inward rotating counterclockwise spiral as observed looking from the first tip end toward the second tip end, and (vi) an inward rotating clockwise spiral as observed looking from the first tip end toward the second tip end; (17) the at least one first compliant element including at least two inward rotating spirals that extend from different portions of the at least one standoff and join the first tip arm, wherein the spirals each have a configuration selected from the group consisting of: (i) an inward rotating circular spiral, (ii) an inward rotating rectangular spiral, (iii) an inward rotating hexagonal spiral, (iv) an inward rotating octagonal spiral, (v) an inward rotating counterclockwise spiral as observed looking from the first tip end toward the second tip end, and (vi) an inward rotating clockwise spiral as observed looking from the first tip end toward the second tip end; (18) either of variations sixteen or seventeen wherein at least one first planar spiral has a rotational extent selected from the group consisting of: (i) at least 180°, (ii) at least 360°, (iii) at least 540°, and (iv) at least 720°; (19) the substantially planar spring of the first compliant element including at least one cantilever with a configuration selected from the group consisting of: (i) two straight segments joined at an angle between the first portion and the second portion of the first compliant element; (ii) a plurality of straight segments connected by a plurality of angles between the first portion and the second portion of the first compliant element; (iii) at least one curve between the first portion and the second portion of the first compliant element; (iv) a plurality of curves connected by continuous curved transitions to one another between the first portion and the second portion of the first compliant element; (v) at least two curves joined directly or indirectly to one another by a straight segment between the first portion and the second portion of the first compliant element; (vi) a plurality of straight segments joined directly or indirectly to one another by at least one curved segment between the first portion and the second portion of the first compliant element; (20) the at least one second compliant element including at least one second planar spiral that extends from the at least one standoff to the second tip arm; (21) variation twenty wherein the spiral of the second compliant element has a configuration selected from the group consisting of: (i) an inward rotating circular spiral, (ii) an inward rotating rectangular spiral, (iii) an inward rotating hexagonal spiral, (iv) an inward rotating octagonal spiral, (v) an inward rotating counterclockwise spiral as observed looking from the second tip end toward the first tip end, and (vi) an inward rotating clockwise spiral as observed looking from the second tip end toward the first tip end; (22) the at least one second compliant element including at least two inward rotating spirals that extend from different portions of the at least one standoff and join the second tip arm, wherein the spirals each have a configuration selected from the group consisting of: (i) an inward rotating circular spiral, (ii) an inward rotating rectangular spiral, (iii) an inward rotating hexagonal spiral, (iv) an inward rotating octagonal spiral, (v) an inward rotating counterclockwise spiral as observed looking from the second tip end toward the first tip end, and (vi) an inward rotating clockwise spiral as observed looking from the second tip end toward the first tip end; (23) either of variations twenty-one or twenty-two wherein at least one spiral of the second compliant element has a rotational extent selected from the group consisting of: (i) at least 180°, (ii) at least 360°, (iii) at least 540°, and (iv) at least 720°; (24) the spring of the second compliant element including at least one cantilever with a configuration selected from the group consisting of: (i) two straight segments joined at an angle between the first portion and the second portion of the second compliant element; (ii) a plurality of straight segments connected by a plurality of angles between the first portion and the second portion of the second compliant element; (iii) at least one curve between the first portion and the second portion of the second compliant element; (iv) a plurality of curves connected by continuous curved transitions to one another between the first portion and the second portion of the second compliant element; (v) at least two curves joined directly or indirectly to one another by a straight segment between the first portion and the second portion of the second compliant element; (vi) a plurality of straight segments joined directly or indirectly to one another by at least one curved segment between the first portion and the second portion of the second compliant element; (25) the at least one compliant structure further including a base located longitudinally between the first and second compliant elements and forms part of the at least one standoff wherein the base has at least some lateral extents that are larger than those of at least one of the first compliant element or the second compliant element; (26) variation twenty-five wherein the base has an annular configuration; (27) variation twenty-six wherein the base has lateral extensions that protrude laterally outward relative to the at least one standoff; (28) the planar spring of at least one of the at least one first compliant element has a first rotational orientation and the spring of the at least one of the at least one second compliant element being planar and has a second rotational orientation wherein the first rotational orientation and second rotational orientation are selected from the group consisting of: (i) the same orientation, and (ii) different orientations; (29) the at least one first compliant element including at least two first compliant elements having rotational orientations selected from the group consisting of: (i) the same orientation, and (ii) different orientations; (30) the at least one second compliant element including at least two second compliant elements having rotational orientations selected from the group consisting of: (i) the same orientation, and (ii) different orientations; and (31) the at least one standoff including at least two standoffs and the at least one first compliant element joins to one of the at least two standoffs and the at least one second compliant element joins to a different one of the at least two standoffs.

Additional variations to the fourth aspect of the invention exist and include, for example: (32) the first compliant element begins at a portion of the at least one standoff as a beginning number of first cantilevers wherein the beginning number is selected from the group consisting of: (a) at least one first planar cantilever, and (b) at least two first planar cantilevers that are longitudinally separated, and wherein the beginning number of cantilevers ends at the first tip arm as a plurality of longitudinally separated cantilevers where the plurality comprises the beginning number plus N where N is at least one; (33) variation thirty-two wherein N is selected from the group consisting of at least 2, 3, 4, 5, 6, 7, and 8; (34) variation thirty-three wherein N is greater than 8; (35) the second compliant element begins at a portion of the at least one standoff as a beginning number of second cantilevers wherein the beginning number is selected from the group consisting of: (a) at least one second planar cantilever, and (b) at least two second planar cantilevers that are longitudinally separated, and wherein the beginning number of cantilevers ends at the second tip arm as a plurality of longitudinally separated cantilevers where the plurality comprises the beginning number plus P where P is at least one; (36) variation thirty-five wherein P is selected from the group consisting of at least 2, 3, 4, 5, 6, 7, and 8; and (37) variation thirty-six wherein P is greater than 8.

In a fifth aspect of the invention, a probe for making contact between two electronic circuit elements, includes: (a) at least one compliant structure, including: (i) at least one relatively rigid standoff having a first end and a second end that are longitudinally separated; (ii) at least one first compliant element including a two-dimensional, substantially planar spring when not biased, wherein the first compliant element provides compliance in a direction substantially perpendicular to the planar configuration, wherein a first portion of the first compliant element functionally joins the at least one standoff and a second portion of the first compliant element functionally joins a first tip arm that can elastically move relative to the standoff, wherein the first tip arm directly or indirectly holds a first tip end that extends longitudinally beyond the first end of the at least one standoff when the first compliant element is not biased; and (iii) at least one second compliant element including a spring wherein the second compliant element provides compliance in a direction substantially perpendicular to the planar configuration, wherein a first portion of the second compliant element functionally joins the at least one standoff and a second portion of the second compliant element functionally joins a second tip arm that can elastically move relative to the standoff, wherein the second tip arm directly or indirectly holds a second tip end that extends longitudinally beyond the second end of the at least one standoff when the second compliant element is not biased, wherein the first portions of the first and second compliant elements are longitudinally spaced from one another and wherein upon biasing of at least one of the first and second tip ends toward the other, the second portions of the first and second compliant elements move longitudinally further apart.

Numerous variations of the fifth aspect of the invention exist and include, for example: (1) the first portion of the first compliant element being located closer to the second standoff end than is the first portion of the second compliant element and the first portion of the second compliant element being located closer to the first standoff end than is the first portion of the first compliant; (2) the spring of the second compliant element having a two-dimensional substantially planar configuration, when not biased, that is substantially parallel to the planar configuration of the planar spring of the first compliant element; (3) the first compliant element including at least two longitudinally spaced compliant elements which are functionally joined to the first tip such that they move together upon longitudinal compression of the first tip end toward the second tip end; (4) the second compliant element including at least two longitudinally spaced compliant elements which are functionally joined to the second tip such that they move together upon longitudinal compression of the second tip end toward the first tip end; (5) the first portion of the first compliant element joining the second end of the at least one standoff; (6) the first portion of the second compliant element joining the first end of the at least one standoff; (7) the at least one standoff including an extended structure that provides a movement stop that inhibits excessive longitudinal motion of at least one of the first and second compliant elements upon longitudinal compression of the respective tip end toward the other tip end; (8) variation seven wherein the extended structure is longitudinally relatively rigid as compared to a longitudinal rigidity of at least one of the at least one first compliant element and the at least one second compliant element; (9) the at least one compliant structure being at least a first compliant structure and a second compliant structure that are laterally aligned and longitudinally stacked with respect to one another and wherein each of the first and second compliant structures include first and second tips; (10) the probe further including a structure for retaining the first and second compliant structures in lateral alignment and inhibiting excessive lateral displacement of the first and second compliant structures relative to one another while still allowing longitudinal elastic movement of the tips; (11) either of variations nine or ten wherein the probe includes a first probe tip that functionally engages the first tip of the first compliant structure; (12) any of variations nine-eleven wherein the probe further includes a second probe tip that functionally engages the second tip of the second compliant structure; (13) the first compliant element including at least two co-planar springs at a same longitudinal height that are interleaved with one another and are attached to the first tip arm and with each being attached to laterally displaced locations on the at least one relatively rigid standoff; (14) variation thirteen wherein at least one standoff element including at least two laterally displaced rigid standoffs and wherein the laterally displaced locations are located on the two laterally separated relatively rigid standoff elements that are in turn functionally and rigidly connected to one another via at least one laterally extending bridge; (15) the at least one first compliant element including at least one planar spiral that connects the at least one standoff to the first tip arm; (16) variation fifteen wherein the spiral has a configuration selected from the group consisting of: (i) an inward rotating circular spiral, (ii) an inward rotating rectangular spiral, (iii) an inward rotating hexagonal spiral, (iv) an inward rotating octagonal spiral, (v) an inward rotating counterclockwise spiral as observed looking from the second tip end toward the first tip end, and (vi) an inward rotating clockwise spiral as observed looking from the second tip end toward the first tip end; (17) the at least one first compliant element including at least two inward rotating spirals that extend from different portions of the at least one standoff and join the first tip arm, wherein the spirals each have a configuration selected from the group consisting of: (i) an inward rotating circular spiral, (ii) an inward rotating rectangular spiral, (iii) an inward rotating hexagonal spiral, (iv) an inward rotating octagonal spiral, (v) an inward rotating counterclockwise spiral as observed looking from the first tip end toward the second tip end, and (vi) an inward rotating clockwise spiral as observed looking from the first tip end toward the second tip end; (18) either of variations sixteen or seventeen wherein the at least one spiral has a rotational extent selected from the group consisting of: (i) at least 180°, (ii) at least 360°, (iii) at least 540°, and (iv) at least 720°; (19) the substantially planar spring of the first compliant element including at least one cantilever with a configuration selected from the group consisting of: (i) two straight segments joined at an angle between the first portion and the second portion of the first compliant element; (ii) a plurality of straight segments connected by a plurality of angles between the first portion and the second portion of the first compliant element; (iii) at least one curve between the first portion and the second portion of the first compliant element; (iv) a plurality of curves connected by continuous curved transitions to one another between the first portion and the second portion of the first compliant element; (v) at least two curves joined directly or indirectly to one another by a straight segment between the first portion and the second portion of the first compliant element; and (vi) a plurality of straight segments joined directly or indirectly to one another by at least one curved segment between the first portion and the second portion of the first compliant element; (20) the at least one second compliant element including at least one planar spiral that extends from the at least one standoff to the second tip arm; (21) variation twenty wherein the spiral of the second compliant element has a configuration selected from the group consisting of: (i) an inward rotating circular spiral, (ii) an inward rotating rectangular spiral, (iii) an inward rotating hexagonal spiral, (iv) an inward rotating octagonal spiral, (v) an inward rotating counterclockwise spiral as observed looking from the first tip end toward the second tip end, and (vi) an inward rotating clockwise spiral as observed looking from the first tip end toward the second tip end; (22) the at least one second compliant element including at least two inward rotating spirals that extend from different portions of the at least one standoff and join the second tip arm, wherein the spirals each have a configuration selected from the group consisting of: (i) an inward rotating circular spiral, (ii) an inward rotating rectangular spiral, (iii) an inward rotating hexagonal spiral, (iv) an inward rotating octagonal spiral, (v) an inward rotating counterclockwise spiral as observed looking from the first tip end toward the second tip end, and (vi) an inward rotating clockwise spiral as observed looking from the first tip end toward the second tip end; (23) either of variations twenty-one or twenty-two wherein at least one spiral of the second compliant element has a rotational extent selected from the group consisting of: (i) at least 180°, (ii) at least 360°, (iii) at least 540°, and (iv) at least 720°; (24) the spring of the second compliant element including at least one cantilever with a configuration selected from the group consisting of: (i) two straight segments joined at an angle between the first portion and the second portion of the second compliant element; (ii) a plurality of straight segments connected by a plurality of angles between the first portion and the second portion of the second compliant element; (iii) at least one curve between the first portion and the second portion of the second compliant element; (iv) a plurality of curves connected by continuous curved transitions to one another between the first portion and the second portion of the second compliant element; (v) at least two curves joined directly or indirectly to one another by a straight segment between the first portion and the second portion of the second compliant element; and (vi) a plurality of straight segments joined directly or indirectly to one another by at least one curved segment between the first portion and the second portion of the second compliant element; (25) the at least one compliant structure further including a base located longitudinally between the first and second compliant elements and attached to the at least one standoff wherein the base has at least some lateral extents that are larger than those of at least one of the first compliant element or the second compliant element; (26) variation twenty-five wherein the base has an annular configuration; (27) variation twenty-six wherein the base has lateral extensions that protrude laterally outward relative to the at least one standoff; (28) the planar spring of at least one of the at least one first compliant element having a first rotational orientation and the spring of the at least one of the at least one second compliant element is planar and has a second rotational orientation wherein the first rotational orientation and second rotational orientation are selected from the group consisting of: (i) the same orientation, and (ii) different orientations; (29) the at least one first compliant element including at least two first compliant elements having rotational orientations selected from the group consisting of: (i) the same orientation, and (ii) different orientations; (30) the at least one second compliant element including at least two second compliant elements having rotational orientations selected from the group consisting of: (i) the same orientation, and (ii) different orientations; (31) the at least one standoff including at least two standoffs and the at least one first compliant element joins to one of the at least two standoffs and the at least one second compliant element joins to a different one of the at least two standoffs; (32) the first compliant element including at least two two-dimensional substantially planar first springs that are co-planar and are interleaved and with each being attached to a separate first tip arm that extends longitudinally to a first tip arm bridge element that functionally joins the separate first tip arms, and wherein each of the at least two first springs join at least one standoff; (33) variation thirty-two wherein the at least one first standoff is located closer to the lateral center of the probe than to a lateral perimeter of the probe; (34) variation thirty-two wherein the at least one first standoff is located in proximity to the center of the probe; (35) variation thirty-four wherein the at least one standoff is a single standoff that each of the at least two first springs join; (36) the at least one standoff being located closer to a lateral perimeter of the probe than to a lateral center of the probe; (37) the second compliant element including at least two two-dimensional substantially planar springs that are co-planar and that are interleaved and with each being attached to a common second tip arm and wherein each of the at least two second springs join the at least one standoff; (38) the second compliant element includes at least two two-dimensional substantially planar second springs that are co-planar and with each being attached to a separate second tip arm that extends longitudinally to a second tip arm bridge element that functionally joins the second tip arms, and wherein each of the at least two second springs joins the at least one standoff; (39) variation thirty-eight wherein the at least one standoff to which the at least two second springs join is located closer to the lateral center of the probe than to a lateral perimeter of the probe; (40) variation thirty-eight wherein the at least one standoff to which the at least two second springs join is located in proximity to the center of the probe; (41) variation thirty-nine wherein the at least second standoff to which the at least two second springs join is a single standoff that each of the at least two second springs join; and (42) variation thirty-eight wherein the at least one standoff to which the two second springs join is located closer to a lateral perimeter of the probe than to a lateral center of the probe.

Additional variations to the fifth aspect of the invention exist and include, for example: (43) the first compliant element begins at a portion of the at least one standoff as a beginning number of first cantilevers wherein the beginning number is selected from the group consisting of: (a) at least one first planar cantilever, and (b) at least two first planar cantilevers that are longitudinally separated, and wherein the beginning number of cantilevers ends at the first tip arm as a plurality of longitudinally separated cantilevers where the plurality comprises the beginning number plus N where N is at least one; (44) variation forty-three wherein N is selected from the group consisting of at least 2, 3, 4, 5, 6, 7, and 8; (45) variation forty-four wherein N is greater than 8; (46) the second compliant element begins at a portion of the at least one standoff as a beginning number of second cantilevers wherein the beginning number is selected from the group consisting of: (a) at least one second planar cantilever, and (b) at least two second planar cantilevers that are longitudinally separated, and wherein the beginning number of cantilevers ends at the second tip arm as a plurality of longitudinally separated cantilevers where the plurality comprises the beginning number plus P where P is at least one; (47) variation forty-six wherein P is selected from the group consisting of at least 2, 3, 4, 5, 6, 7, and 8; and (48) variation forty-seven wherein P is greater than 8.

In a sixth aspect of the invention, a probe or probe module for making contact between two electronic circuit elements, includes: (a) at least one first compliant structure including: (i) a relatively rigid first base; (ii) at least one first standoff connected to the first base; and (iii) a first compliant element that includes a two-dimensional, substantially planar first spring when not biased and provides compliance in a direction substantially perpendicular to the plane of the first spring, wherein a first portion of the first compliant element functionally joins the first standoff and a second portion of the first compliant element functionally joins a first tip arm which in turn directly or indirectly joins a first tip end that can compliantly move relative to the first base and wherein the tip arm extends longitudinally away from the first base and beyond the first standoff when the first compliant element is not biased.

Numerous variations of the sixth aspect of the invention exist and include, for example: (1) the probe additionally including (a) at least one second compliant structure that includes: (i) a relatively rigid second base; (ii) at least one second standoff connected to the second base; and (iii) a second compliant element that includes a two-dimensional, substantially planar second spring when not biased and provides compliance in a direction substantially perpendicular to the plane of the second spring, wherein a first portion of the second compliant element functionally joins the second standoff and a second portion of the second compliant element functionally joins a second tip arm which in turn directly or indirectly joins a second tip end that can compliantly move relative to the second base and wherein the second tip arm extends longitudinally away from the second base and beyond the second standoff when the second compliant element is not biased, wherein the second compliant structure and the first compliant structure are in lateral alignment and longitudinally stacked to provide a combined configuration selected from the group consisting of: (A) the first tip end engages the second base while the first base and the second tip end are on opposite ends of the combined configuration; (B) the first base and the second base are in contact with each other when the first tip end and the second tip end are on opposite ends of the combined configuration; (2) the probe additionally including (a) at least one third compliant structure that includes: (i) a relatively rigid third base; (ii) at least one third standoff connected to the third base; and (iii) a third compliant element that includes a two-dimensional substantially planar third spring when not biased and provides compliance in a direction substantially perpendicular to the plane of the third spring, wherein a first portion of the third compliant element functionally joins the third standoff and a second portion of the third compliant element functionally joins a third tip arm which in turn joins a third tip end that can compliantly move relative to the third base and wherein the third tip arm extends longitudinally away from the third base and beyond the third standoff when the third compliant element is not biased, wherein the third compliant structure, the second compliant structure, and the first compliant structure are in lateral alignment and longitudinally stacked to provide a combined configuration selected from the group consisting of: (A) the first tip end engages a second base while a second tip end engages the third base when the first base and the third tip end are on opposite ends of the combined configuration; (B) the first tip end engages a second base while a second tip end engages the third base, the first base engages the third base when the third tip end and the second tip end are on opposite ends of the combined configuration; (3) the probe additionally including a first base tip arm rigidly extending from the first base longitudinally away from the first tip end, wherein the first base tip arm joins to a first base tip end opposite the first base; (4) the probe additionally including a second compliant element that includes a two-dimensional, substantially planar second spring when not biased and which provides compliance in a direction substantially perpendicular to the plane of the second spring, wherein a first portion of the second compliant element functionally joins the at least one first standoff on an opposite side of the base from the first compliant element and a second portion of the second compliant element functionally joins a second tip arm which in turn joins a second tip end that can compliantly move relative to the first base and wherein the second tip arm extends longitudinally away from the first base and beyond the first standoff when the second compliant element is not biased, and wherein the first and second tip ends are directed in opposite longitudinal directions; (5) the at least one compliant element including at least one inward rotating spiral that extends from the at least one first standoff to the at least one first tip arm, wherein the spiral has a configuration selected from the group consisting of: (i) an inward rotating circular spiral, (ii) an inward rotating rectangular spiral, (iii) an inward rotating hexagonal spiral, (iv) an inward rotating octagonal spiral, (v) an inward rotating counterclockwise spiral as observed looking from the first tip end toward the first base, and (vi) an inward rotating clockwise spiral as observed looking from the first tip end toward the first base; (6) the fifth variation wherein the spiral has a rotational extent selected from the group consisting of: (i) at least 180°, (ii) at least 360°, (iii) at least 540°, and (iv) at least 720°; (7) the first compliant element including at least two first compliant elements with each including a substantially planar first spring, when not biased, which are laid out in two longitudinally spaced parallel planes with each joining the first tip arm and the at least one first standoff, and which move together when there is a relative compression of the first tip and the base; (8) variation seven wherein the at least two first compliant elements have configurations selected from the group consisting of: (i) the same rotational configuration, and (ii) opposite rotational configurations; (9) the first compliant element including at least two two-dimensional, substantially planar first springs that are co-planar and are interleaved, wherein each of the at least two planar first springs functionally joins the first tip arm and functionally joins the at least one standoff; (10) variation nine wherein the functional joining to the first tip arm includes joining a second portion of each of the two first springs to separate first tip arms which are in turn joined by a tip arm bridge; and (11) either of variations nine or ten wherein the functional joining to the at least one standoff includes joining a first portion of each of the at least two first springs to separate standoffs which are joined to one another by the first base.

Additional variations to the sixth aspect of the invention exist and include, for example: (12) the first compliant element begins at a portion of the at least one standoff as a beginning number of first cantilevers wherein the beginning number is selected from the group consisting of: (a) at least one first planar cantilever, and (b) at least two first planar cantilevers that are longitudinally separated, and wherein the beginning number of cantilevers ends at the first tip arm as a plurality of longitudinally separated cantilevers where the plurality comprises the beginning number plus N where N is at least one; (13) variation twelve wherein N is selected from the group consisting of at least 2, 3, 4, 5, 6, 7, and 8; and (14) variation thirteen wherein N is greater than 8.

In a seventh aspect of the invention, a probe or probe module for making contact between two electronic circuit elements, includes: (a) at least one first compliant structure including: (i) at least one first standoff that provides a gap for longitudinal movement; and (ii) a first compliant element that includes a two-dimensional, substantially planar first spring when not biased and provides compliance in a direction substantially perpendicular to the plane of the first spring, wherein a first portion of the first compliant element functionally joins the first standoff and a second portion of the first compliant element functionally joins a first tip arm which in turn directly or indirectly joins a first tip that can elastically move longitudinally and wherein the tip arm extends longitudinally beyond the first standoff when the first compliant element is not biased.

In an eighth aspect of the invention, a probe includes multiple modules having planar, non-linear spring configurations. More particularly, in the seventh aspect of the invention, a probe for making contact between two electronic circuit elements, includes: (a) a first tip extension having a proximal end and a distal end; (b) a first contact tip located at the proximal end of the first tip extension; (c) a second tip extension having a proximal end and a distal end; (d) a second tip located at the distal end of the second tip extension; (e) a compliant structure functionally interacting with the distal end of the first tip extension and functionally interacting with the proximal end of the second tip extension, wherein the compliant structure includes a plurality of compliant modules functionally interacting in series, wherein each of the compliant modules includes: (i) a relatively rigid base; (ii) at least one standoff connected to the base; (iii) at least one compliant element that is substantially planar when not biased and that has a non-linear configuration that provides a compliance in a direction substantially perpendicular to the planar configuration of the element, wherein a first portion of the at least one compliant element functionally joins the at least one standoff and a second portion of the compliant element functionally joins a module tip that can compliantly move relative to the module base and wherein the module tip extends beyond a height of the at least one standoff when the compliant element is not biased; and (f) a relatively rigid structure having a proximal end from which a proximal end of the first contact tip extends and a distal end from which a distal end of the second contact tip extends when the compliant structure is not underload and which allows the compliant structure to elastically deform when at least one of the proximal end of the first tip and the distal end of the second tip is placed underload, wherein the relative rigid structure is selected from the group consisting of: (1) a sheath within which the compliant structure deforms when underload, (2) an exoskeleton that inhibits excess non-longitudinal deflection of the compliant element when underload (e.g. by including laterally external, longitudinally extended structures or guides that allow longitudinal movement of the compliant structure while providing limited shielding around the structure that is selected from the group consisting of: (a) less than 80% surface area shielding, (b) less than 60% surface area shielding, (c) less than 40% surface area shielding, and (d) less than 30% surface area shielding, wherein some variations may provide multiple guides that attach to different moveable portions or include stop structures that provide for retention of the guides or limits on allowed longitudinal motion); and (3) an endoskeleton that inhibits excess non-longitudinal deflection of the compliant element when underload (e.g. by including longitudinally extended structures that allow longitudinal movement of the compliant structure by providing movement guides that extend through openings in the compliant structure and that engage laterally internal portions of relatively movable portions of the compliant structure (e.g. rectangular, circular, L shaped, T-shaped, cross-shaped guides that extend longitudinally through complementary holes in compliant structures and that may be individually attached to one part of the complementary structure while allowing another part to slide freely wherein some variations may provide multiple guides that attach to different portions or include stop structures that provide for retention of the guides or limits on allowed longitudinal motion).

Like the first to seventh aspects, numerous variations of the eighth aspect exist and include, for example: (1) the variations as set forth in the variations, mutatis mutandis, of the first to sixth aspects of the invention; (2) the base of at least one of the probe modules including a retention structure for engaging and retaining a tip structure of an adjacent module to minimize one or more of tip/base slippage, module-to-module misalignment, excessive lateral deformation, and/or damage to a compliant element or elements of a module; (3) inclusion of a stop feature on a base that engages a tip structure for limiting excessive movement of a tip; (4) a stop feature that moves with the tip that engages another portion of a module to inhibit excessive movement of the tip; (5) a stop feature located on the standoff or on the base that engages one of the base or the standoff of an adjacent module and stops further movement prior to excessive movement of a tip occurring, (6) inclusion of a rigid stop feature; and (7) inclusion of a compliant stop feature with a spring constant that is substantially higher than that of a compliant element of a module such that once the stop feature is engaged, continued deflection of a compliant element is impeded.

In a ninth aspect of the invention, a probe includes (1) multiple modules with at least one module having two interacting (possibly connected) compliant elements and (2) one of a sheath, an exoskeleton, or endoskeleton. More particularly, in the eighth aspect of the invention, a probe for making contact between two electronic circuit elements, includes: (a) a first tip extension having a proximal end and a distal end; (b) a first contact tip located at the proximal end of the first tip extension; (c) a second tip extension having a proximal end and a distal end; (d) a second tip located at the distal end of the second tip extension; (e) a compliant structure functionally interacting with the distal end of the first tip extension and functionally interacting with the proximal end of the second tip extension, wherein the compliant structure includes a plurality of compliant modules functionally engaged in series, wherein at least one of the compliant modules includes: (i) at least one standoff; (ii) a module base; (iii) at least one first compliant element that is substantially planar when not biased and that has a non-linear configuration that provides a compliance in a direction substantially perpendicular to the planar configuration of the first compliant element, wherein a first portion of the first compliant element functionally joins the at least one standoff and a second portion of the compliant element functionally joins a module tip that can compliantly move relative to the module base and wherein the tip extends beyond a height of the standoff when the compliant element is not underload, and wherein the module provides a stop feature that inhibits excessive movement of the first compliant element beyond an elastic limit; and (iv) at least one second compliant element that is substantially planar when not biased and that has a non-linear configuration that provides a compliance in a direction substantially perpendicular to the planar configuration of the second compliant element, wherein a first portion of the second compliant element functionally joins the at least one standoff and a second portion of the second compliant element functionally joins the second portion of the first compliant element for conjoined motion; (f) a relatively rigid structure having a proximal end from which a proximal end of the first tip extends and a distal end from which a distal end of the second tip extends when the compliant structure is not underload and wherein the compliant structure is configured to elastically deform when at least one of the proximal end of the first tip and the distal end of the second tip is placed underload, wherein the relatively rigid structure is selected from the group consisting of: (1) a sheath within which the compliant structure deforms when underload, (2) an exoskeleton that inhibits excess non-longitudinal deflection of the compliant element when underload; and (3) an endoskeleton that inhibits excess non-longitudinal deflection of the compliant element when underload.

Like the first to eighth aspects, numerous variations of the ninth aspect exist and include, for example, the variations as set forth in the variations, mutatis mutandis, of the first to seventh aspects of the invention.

In a tenth aspect of the invention, a method of forming at least a portion of a plurality of probes using a multi-layer, multi-material fabrication process, includes: (a) forming a plurality of multi-material layers representing at least portions of cross-sections of the plurality of probes, wherein each successive layer formed is formed on and adhered to an immediately preceding layer, with each layer formed from at least two materials with at least one being a structural material and at least one being a sacrificial material, wherein the formation of each such multi-material layer includes: (i) depositing a first of the at least two materials; (ii) depositing a second of the at least two materials; and (b) after the forming of the plurality of successive layers, separating at least a portion of the sacrificial material from the structural material to reveal the three-dimensional structure, wherein the plurality of probes formed are selected from the group consisting of: (1) a probe of the first aspect, (2) a probe of the second aspect, (3) a probe of the third aspect, (4) a probe of the fourth aspect, (5) a probe of the fifth aspect, (6) a probe of the sixth aspect, (7) a probe of the seventh aspect, (8) a probe of the eighth aspect, (9) a probe of the ninth aspect, (10) a probe of the first aspect including at least one of the variations thereof, (11) a probe of the second aspect including at least one of the variations thereof, (12) a probe of the third aspect including at least one of the variations thereof, (13) a probe of the fourth aspect including at least one of the variations thereof, (14) a probe of the fifth aspect including at least one of the variations thereof, (15) a probe of the sixth aspect including at least one of the variations thereof, (16) a probe of the seventh aspect including at least one of the variations thereof, (17) a probe of the eighth aspect including at least one of the variations thereof; and (18) a probe of the ninth aspect including at least one of the variations thereof.

Numerous variations of the tenth aspect of the invention are possible and include for example: (1) each of the at least one structural material being a metal; (2) at least one structural material including at least two structural materials with at least one of the at least two structural materials being a dielectric; (3) a longitudinal axis of the plurality of probes extending parallel to a build axis during formation of the probes; (4) a longitudinal axis of the plurality of probes extending perpendicular to a build axis during formation of the probes; (5) a sheath being formed with at least some longitudinally extended smooth surfaces along which spring modules may slide during compression or expansion of the probes; (6) the portion of the probes formed by the multi-layer, multi-material fabrication process including formation of the spring modules and thereafter the spring modules being assembled with the relatively rigid structure after formation; (7) the portion of the probes formed by the multi-layer, multi-material fabrication process including the spring modules which are stacked and combined with the relatively rigid structure after layer fabrication and release has been completed; (8) the portion of the probes formed by the multi-layer, multi-material fabrication process including the spring modules wherein at least two of the spring modules are formed in alignment, remain in alignment, and are combined with the relatively rigid structure after layer fabrication and release has been completed; (9) the portion of the probes formed by the multi-layer, multi-material fabrication process including the spring modules wherein all of the spring modules used in a probe are formed in alignment, remain in alignment, and are combined with the relatively rigid structure after layer fabrication and release has been completed; (10) the portion of the probes formed by the multi-layer, multi-material fabrication process including the spring modules wherein at least two of the spring modules used in a probe are formed in alignment, remain in alignment, and are combined with the relatively rigid structure after layer fabrication and prior to complete release of the modules from the sacrificial build material; (11) during the multi-layer, multi-material fabrication process, at least a portion of the layers being planarized after deposition of the materials forming those respective layers; (12) the portion of the probes formed by the multi-layer, multi-material fabrication process being subjected to heat treatment to improve one or more properties of the probes (e.g. to increase yield strength, to increase spring constant, to decrease yield strength to allow plastic deformation with less force and thereafter to enhance yield strength); (13) the portion of the probes formed by the multi-layer, multi-material fabrication process being individually released from a build substrate prior to assembly into an array configuration; and (14) the portion of the probes formed by the multi-layer, multi-material fabrication process being formed in groups with a lateral spacing of probes in each group during formation corresponding to a lateral spacing to be used in a probe array wherein the probes are released from a build substrate in groups and the groups are assembled into array configurations.

In an eleventh aspect of the invention, a method of forming a plurality of spring modules using a multi-layer, multi-material fabrication process, includes: (a) forming a plurality of multi-material layers representing at least portions of cross-sections of the plurality of probes, wherein each successive layer formed is formed on and adhered to an immediately preceding layer, with each layer formed from at least two materials with at least one being a structural material and at least one being a sacrificial material, wherein the formation of each such multi-material layer includes: (i) depositing a first of the at least two materials; (ii) depositing a second of the at least two materials; and (b) after the forming of the plurality of successive layers, separating at least a portion of the sacrificial material from the structural material to reveal the plurality of spring modules, wherein each of the compliant modules includes: (i) a relatively rigid base; (ii) at least one standoff connected to the base; (iii) at least one compliant element that is substantially planar when not biased and that has a non-linear configuration that provides compliance in a direction substantially perpendicular to the planar configuration of the element, wherein a first portion of the first compliant element functionally joins the standoff and a second portion of the compliant element functionally joins a module tip that can compliantly move relative to the module base and wherein the tip extends beyond a height of the at least one standoff when the compliant element is not biased.

Like the first to tenth aspects, numerous variations of the eleventh aspect exist and include, for example: (1) the probe or module features addressed in the previous aspects of the invention as well as in their respective variations, mutatis mutandis; and (2) the formation steps and features associated with the ninth aspect of the invention, its variations, and features and variations of the different embodiments set forth herein.

In a twelfth aspect of the invention, a probe array, includes: (a) a plurality of probes having features similar to one or more of the probes of any of the first to ninth aspects or any such aspects incorporating one or more of its variations; and (b) at least one array structure for holding and retaining the plurality of probes in a defined lateral and longitudinal configuration.

Like the first to eleventh aspects, numerous variations of the twelfth aspect exist and will be apparent to those of skill in the art upon review of the teachings herein.

In a thirteenth aspect of the invention, a method of forming a probe array, includes: (a) providing an array structure on which to form a plurality of probes; and (b) forming a plurality of probes on the array structure where the probes are formed with a desired array spacing according to the tenth aspect of the invention.

In a fourteenth aspect of the invention, a method of forming a probe array, includes: (a) forming a plurality of probes according to the tenth aspect of the invention; and (b) transferring the plurality of probes to at least one array structure so that the probes are provided with a desired array spacing.

Like the first to twelfth aspects, numerous variations of the thirteenth and fourteenth aspects exist and will be apparent to those of skill in the art upon review of the teachings herein.

Other aspects of the invention will be understood by those of skill in the art upon review of the teachings herein. Other aspects of the invention may involve combinations of the above noted aspects. These other aspects of the invention may provide various combinations of the aspects presented above as well as provide other configurations, structures, functional relationships, and processes that have not been specifically set forth above but are taught by other specific teachings set forth herein, by the teachings of the specification as a whole, or by teachings incorporated herein by reference.

BRIEF DESCRIPTION OF THE DRAWINGS

FIGS. 18F1 and 18F2 illustrate a group of three probes that are ready for assembly with an array structure (FIG. 18F1) and after such assembly has occurred (FIG. 18F2) wherein the probes are similar to those of FIG. 12 and wherein the array structure includes retention or alignment spring structures that compress upon insertion of the probe into the openings.

FIGS. 22A-22C provide three similar views to those shown in FIGS. 21A-21C for another embodiment of the invention wherein the engagement structure on the base of the present embodiment takes the form of an arc, instead of a full ring, the opening of the arc facing laterally toward the standoff with the direction of the opening selected to block any anticipated excess lateral movement of a tip against the base in absence of a barrier to slippage.

FIGS. 23A-23C provide a side view of a single module (FIG. 23A), a cut view of a retention structure located at the bottom of the module of FIG. 23A (FIG. 23B), and a side view of two stacked modules (FIG. 33C), wherein a lower tip of each module includes a retention structure that may be used to engage bumps of an electronic structure to be contacted or that may be used to engage and laterally restrain a tip of another module.

FIG. 28A provides a side view of a probe according to another embodiment of the invention where the probe is formed from two back-to-back modules similar to the module of FIGS. 27A-27B where the two modules share a common base that also functions as a standoff and has an annular configuration.

FIGS. 28B-28N provide cross-sectional views of successive layers of structural material of the probe of FIG. 28A with views of the tips, the springs, and the standoff/base shown with different hatching patterns where upward movement of the lower tip biases the central portion of the lower (connected) springs upward, and downward movement of the upper tip biases the central portion of the upper (connected) springs downward.

FIGS. 29A1-29L provide a pair of different side views (FIGS. 29A1-29A2) along with layer views (FIGS. 29B-29L) of a probe according to another embodiment of the invention wherein the probe includes: (1) a lower central contact tip that joins a central upper spring connection element via a tip extension, wherein the connection element joins a pair of upper interlaced coplanar spiral spring elements, (2) an upper contact tip element that is connected to a bridge that in turn connects to a pair of tip extensions that join to central portions of a pair of lower coplanar spring elements, and (3) four standoff elements that are joined to one another by a central rectangular ring frame element that functions as a bridge or base as well as a standoff between the planar spring elements (e.g. an external frame structure) and wherein the four standoff elements support the outermost ends of the inward rotating upper and lower spring elements.

FIGS. 30A1-30A2 provide a pair of different side views of a probe, and FIG. 30A3 provides an alternative version of the probe with some optional stop features, while FIGS. 30B-30J provide top views of layers (or simply layer views) of the probe of FIGS. 30A1 and 30A2 according to another embodiment of the invention wherein the probe operates in a manner similar to that of the probe of FIGS. 29A1-29L but with the rectangular ring-like frame structure and the associated standoff elements replaced with a central connecting structure (base or standoff) such that outermost portions of the springs move relative to one another in association with tip displacement.

FIGS. 34A-34D4 provide various views of a probe according to another embodiment of the invention where the probe has some similarities to the probe of FIG. 28A but where the probe includes various distinct features.

FIG. 34E1 provides a side view of the probe of FIGS. 34A-34D4 showing 17 sample layer levels from which the probe can be fabricated wherein not all layers have unique configurations.

FIGS. 34E2-A to 34E9-B illustrate cross-sectional configurations shown in both a top view (the -A figures) and in an isometric view (the -B figures) for unique configurations of layers L1-L17 with FIGS. 34E2-A and 34E2-B illustrating views of layers L1 and L17; FIGS. 34E3-A and 34E3-B illustrating views of layers L2, L4, L6, and L8; FIGS. 34E4-A and 34E4-B illustrating views of layers L3 and L7; FIGS. 34E5-A and 34E5-B illustrating views of layer L5; FIGS. 34E6-A and 34E6-B illustrating views of layer L9; FIGS. 34E7-A and 34E7-B illustrating views of layers L10, L12, L14, and L16; FIGS. 34E8-A and 34E8-B illustrating views of layers L11 and L15; and FIGS. 34E9-A and 34E9-B illustrating views of layer L13.

DETAILED DESCRIPTION OF PREFERRED EMBODIMENTS

Electrochemical Fabrication in General

Figure 1A:
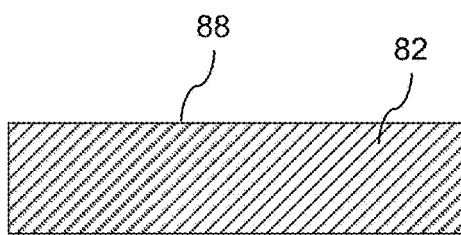
FIGS. 1A-1F schematically depict the formation of a first layer of a structure using adhered mask plating where the blanket deposition of a second material overlays both the openings between deposition locations of a first material and the first material itself.
Figure 1B:
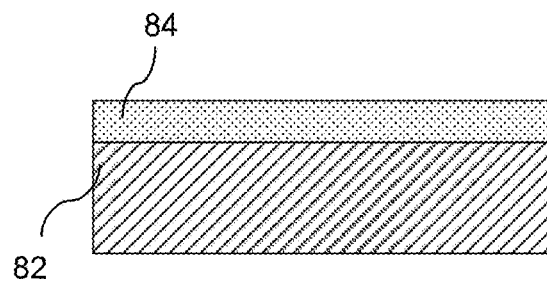
Figure 1C:
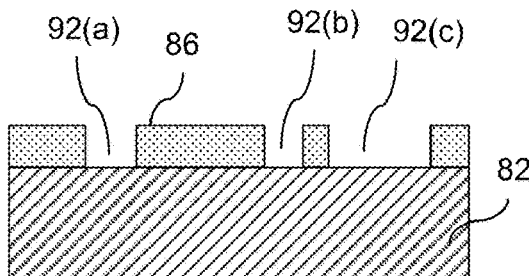
Figure 1D:
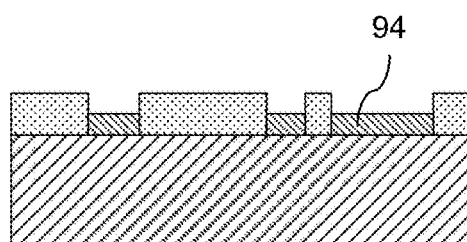
Figure 1E:
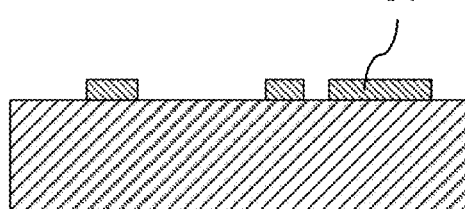
Figure 1F:
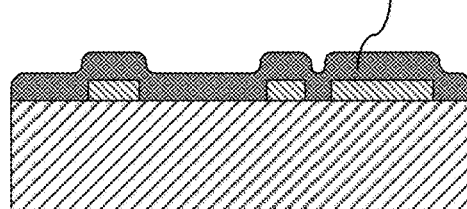
Figure 1G:
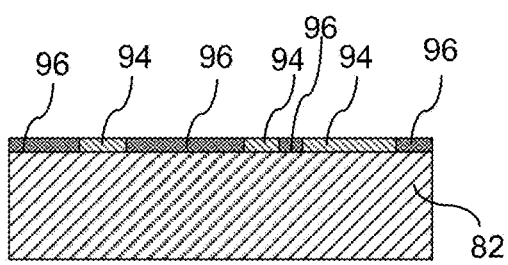
FIG. 1G depicts the completion of formation of the first layer resulting from planarizing the deposited materials to a desired level.
Figure 1H:
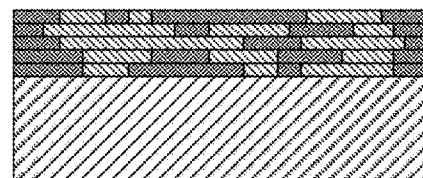
FIGS. 1H and 1I respectively depict the state of the process after formation of the multiple layers of the structure and after release of the structure from the sacrificial material.
Figure 1I:
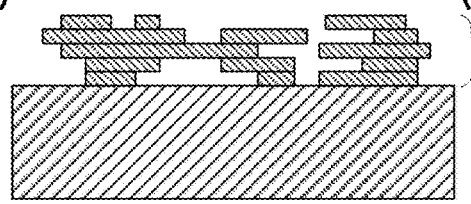

FIGS. 1A-1I illustrate side views of various states in an example multi-layer, multi-material electrochemical fabrication process. FIGS. 1A-1G illustrate various stages in the formation of a single layer of a multi-layer fabrication process where a second metal is deposited on a first metal as well as in openings in the first metal so that the first and second metal form part of the layer. In FIG. 1A, a side view of a substrate 82 having a surface 88 is shown, onto which patternable photoresist 84 is located as shown in FIG. 1B. In FIG. 1C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 1D, a metal 94 (e.g., nickel) is shown as having been electroplated into the openings 92(a)-92(c). In FIG. 1E, the photoresist has been removed (i.e., chemically or otherwise stripped) from the substrate to expose regions of the substrate 82 which are not covered with the first metal 94. In FIG. 1F, a second metal 96 (e.g., silver) is shown as having been blanket electroplated over the entire exposed portions of the substrate 82 (which is conductive) and over the first metal 94 (which is also conductive). FIG. 1G depicts the completed first layer of the structure which has resulted from the planarization of the first and second metals down to a height that exposes the first metal and sets a thickness for the first layer. In FIG. 1H, the result of repeating the process steps shown in FIGS. 1B-1G several times to form a multi-layer structure is shown where each layer consists of two materials. For most applications, one of these materials is removed, as shown in FIG. 1I, to yield a desired 3-D structure 98 (e.g., component or device) or multiple such structures.

Various embodiments of various aspects of the invention are directed to formation of three-dimensional structures from materials, some, or all, of which may be electrodeposited or electroless deposited (as illustrated in the example of FIGS. 1A-1I and as discussed in various patent applications incorporated herein by reference). Some of these structures may be formed from a single build level formed from one or more deposited materials while others are formed from a plurality of build layers, each including at least two materials (e.g., two or more layers, more preferably five or more layers, and most preferably ten or more layers). In some embodiments, layer thicknesses may be as small as one micron or as large as fifty microns. In other embodiments, thinner layers may be used while in other embodiments, thicker layers may be used. In some embodiments, microscale structures have lateral features positioned with 0.1-10-micron level precision and minimum feature sizes on the order of microns to tens of microns. In other embodiments, structures with less precise feature placement and/or larger minimum features may be formed. In still other embodiments, higher precision and smaller minimum feature sizes may be desirable. In the present application, meso-scale and millimeter-scale have the same meaning and refer to devices that may have one or more dimensions that may extend into the 0.5-50-millimeter range, or larger, and features positioned with a precision in the micron to 100 micron range and with minimum feature sizes on the order of tens of microns to hundreds of microns.

The various embodiments, alternatives, and techniques disclosed herein may form multi-layer structures using a single patterning technique on all layers or using different patterning techniques on different layers. For example, various embodiments of the invention may perform selective patterning operations using conformable contact masks and masking operations (i.e. operations that use masks which are contacted to but not adhered to a substrate), proximity masks and masking operations (i.e. operations that use masks that at least partially selectively shield a substrate by their proximity to the substrate even if contact is not made), non-conformable masks and masking operations (i.e. masks and operations based on masks whose contact surfaces are not significantly conformable), and/or adhered masks and masking operations (masks and operations that use masks that are adhered to a substrate onto which selective deposition or etching is to occur as opposed to only being contacted to it). Conformable contact masks, proximity masks, and non-conformable contact masks share the property that they are preformed and brought to, or in proximity to, a surface which is to be treated (i.e., the exposed portions of the surface are to be treated). These masks can generally be removed without damaging the mask or the surface that received treatment to which they were contacted or located in proximity to. Adhered masks are generally formed on the surface to be treated (i.e., the portion of that surface that is to be masked) and bonded to that surface such that they cannot be separated from that surface without being completely destroyed or damaged beyond any point of reuse. Adhered masks may be formed in a number of ways including: (1) by application of a photoresist, selective exposure of the photoresist, and then development of the photoresist, (2) selective transfer of pre-patterned masking material, and/or (3) direct formation of masks from computer-controlled depositions of material. In some embodiments, adhered mask material may be used as a sacrificial for the layer or may be used only as a masking material which is replaced by another material (e.g., dielectric or conductive material) prior to completing formation of a layer where the replacement material will be considered the sacrificial material of the respective layer. Masking material may or may not be planarized before or after deposition of material into voids or openings included therein.

Patterning operations may be used in selectively depositing material and/or may be used in the selective etching of material. Selectively etched regions may be selectively filled in or filled in via blanket deposition, or the like, with a different desired material. In some embodiments, the layer-by-layer build up may involve the simultaneous formation of portions of multiple layers. In some embodiments, depositions made in association with some layer levels may result in depositions to regions associated with other layer levels (i.e., regions that lie within the top and bottom boundary levels that define a different layer's geometric configuration). Such use of selective etching and/or interlaced material deposition in association with multiple layers is described in U.S. patent application Ser. No. 10/434,519, by Smalley, filed May 7, 2003, which is now U.S. Pat. No. 7,252,861, and which is entitled "Methods of and Apparatus for Electrochemically Fabricating Structures Via Interlaced Layers or Via Selective Etching and Filling of Voids". This referenced application is incorporated herein by reference.

Temporary substrates on which structures may be formed may be of the sacrificial-type (i.e., destroyed or damaged during separation of deposited materials to the extent they cannot be reused) or non-sacrificial-type (i.e., not destroyed or excessively damaged, i.e. not damaged to the extent they may not be reused, e.g. with a sacrificial or release layer located between the substrate and the initial layers of a structure that is formed). Non-sacrificial substrates may be considered reusable, with little or no rework (e.g., by replanarizing one or more selected surfaces or applying a release layer, and the like) though they may or may not be reused for a variety of reasons.

Definitions of various terms and concepts that may be used in understanding the embodiments of the invention (either for the devices themselves, certain methods for making the devices, or certain methods for using the devices) will be understood by those of skill in the art. Some such terms and concepts are discussed herein while other such terms are addressed in the various patent applications to which the present application claims priority and/or which are incorporated herein by reference (e.g., U.S. patent application Ser. No. 16/584,818).

"Longitudinal" as used herein refers to a long dimension of a probe, an end-to-end dimension of the probe, or a tip-to-tip dimension. Longitudinal may refer to a generally straight line that extends from one end of the probe to another end of the probe or it may refer to a curved or stair-stepped path that has a sloped or even changing direction along a height of the probe. When referring to probe arrays, or probes as they will be loaded into an array configuration, the longitudinal dimension may refer to a particular direction that the probes in the array point or extend but it may also simply refer to the overall height of the array that starts at a plane containing first ends, tips, or bases of a plurality of probes and extends perpendicular thereto to a plane containing second ends, tips, or tops of the probes. The context of use typically makes clear what is meant especially to those of skill in the art. It is intended that the interpretation to be applied to the term herein be as narrow as warranted by the details of the description provided or the context in which the term is used. If however, no such narrow interpretation is warranted, it is intended that the broadest reasonable scope of interpretation apply.

"Lateral" as used herein is related to the term longitudinal. In terms of the stacking of layers, lateral refers to a direction within each layer, or two perpendicular directions within each layer (i.e. one or more directions that lie within a plane of a layer that is substantially perpendicular to a layer stacking direction). When referring to probe arrays, laterally generally has a similar meaning in that a lateral dimension is generally a dimension that lies in a plane that is parallel to a plane of the top or bottom of the array (i.e. substantially perpendicular to the longitudinal dimension). When referring to probes themselves, the lateral dimensions may be those that are perpendicular to an overall longitudinal axis of the probe, a local longitudinal axis of the probe (that is local lateral dimensions), or simply the dimensions similar to those noted for arrays or layers. The context of use typically makes clear what is meant especially to those of skill in the art. It is intended that the interpretation to be applied to the term herein be as narrow as warranted by the details of the description provided or the context in which the term is used. If no such narrow interpretation is warranted, it is intended that the broadest reasonable scope of interpretation apply.

"Substantially parallel" as used herein means something that is parallel or close to being parallel, i.e., within 15° of being parallel, more preferably within 10° of being parallel, even more preferably within 5° of being parallel, and most preferably within 1° of being parallel. If the term is used without clarification, it should be interpreted as being within 15° of being parallel. When used with specific clarification, the term should be construed in accordance with the specific clarification.

"Substantially perpendicular" or "substantially normal" as used herein means something that is perpendicular or close to being perpendicular, i.e., within 15° of being perpendicular, more preferably within 10° of being perpendicular, even more preferably within 5° of being perpendicular, and most preferably within 1° of being perpendicular. If the term is used without clarification, it should be interpreted as being within 15° of being perpendicular. When used with specific clarification, the term should be construed in accordance with the specific clarification.

"Substantially planar" when referring to a surface, as used herein, refers to a surface that is intended to be planar, though some imperfections may exist as will be understood by one of skill in the art (i.e. imperfections that may deviate from planarity by up to 1-5 microns but often are submicron in nature when referring to millimeter and micro-scale devices as are the primary device embodiments set forth herein). If the term is used without clarification, it should be interpreted as having imperfections that deviate from planarity by no more than 5 microns. When used with specific clarification, the term should be construed in accordance with the specific clarification. When referring to a structure, the term does not refer to a structure that is infinitely thin but one that is formed with top and bottom surfaces that are substantially planar, for example, the top and bottom surface of each layer, or group of successively formed layers of a structure formed using multi-material, multi-layer electrochemical fabrication methods particularly when each layer undergoes a planarization operation such as lapping, fly cutting, chemical mechanical planarization, spreading by spinning, and the like. A substantially planar structure, in some cases, may also imply that the structure, or element of the structure, is small in height or thickness compared to a size of the structure in the two perpendicular dimensions (i.e. the ratio of perpendicular foot print to thickness is greater than 25, preferably greater than 50, more preferably greater than 100, and most preferably greater than 200). If the term is used with regard to a structure without clarification, it should be interpreted as meeting the substantially planar surface criteria for both upper and lower surfaces. In some contexts, a ratio requirement may also apply, i.e., a ratio of at least 25. When used with regard to a structure with specific clarification, the term should be construed in accordance with the specific clarification.

"Relatively rigid" as used herein refers to a comparison of rigidity between two structural elements when the two structural elements are subject to working loads or stresses where the relatively rigid structural element should undergo less deflection or distortion compared to the other structural element by at least a factor of 2, more preferably by a factor of 5, and most preferably by a factor of 10. If the term is used with regard to a structural element without clarification, it should be interpreted as meeting the factor of 2 requirement. When used with regard to a structural element with specific clarification, the term should be construed in accordance with the specific clarification.

"Non-linear configuration" as used herein refers to a configuration that is not a straight bar-like configuration particularly when applied to a physical structure or element. A non-linear configuration would be a configuration that is two or three dimensional in nature with features that include one or more bends or curves. For example, a planar, non-linear structure may be a flat spiral structure. When referring to springs, as used herein, a non-linear configuration does not refer to a force-deflection relationship unless specifically and unambiguously indicating such a relationship.

Probes with Planar Spring Modules:

Some embodiments of the invention are directed to spring modules with each spring module including at least one centrally located tip attached to at least one planar compliant spring element (while in an unbiased state) which is in turn attached to a base via a connecting bridge or standoff or where the base provides at least a portion of the standoff functionality wherein an axis of primary spring compliance is perpendicular to the plane of the spring arm or arms that form the spring element. Some embodiments are directed to spring modules including compliant elements that have flat springs in the form of inward winding spirals (whether of a smooth curved configuration or of a polygonal configuration or angled configuration) that end in longitudinally extending contact tips or tip extensions, standoffs, or arms. Some embodiments are directed to probes formed as, or from, single spring modules. Some embodiments are directed to probes formed as, or from, back-to-back spring modules that may share a common base element that connects standoffs, a base element that functions as a standoff, or simply have one or more joined standoffs that connect to spring elements. Some embodiments are directed to probes formed from a plurality of spring modules in combination with other components such as probe tips (that may be separate from spring module tips), tip extensions, and sheaths. Some embodiments are directed to methods for forming spring modules; forming probes that include single spring modules, forming probes that include back-to-back spring modules, or forming probes that include a plurality of adhered or contacting spring modules built up during a process that forms and simultaneously assembles components or structures, while still others are directed to forming probe components and thereafter assembling them into working probe structures. Still other embodiments are directed to probe arrays that include one or more of the probe types noted above along with array structures (e.g., substrates, guide plates, and the like). Still other embodiments are directed to methods of making such probe arrays.

Planar springs or planar compliant elements of the present invention may be formed in a number of different ways and take a number of different configurations. Generally, the compliant elements include planar springs that have portions that extend from a standoff to a tip or tip arm in a cantilever or bridged manner (e.g., two or more springs starting from different lateral standoff locations and joining to a common tip arm—herein generally referred to as a cantilever or cantilevers) over a gap or open area into which the spring may deflect during normal operation. These compliant portions generally have two-dimensional non-linear configurations within a lateral plane and a thickness extending perpendicular to the plane (e.g., in longitudinal direction), where two-dimensional configuration may be in the form of a beam structure with a curved or angled configuration with a length much larger than its width, e.g. at least 5, 10, 20, or even 50 times or more in some variations, wherein the thickness is generally smaller than the length of the beam, e.g. at least 5, 10, 20, or even 50 times or more in some variations, or a lateral dimension of the spring element, e.g. 2, 5, 10, or even 20 times or more in some variations. In some embodiments, the plane of such configurations may be parallel to layer planes when the probes or modules are formed from a plurality of adhered layers (e.g., X-Y plane). The thickness (e.g., in a Z-direction) of a spring may be that of a single layer or may be multiple layer thicknesses. In some embodiments, compliant elements include a plurality of spaced planar spring elements.

In some embodiments the compliant elements may include planar spring elements that are joined not only at a standoff or tip structure to one another but also at locations intermediate to such end elements. In some such embodiments, the planar spring elements may start from one end (e.g., a standoff or tip arm) as one or more thickened springs with a relatively high spring constant and then be provided with a reduced spring constant by removal of some intermediate spring material between the top and bottom of the initial spring structure such that what started as a small but thick number of planar compliant elements (e.g. 1, 2, or 3 elements) transitions to a larger number of thinner planar elements, with some initial planar elements dividing into 2, 3, 4, 5 or more planar but thinner elements, prior to reaching the other end (e.g. a tip arm of standoff) whereby, for example, the spring constant, force requirements, overtravel, stress, strain, current carrying capacity, overall size and other operational parameters can be tailored to meet requirements of a given application.

Reference numbers are included in many of FIGS. 2 to 33 wherein like numbers are used to represent similar structures or features in the different embodiments. In particular, when the FIGS. of the various embodiments (i.e., FIGS. 2 to 33) use reference numbers, the reference numbers are provided in a 3 or 4 digit format which may be followed by letters, dashes, and/or additional numbers, wherein the first digit or first two digits (from the left) represent the FIG. number while the final two digits to the right along with any trailing letters, dashes, or numbers represent a particular general structure or feature. When two or more figures include a reference having the same left most digits (and following letters, dashes, and additional numbers), it is intended to indicate a similarity of the features indicated. The following table sets forth these two right most digits along with supplemental letters, dashes, and numbers, and a general description of the structure or feature being represented.

Table of Reference Numbers for Structures/Features

| No. | Description |
|---|---|
| 00 | A probe or probe module |
| 00-A or 00-A# | A probe or module that is a variation, or includes alternative features, compared to the probe or module for the same figure set that does not include the A or has a different -A# designation (e.g., 00-A1 has different features compared to 00-A2 which are both different from 00-A3, etc). |
| 01 | A base or frame of a single module which may provide no standoff functionality, partial standoff functionality or complete standoff functionality, and which may support a single or multiple distinct standoff elements that extend longitudinally therefrom |
| 01-A | An arcuate portion of a base element |
| 01-C | A channel, slot or gap through a base that allows passage of a frame structure and more particularly an endoskeleton structure |
| 01-CL | A lower compliant, or spring-like, base element |
| 01-CU | An upper compliant, or spring-like, base element |
| 01-F | A flat portion of a base element |
| 01-L | A lower portion of a probe, or module, base |
| 01-M | A middle portion of a probe, or module, base |
| 01-S | Protruding stop structure extending from a base |
| 01-U | An upper portion of a probe, or module, base |
| 09 | Alignment perimeter or features for conceptual layer-to-layer registration |
| 11 | Standoff, or support, for one or more planar springs that may or may not extend longitudinally from a base, directly join longitudinally separated planar spring |

-continued

Table of Reference Numbers for Structures/Features

| No. | Description |
|---|---|
|  | elements or be end portions of spring elements that longitudinally join other spring elements |
| 11-1 | A first standoff, or support, for one or more upper planar springs |
| 11-2 | A second standoff, or support, for one or more upper planar springs |
| 11-C | A gap or slot through a standoff to allow passage of a frame structure and more particularly an endoskeleton structure |
| 11-L | A lower standoff, or support, for one or more planar springs |
| 11-U | An upper standoff, or support, for one or more planar springs |
| 12 | A standoff, or support for one or more lower compliant elements |
| 12-1 | A first standoff, or support, for one or more lower planar springs |
| 12-2 | A second standoff, or support, for one or more lower planar springs |
| 17-L | Lower framing element(s) for a probe which provides extra framing (e.g. as a sheath structure) |
| 17-U | Lower framing element(s) for a probe which provide extra framing (e.g. as a sheath structure) |
| 21 | Planar spring element |
| 21-1 | A first, or more interior, planar spring element connected to a common tip associated with a compliant element of a module or probe |
| 21-1B | A back feature of a first, or more interior, planar spring element of an upper compliant element connected to a common tip |
| 21-1F | A front feature of a first, or more interior, planar spring element of an upper compliant element connected to a common tip |
| 21-1L | A first, or more interior, planar spring element connected to a common tip associated with a lower compliant element of a module or probe |
| 21-1U | A first, or more interior, planar spring element connected to a common tip associated with an upper element of a module or probe |
| 21-2 | A second, or more exterior, planar spring element connected to a common tip associated with a compliant element of a module or probe |
| 21-2B | A back feature of a second, or more exterior planar spring element of an upper compliant element connected to a common tip |
| 21-2F | A front feature of a second, or more exterior planar spring element of an upper compliant element connected to a common tip |
| 21-2L | A second, or more exterior, planar spring element connected to a common tip associated with a lower compliant element of a module or probe |
| 21-2U | A second, or more exterior, planar spring element connected to a common tip associated with an upper compliant element of a module or probe |
| 21-C | A gap or slot through or between spring arms to allow passage of a frame element and more particularly an endoskeleton structure |
| 21-E | An end of a planar spring element associated with a compliant element of a module or probe and particularly an end portion that is embedded in standoff material |
| 21-L | A planar spring element associated with a lower compliant element of a module or probe |
| 21-U | A planar spring element associated with an upper compliant element of a module or probe |
| 21-LC | A lower, complete compliant element of a probe, or module, including one or more spring elements, one or more intermediate standoff elements, one or more tip arms and/or tips |
| 21-UC | An upper, complete compliant element of a probe, or module, including one or more spring elements, one or more intermediate standoff elements, one or more tip arms and/or tips |
| 22-1B | A back feature of a first, or more interior, planar spring element of a lower compliant element connected to a common tip |
| 22-1F | A front feature of a first, or more interior, planar spring element of a lower compliant element connected to a common tip |
| 22-2B | A back feature of a second, or more exterior planar spring element of a lower compliant element connected to a common tip |
| 22-2F | A front feature of a second, or more exterior planar spring element of a lower compliant element connected to a common tip |
| 22-E | An end of a planar spring element associated with a compliant element of a module or probe and particularly an end portion that is embedded in standoff material |
| 31 | A probe, or module, tip |
| 31-L | A second, or lower, probe, or module, tip |
| 31-LA | An arm of a second, or lower, probe, or module, tip |
| 31-LB | A bridge joining a lower tip to laterally separated lower tip arms that in turn may join with an upper spring or a lower spring |
| 31-LBS | A movement stop feature attached to a lower bridge |
| 31-LAHS | A movement stop feature extending horizontally from a lower arm |
| 31-LAVS | A movement stop feature extending vertically from a lower arm or upper spring that is joined to a lower arm |
| 31-R | Retention structure fully or partially and laterally bounding a contact tip or contact region wherein the retention structure inhibits lateral displacement |
| 31-S | Tip arm stop |
| 31-U | A first, or upper, probe, or module, probe tip |
| 31-UA | An arm of a first, or upper, probe, or module, tip |

-continued

Table of Reference Numbers for Structures/Features

| No. | Description |
|---|---|
| 31-UB | A bridge joining an upper tip to laterally separated upper tip arms that in turn may join with one or more upper springs or a lower springs |
| 31-UBS | A movement stop feature attached to an upper bridge |
| 31-UAHS | A movement stop feature extending horizontally from an upper arm |
| 31-UAVS | A movement stop feature extending vertically from an upper arm or lower spring that is joined to an upper arm |
| 32-L | A second, or lower, tip of a multi-module probe |
| 32-LA | An arm, or extension, of a second, or lower, tip of a multi-module probe |
| 32-U | A first, or upper, tip of a multi-module probe |
| 32-UA | An arm, or extension, of a first, or upper, tip of a multi-module probe |
| 35-U | A first, or upper, over-compression stop for a multi-module probe |
| 40 | Guide plate or array mounting structure |
| 40-CS | Compressed retention or alignment spring structures for an array structure |
| 40-L | Guide plate or array mounting structure that is applied from below |
| 40-S | Retention or alignment spring structures for an array structure |
| 40-U | Guide plate or array mounting structure that is applied from above |
| 41 | A recess or through hole in a guide plate or other array structure for receiving a probe or module |
| 42-L | A lower opening in a sheath |
| 42-U | An upper opening in a sheath |
| 51 | Sheath or frame for a multi-module probe |
| 52 | Gap, slot, channel or other opening configured to receive a second frame structure where the opening is formed within or at least in part by a surface of a first frame structure |
| 99 | Partially or fully formed array |
| L# or L## | A layer of a structure to be formed (e.g. a probe or a module) wherein # or ## represents the number of the layer (e.g. L1 is layer 1, while L11 is layer 11) |
| CS | Spacing between spring coils |
| LC# | A cantilever element of a lower compliant element wherein # represents the number of the cantilever element starting from the most longitudinally interior portion of the compliant element (e.g., LC1 is the most longitudinally interior cantilever of a lower compliant element while LC4 would be the fourth such cantilever element) |
| UC# | A cantilever element of an upper compliant element wherein # represents the number of the cantilever element starting from the most longitudinally interior portion of the compliant element (e.g., UC1 is the most longitudinally interior cantilever of an upper compliant element while UC4 would be the fourth such cantilever element) |
| MG | Longitudinal module gap between an innermost spring element and a base |
| MH | Module height |
| SG | Longitudinal gap between springs |
| SH | Spring height |
| SW | Spring width |
| TH | Tip height extending beyond a spring |
| TW | Tip width |

Figure 2:
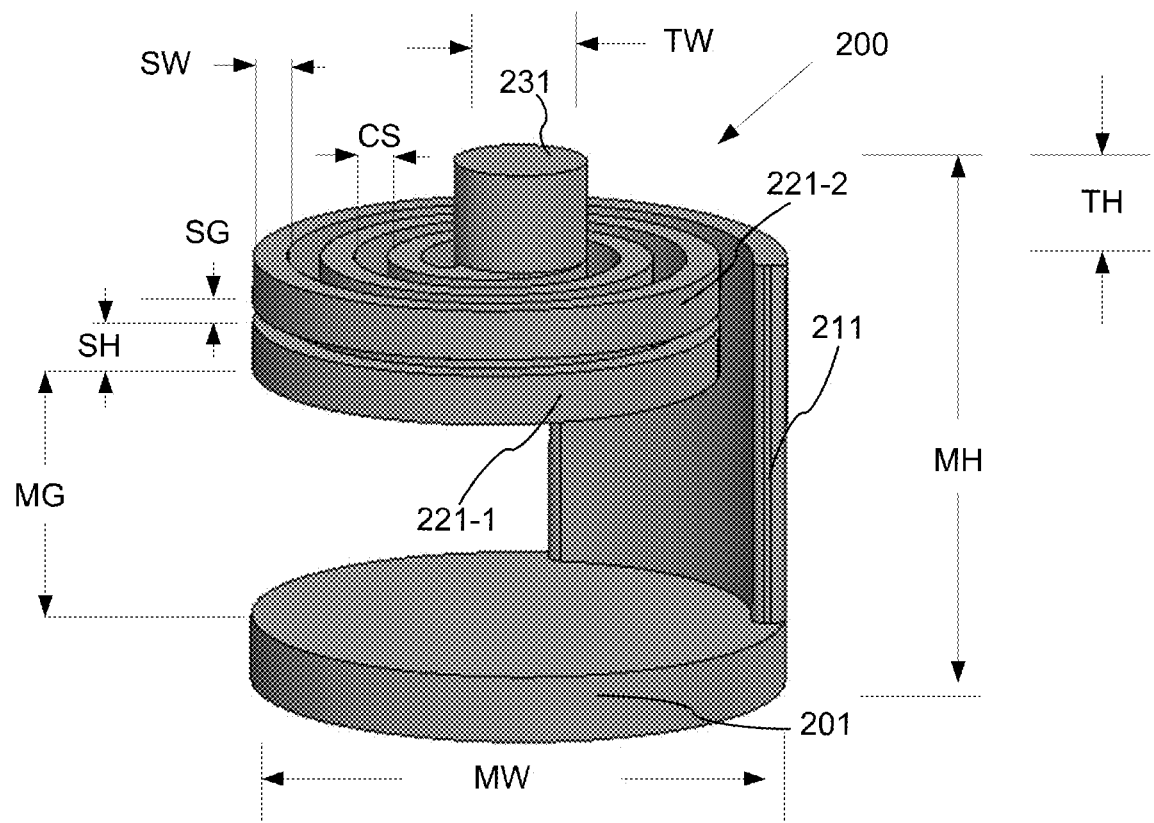
FIG. 2 depicts an isometric view of an example spring module or compliant module having two connected spring elements, a base, and a connecting support or standoff that may be used in a probe or as a probe.
Figure 3:
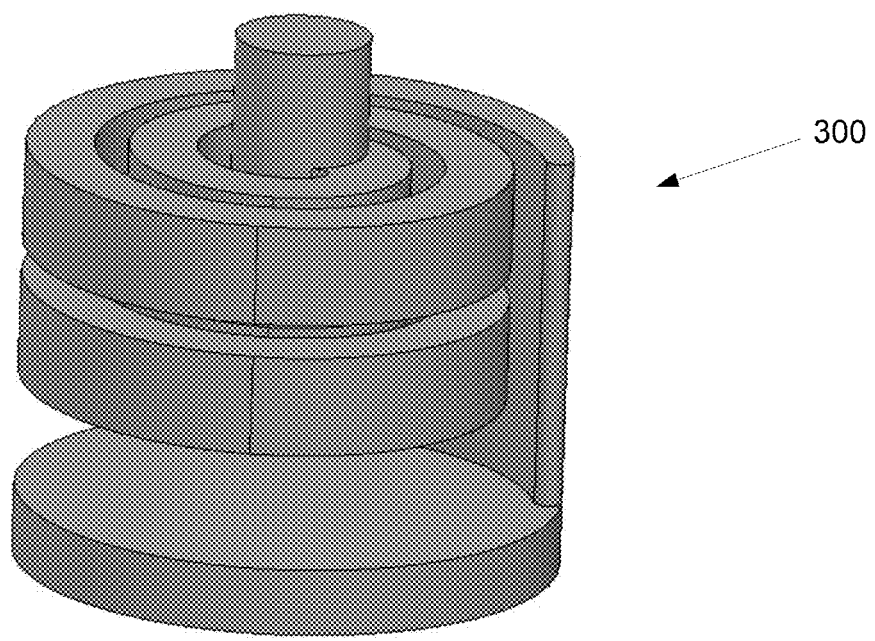
FIG. 3 depicts an isometric view of a second example spring module or compliant module that may be used in a probe, or as a probe, similar to the module of FIG. 2 with the exception that the two spring elements are thicker and, as such, provide a greater spring constant than that of the elements of FIG. 2.

Example spring modules are shown in FIGS. 2-3. FIG. 2 depicts an isometric view of an example spring module 200 with two undeflected spring elements 221-1 and 221-2, a base 201 spaced from the spring elements and a connecting support (e.g., a standoff or bridge) 211 that bridges a longitudinal module gap MG between the spring elements and the base. In the example of FIG. 2, each of the two spring elements take the form of a planar radially extending spiral that extends from the radially displaced bridge 211 to a centrally or axially positioned tip element 231 via a downward extending portion of the tip structure. The springs are separated longitudinally by a gap SG. In this example, the bridge 211 connects one end of each spring element together while a tip element 231 connects the other ends of the spring elements together via an extended portion of the tip structure. The tip element 231 is formed with a desired width TW and desired tip height TH extending above the upper spring, and each spring element is formed with a desired material, beam thickness or spring height SH, beam width or spring width SW, spacing between spring coils CS, and coiled beam length that allows the spring to deflect a desired amount without exceeding an elastic deflection limit of the structure and associated material from which it is formed while providing a desired fixed or variable spring force over its deflection range. In particular, the length of the tip may be such that a desired compression of a module tip toward the base can occur without the base, bridge, and spring elements interfering with one another. In some embodiments, for example, a maximum travel distance for the tip of each module may be as little as 5 um (um=micron) or less or as much as 500 um (e.g., 25 ums, 50 ums, 100 ums or 200 ums) or more. For example, in some embodiments, a maximum travel distance per module may be 25 um to 200 um while in other example embodiments, the maximum travel distance per module may be 50 um to 150 um. In some embodiments, the maximum travel distance of the tip may be set by a hard stop such as by the deflected portion of the spring or tip coming into contact with the base, by a stop structure on the base, or possibly by a surface that contacts the tip (e.g., the surface of an adjacent module) coming into contact with the upper portion of the bridge. In other embodiments, the maximum travel distance may be instilled by the compliant spring or tip portion coming into contact with a soft stop or compliance decreasing structure. The force to achieve maximum deflection (or travel) may be as small as 0.1 gram force to as large as 20 or more gram force. In some embodiments, a force target of 0.5 grams may be appropriate. In others, 1 gram, 2 grams, 4 grams, 8 grams or more may be appropriate. In some embodiments, a module height MH (longitudinal dimension) of 50 ums or less may be targeted while in others, a module height of 500 ums or more may be targeted. In some embodiments, overall module radial diameter or width MW may be 100 ums or less or 400 ums or more (e.g., 150 ums, 200 ums, or 250 ums). The spring beam element, or beam elements, of a module may have spring heights SH from 1 um, or less, to 100 um, or more (e.g., 10, 20, 30, or 40 um), and beam widths or spring widths SW from 1 um or less to 100 μm or more (e.g., 10, 20, 30, or 40 um). Tips may have uniform or changing geometries (e.g., with cylindrical, rectangular, conical, multi-prong, or other configurations, or combinations of configurations). Tips, where joining to spring beams, will generally possess larger cross-sectional widths TW than the widths SW of the beam or beams to which they connect.

FIG. 3 depicts an isometric view of a second example spring module 300 that is similar to the module of FIG. 2 with the exception that the two spring elements are thicker and, as such, provide a greater spring constant than that of the elements of FIG. 2. From another perspective, the example of FIG. 3 will require more force for a given deflection and, as such, will reach a yield strength (e.g., reach an elastic deflection limit) of the combined material and structural geometry with less deflection than the example of FIG. 2.

In other embodiments, spring modules may take different forms than those shown in FIG. 2 or FIG. 3. For example: (1) a module may have a single spring element or more than two spring elements; (2) each of the spring elements may have variations in one or more of widths, thicknesses, lengths, or extent of rotations; (3) spring elements may change over the lengths of the elements; (4) spring elements may have configurations other than Euler spirals, e.g. rectangular spirals, rectangular spirals with rounded corners, S-shaped structures, or C-shaped structures; (5) individual spring elements may connect to more than a single bridge junction, e.g. to bridge connection points located at 180 degrees around the module, 120 degrees or 90 degrees; (6) bridge junctions may be located on distinct bridges; (7) base elements may have smaller radial extents than spring/bridge junctions such that bases of higher modules may extend below upper extents of lower adjacent modules upon sufficient compression of module tips when modules are stacked; (8) module bases may be replaced with additional springs that allow compression of module springs from both directions upon deflection, (9) probe tips may not be laterally centered relative to the overall lateral configuration of the module (i.e. not coincident or even co-linear with the primary axis of compression or the primary build axis when formed on a layer-by-layer basis).

Figure 4:
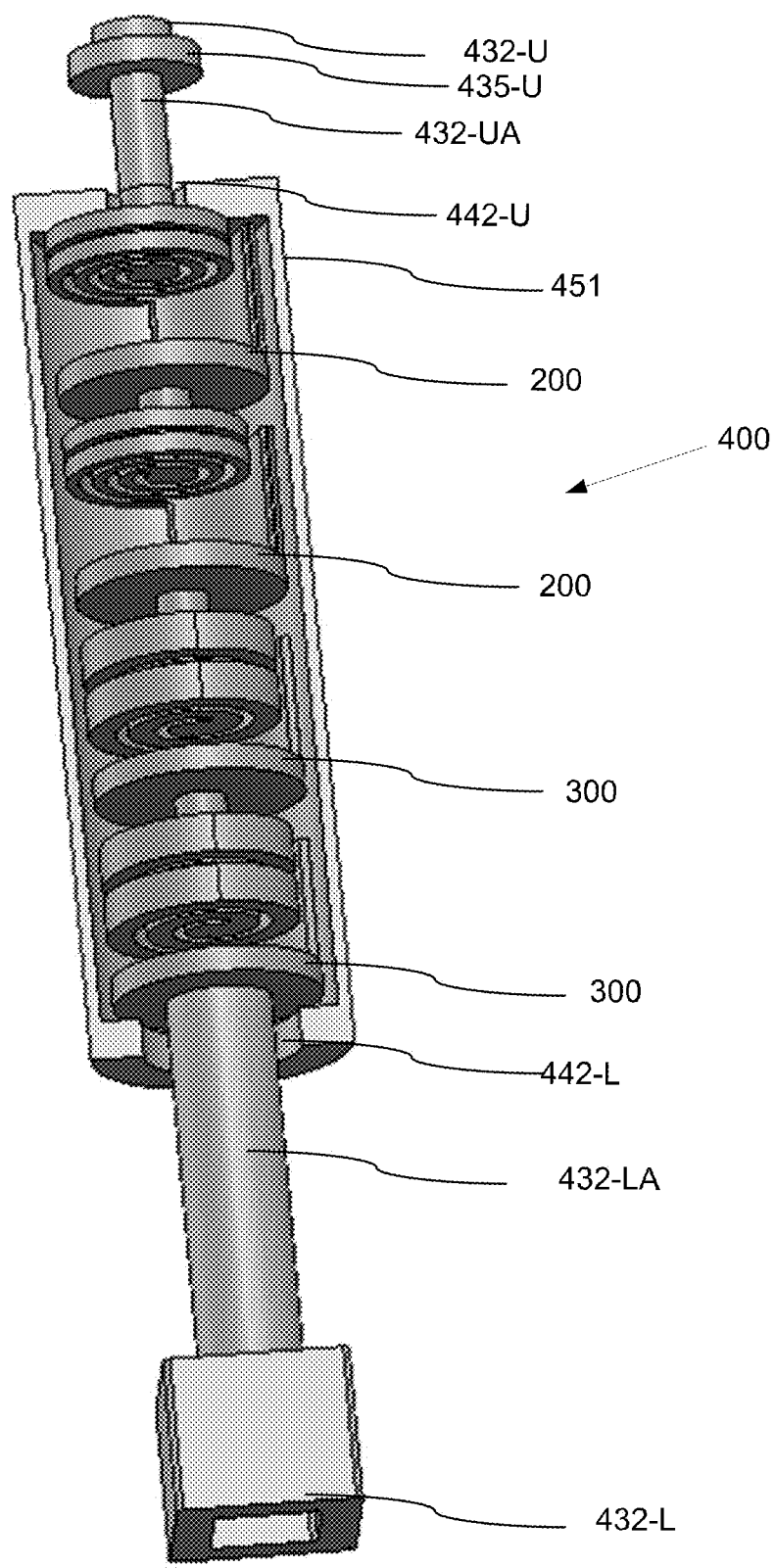
FIG. 4 depicts a partially cut view of a probe including: (a) a plurality of spring modules, some of which are of the FIG. 2 configuration while others are of the FIG. 3 configuration, (b) a first tip, (c) a first tip support arm, (d) a first tip compression stop, (e) a second tip, (f) a second tip support arm, and (g) a sheath (shown in a cut view) that holds the spring modules in a substantially linear configuration with respect to one another as well limiting the longitudinal extension of the tips.

FIG. 4 depicts a partially cut view of a probe 400 including: (a) a plurality of spring modules 200 and 300 similar to those of FIGS. 2 and 3, (b) a first or upper multi-module tip 432-U, (c) a first or upper tip support or extension arm 432-UA that may or may not be attached or bonded to a tip of the module that it directly interacts with, (c) a first or upper tip over-compression stop 435-U, (d) a second or lower tip 432-L, (e) a second tip or lower support or extension arm 432-LA that may or may not be attached or bonded to a tip of the module that it directly interacts with, and (f) a sheath 451 (shown in a cut view that holds the spring modules in a substantially linear configuration with respect to one another as well as limiting the longitudinal extension of the tips) where the sheath has openings 442-U and 442-L for passing tip support arms 432-UA and 432-LA, respectively. Tip 432-L has a rectangular configuration that may be useful for contacting a solder bump or other protruding contact surface. In the probe design of FIG. 4, each module, if sufficient compression occurs, reaches a compression limit upon one of two events: (1) when the central portion of the lower spring element of a module comes into contact with the upper surface of the module base, or (2) when the lower surface of an immediately adjacent upper module base contacts the upper surface of the lower module bridge. The probe as a whole may reach a compression limit when both an upper tip support arm and a lower tip support arm reach compression limits which may occur before any modules reach compression limits or after only a portion of the modules reach their own compression limits. Probes may have diameters of an appropriate size for the array pitch desired. For example, effective probe diameters may be as small as 100 microns, or smaller, or as large as 600 microns, or larger. In some embodiments, for example, probes may have effective diameters in the range of 250-350 microns for use in an array having a 400 micron pitch or they may have effective diameters in the range of 150 to 250 microns for use in an array of 300 microns. Probe heights may be set to provide effective longitudinal travel so that overtravel requirements for individual modules, probes, or arrays as a whole can be accommodated when engaging semiconductor wafers or other electronic components. For example, overtravel may be in the range of 25 microns, or less, to 400 microns, or more, and probe heights may be in the range of 150 microns, or less, to 2000 microns, or more.

Numerous variations of the embodiment of the probe of FIG. 4 are possible and include for example: (1) module tips being joined to adjacent module bases or module tips may simply be contacted to adjacent module bases; (2) more than four or less than four modules may be used in forming a given probe; (3) some or all modules in a given probe may have similar spring constants and/or configurations or different spring constants and/or configurations; (4) tip arms may have compression stops located on them that are spaced from contact tips; (5) probes may have a contact tip on each end or may have a contact tip on one end and a bondable tip or attachment structure on the other end; (6) probes may have one or more fixed end caps that inhibit modules from sliding out of one or both ends of the sheath, or may have no fixed end caps; (7) probes may have sheath ends that allow module loading to occur and thus allow biasing of springs within the module without maintaining compressive pressure on probe end tips or that may allow modules to be formed in build locations that are different from working range locations within a sheath; (8) modules or tip arms may have sliding contacts or other contacts that allow current to be shunted away from the spring elements and instead to flow through the sheaths; (9) modules may be formed with some dielectric elements; (10) modules and/or sheaths may include dielectric elements or be separated by dielectric elements such that electrical isolation of the modules/tip arms from the sheaths occurs, e.g. to provide dual electrically isolated conductive current paths or to ensure that central conductive paths of one probe of an array are not inadvertently shorted to a conductive path on another adjacent probe; (11) sheaths may be formed in two or more parts that allow formation or assembly of modules and other components into sheaths to form probes; (12) a plurality of modules may be formed in an attached manner to one another to provide a monolithic compliant structure (with or without tip arms and tips) that may be formed fully within a sheath, partially within a sheath for which loading will be completed subsequent to formation, or separate from a sheath for later assembly into a sheath; (13) split sheaths may be formed with snap together features that provide for easy assembly after formation; and (14) holes or openings may be made at selected locations of the modules or the sheaths to provide improved access of a sacrificial material etchant to interior portions which might be useful when the probe or modules are formed using a multi-material, multi-layer electrochemical fabrication process that involves a sacrificial material that must be removed.

FIG. 5A to FIG. 10 provide side views of spring modules or compliant modules similar to those of FIGS. 2 and 3 with different compliant element rotational extents, with different rotational orientations between the pairs of compliant elements, with different base configurations for engaging array structures, and/or with different numbers of contact elements. In other embodiments, different configurations and combinations of features are possible.

Figure 5A:
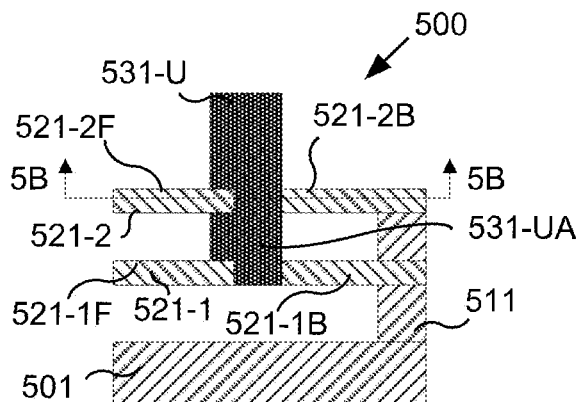
FIG. 5A to FIG. 10 provide side views of spring modules or compliant modules similar to those of FIGS. 2 and 3 or cut views through planar spring elements of such modules with different compliant element rotational extents, with different rotational orientations between the pairs of compliant elements, with different base configurations for engaging array structures, with different numbers of contact elements, and/or with different planar spring geometries.
Figure 5B:
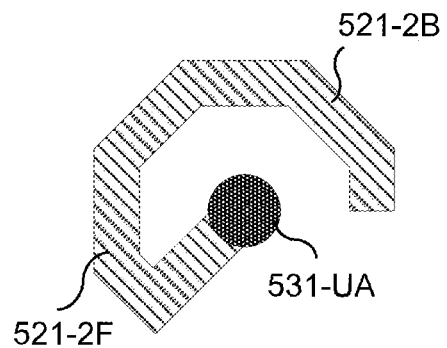

FIGS. 5A and 5B show spring module 500 from a side view and a cut view, respectively, where a number of the successively connected, coupled, or joined elements can be seen including a base 501, a standoff, bridge, or support 511, a pair of planar spring elements 521-1 and 521-2 (e.g. in the form of spirals), a tip arm 531-UA, and a tip 531-U. As used herein, with regard to this embodiment or with regard to the other embodiments, the tip and the arm may be distinguished from one another or be simply referred to as the tip when not explicitly required to be distinguished. As shown in FIG. 5B, the spring elements of this module have a polygonal shape and more specifically an octagonal shape. FIG. 5A shows two spring elements with one being more interior 521-1 and being more exterior 521-2, each having a backside spring feature on a right portion 521-1B and 521-2B, respectively, and a left front side spring feature on a left portion 521-1F and 521-2F, respectively. The right backside spring features start at the standoff, bridge, or support, 511 and wrap around the back of the central moveable tip element 531-U and tip arm 531-UA and then continue to become the left front side features which in turn join the tip element 531-U via the tip arm 531-UA on the front left side of the probe. In this example, the springs have an octagonal form with rotational extents between 180 degrees and 270 degrees. In alternative embodiments, the various elements of the module may take on different dimensional configurations and be formed from the same or different materials, the various elements may be included in different multiple or singular quantities, and the spring may take different forms. In some alternatives, multiple functionalities may be included in a single element such as an annular base configured to function as a stabilizing base or mounting structure and as a standoff for supporting a longitudinal separation of planar spring elements. For example: (1) the bridge element may be formed from multiple separated bridge elements, (2) the spring elements may be provided in the form of three or more planar, two-dimensional springs (when the thickness of the spring is small compared to the cross-sectional area of the spring) or as a single spring or be formed of multiple springs that are joined to one another at intermediate locations, (3) the spring elements may alternatively, or additionally, have different rotational extents, and be formed to have different curved, polygonal, straight, angular, or spiral configurations, (4) the base 501 may have a configuration for accepting and laterally retaining (e.g. by surrounding or extending into) a tip of a lower module, or have an opening for allowing protrusion of a tip partially or completely therethrough where the tip could be part of a preceding module or be part of the present module that extends from the bottom of the spring element or elements or be attached to and extend downward from the bottom of the base itself, and/or (5) tips may take on different configurations.

Figure 6A:
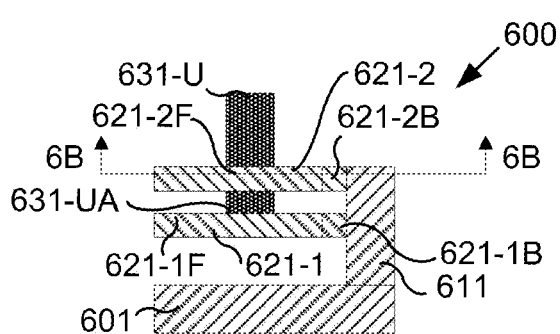
Figure 6B:
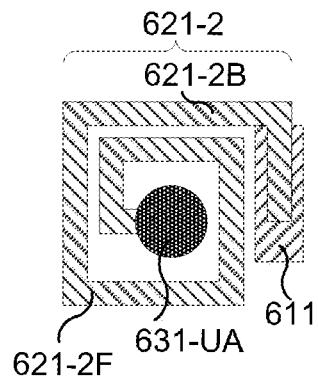

FIGS. 6A and 6B show spring module 600 from a side view and a cut view respectively where a number of the successively connected, coupled, or joined elements can be seen including a base 601, a standoff or support 611, a pair of planar spring elements 621-1 and 621-2, a tip arm 631-UA, and a tip 631-U. As used herein, the tip and the arm may be distinguished from one another or simply referred to as the tip when not explicitly required to be distinguished. As shown in FIG. 6B, the spring elements of this module have a polygonal shape and more specifically an inward extending rectangular spiral shape. FIG. 6A shows the two spring elements 621-1 and 621-2 (e.g. in the form of spirals) starting at the standoff and wrapping around the back of the central contact element as portions 621-1B and 621-2B and then extending around the front of the contact element as portions 621-1F and 621-2F with the joining location of spring elements and the tip arm element 631-UA hidden from view such that the rotational extents of the spiral are something greater than 360 degrees. The full bridge 611 to tip arm 631-UA spiral of the top spring element 621-2 can be seen in FIG. 6B along with portions of the standoff or support material 611 surrounding the initial portion of the spring element along with the tip arm 631-UA on the opposite end of the spiral. Variations of the module of FIGS. 6A and 6B are possible and include, mutatis mutandis, the features and variations noted in the previous and subsequent module and probe embodiments.

Figure 7A:
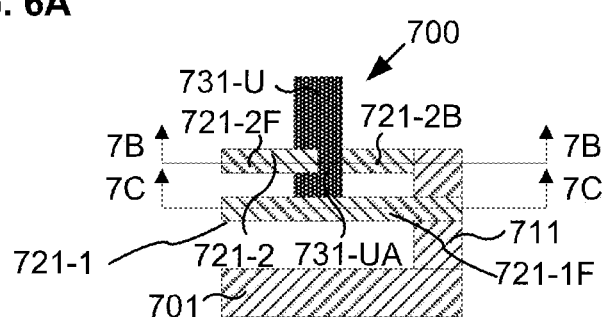
Figure 7B:
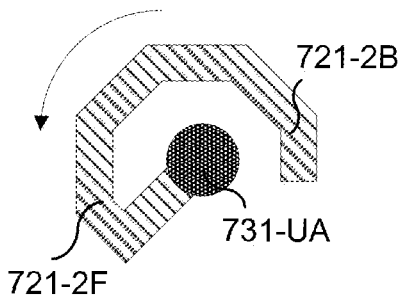
Figure 7C:
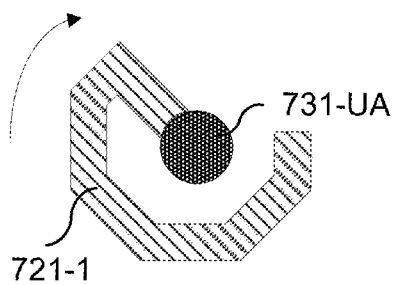

FIGS. 7A, 7B, and 7C show an alternative spring module 700 from a side view and at two different cut levels where a number of the successively connected, coupled, or joined elements can be seen including a base 701, a standoff or support 711, a pair of planar spring elements 721-1 and 721-2 having opposite orientations, a tip arm 731-UA, and a tip 731-U. As used herein, the tip and the arm may be distinguished from one another or simply referred to as the tip when not explicitly required to be distinguished. FIG. 7A shows the two spring elements 721-1 and 721-2 wrapping around the tip arm 731-UA in different directions with the upper compliant element (i.e., the spring element) 721-2 showing a back feature 721-2B on the right side of FIG. 7A and a front feature 721-2F on the left side of FIG. 7A and having a rotational extent between 180 degrees and 360 degrees and with the lower compliant element 721-1 showing only a front or forward feature 721-1F since the backside features are hidden behind the front side features wherein its rotational extent is hidden from view (in FIG. 7A) such that the extent is greater than 180 degrees. When viewing from the top, the upper compliant element 721-2 has an inward spiral rotation in the counterclockwise direction while the lower compliant element 721-1 has a reversed rotation as shown in FIGS. 7B and 7C. Variations of the module of FIGS. 7A-7C are possible and include, mutatis mutandis, the features and variations noted in the previous and subsequent module embodiments.

Figure 8:
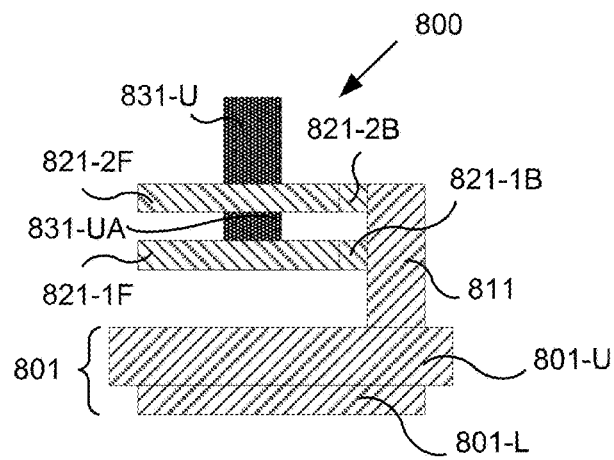

FIG. 8 shows a compliant module 800 similar to that of FIG. 6 with the exception of there being a modification to the base of the module which provides a configuration that allows the module to sit on and engage a recess or opening in, or through, an array structure (e.g. an array plate—not shown) wherein the module could be loaded in such a recess or opening from the top of the array structure such that the central/lower portion 801-L of the base 801 may slide into the recess to provide horizontal or lateral centering of the module within a slightly larger opening in the array plate while the outer edges of the upper portion 801-U of the base 801 provide a lip that can sit on the array plate surface to provide vertical or longitudinal positioning. The other reference numbers in FIG. 8 refer to similar features as did the corresponding numbers in FIG. 6 with the exception that the numbers are incremented from the 600 series to the 800 series. Numerous variations of this embodiment are possible and include, for example: (1) the module being configured to engage other position or retention structures such as probe sheaths, (2) the module base and the array opening having keyed features so that loading of the module into an opening in an engagement structure can only be completed when the rotational orientation (e.g. about the longitudinal axis of the module) is aligned with a complementary feature associated with the recess or opening in the engagement structure, (3) the base or the array structure may be provided with tabs, spring arms, spring arms with retention hooks or other locking features, or the like, that provide for one or both of enhanced lateral alignment or centering during engagement and/or improved retention of the module and an engagement structure.

Figure 9:
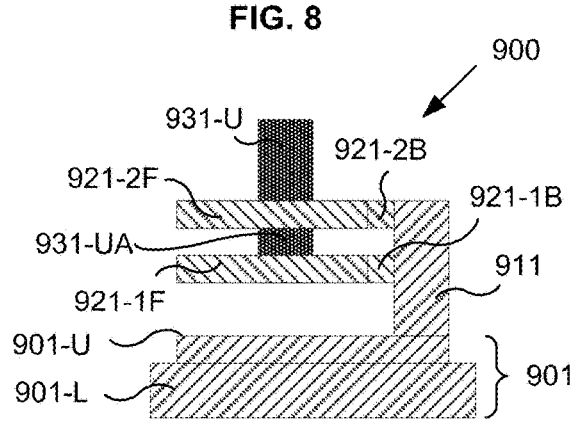

FIG. 9 shows a compliant module 900 similar to that of FIG. 8 with the exception of the module having a base 901 configured to abut and engage an array structure from below the array structure such that the module can be inserted into an opening in the array structure from below (while the module is in a tip-up orientation). An upper portion 901-U of the base 901 may slide into the opening to provide horizontal or lateral centering of the module within a slightly larger opening in the array plate while the outer edges of the lower portion 901-L of the base 901 provide a lip that can sit on the lower surface of the array plate to provide vertical or longitudinal positioning. Variations of the embodiment of the module of FIG. 9 are possible and include those noted for the embodiment of FIG. 8. The other reference numbers in FIG. 9 refer to similar features as did the corresponding numbers in FIGS. 6 and 8 with the exception that the numbers are incremented from the 600 and 800 series, respectively, to the 900 series.

Figure 10:
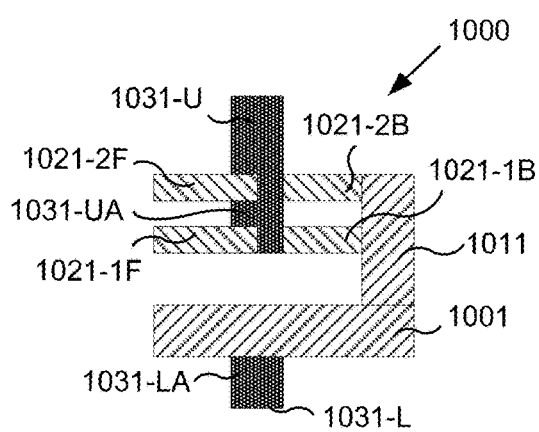

FIG. 10 shows a spring module 1000 similar to that of FIG. 5 with the exception that the module includes a lower contact element or tip 1031-L and associated arm 1031-LA extending from the central portion of the base 1001 of the module such that the module is provided with two contact tips. The other reference numbers in FIG. 10 refer to similar features as did the corresponding numbers in FIG. 5 with the exception that the numbers are incremented from the 500 series to the 1000 series.

Figure 11:
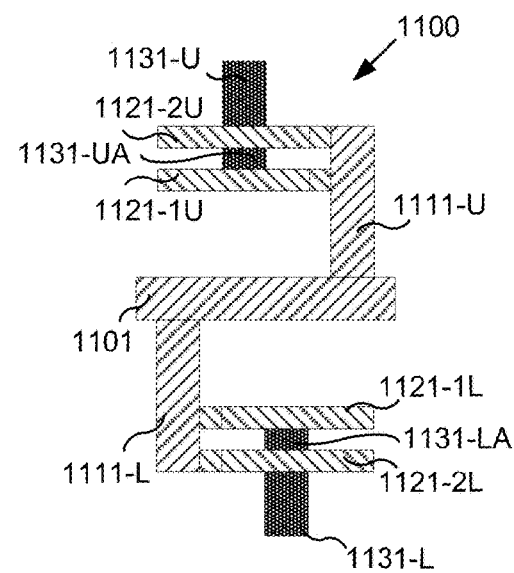
FIGS. 11-13 provide pairs of modules that share a common base with one of the modules oriented upward and the other oriented downward such that two oppositely oriented contact tips are provided along with two independently operable pairs of compliant elements wherein the example spring modules are similar to that of FIG. 6 and wherein different base structures are provided that allow for insertion into openings in an array structure from one or both directions and with or without guide features or features that provide for known lateral or longitudinal positioning.
Figure 12:
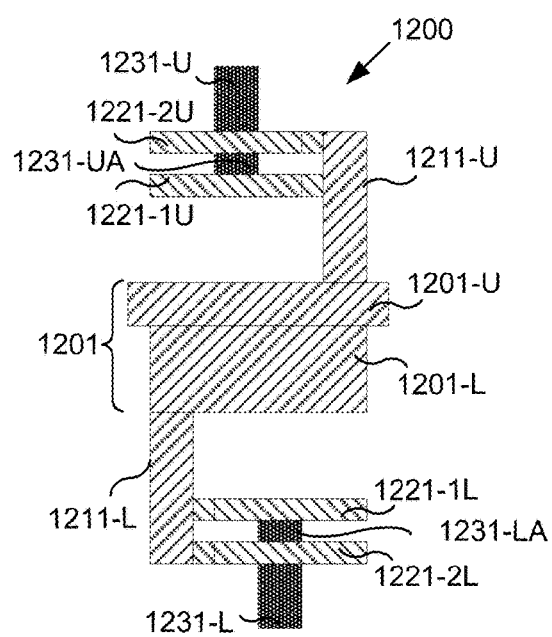
Figure 13:
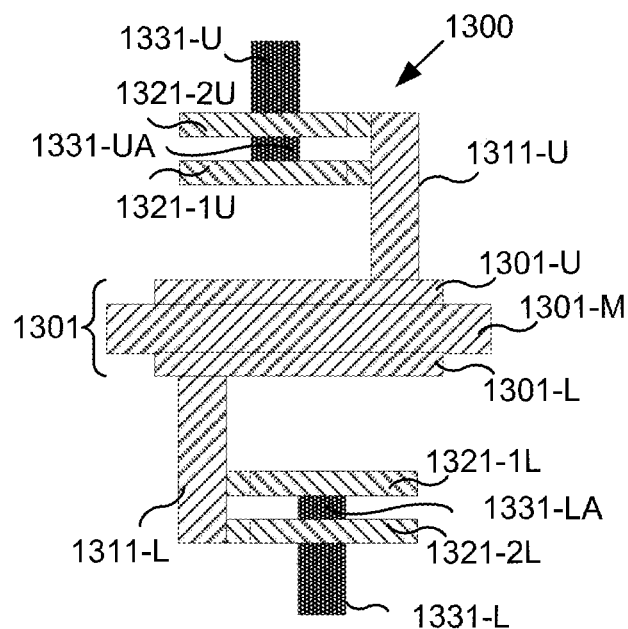

FIGS. 11-13 provide pairs of modules that share a common base with one of the modules oriented upward and the other oriented downward such that two oppositely oriented contact tips are provided which are connected to independent compliant elements with each independent compliant element including two planar spring elements with the two spring elements having the same rotational orientation but with the spring elements of the separate compliant element having reversed orientations wherein the example spring modules are similar to that of FIG. 6 wherein different base structures are provided that allow for insertion into openings in an array structure from one or both directions and with or without guide features or features that provide for known lateral or longitudinal positioning.

FIG. 11 provides for a probe 1100 formed from a pair of joined and oppositely oriented modules having a common substrate or base 1101, separate upper and lower standoffs 1111-U and 1111-L supporting separate upper and lower pairs of planar springs 1121-2U and 1121-1U, and 1121-1L and 1121-2L (respectively—e.g. in the forms of spirals), which in turn are connected to associated tips 1131-U and 1131-L via respective tip arms 1131-UA and 1131-LA. Such probes may be inserted into openings in an array structure where the base may sit on a surface of the array structure, the base may float within an opening in the array structure, or the base may enter an opening in the array structure and rest on a lip within the opening of the array structure. In such uses, insertion may occur from above or below the array structure. In other uses, insertion may sandwich the bases of the probes between upper and lower array structures plates. In still other embodiments, the modules may be formed with or assembled with dielectric or conductive shield or skeleton structures which could form part of the probes. In still further embodiments, bonding materials such as solder may be added to selected locations on the modules or on any shield or skeleton structures to aid in mounting the module or probe to an array structure or bonding one of the tips to an electronic circuit element.

FIG. 12 provides a similar module or probe 1200 configuration to that shown in FIG. 11 with the exception that the base 1201 has a bottom 1201-L having a smaller diameter that the top 1201-U of the base. Other reference numbers in FIG. 12 remain the same as noted for FIG. 11 with the exception that their series numbers have been incremented from 1100 to 1200. All the loading possibilities noted for the FIG. 11 example apply, but preferentially the probe may be loaded into an array structure from above, with the probe in an up-facing configuration as shown, particularly when the array structure has an opening larger than the bottom of the base but smaller than the top of the base such that the bottom of the base and the walls of the opening provide for some degree of lateral alignment when inserted (i.e. alignment perpendicular to the longitudinal axis of the probe or perpendicular to the primary compressional axis of the probe) while the top of the base provides for longitudinal alignment (i.e. known stopping location, or alignment, along the length of the probe from tip-to-tip). In the present embodiment, as in the other illustrated embodiments, it is assumed the base has a circular configuration so that any rotational alignment upon insertion is possible, but in other embodiments (particularly if the module or probe tips are not centered), other configurations may be provided for the base and for the openings in an array structure such that rotational orientation of the probe and the array structure are ensured (e.g. (1) a square configuration could limit full insertion to four possible orientations, (2) an equilateral triangular configuration may limit full insertion to three orientations, (3) a rectangular or oval configuration may limit full insertion to two orientations, or (4) a non-equilateral triangular configuration may limit full insertion to a single orientation. Tabbed, notched, or other configurations may also be used to limit full insertion to a single orientation.

The probe 1300 of FIG. 13 is similar to that of FIG. 12 with the exception that the base is provided with three distinct longitudinal levels as opposed to two such levels and where common reference numbers in FIG. 13 remain the same as those noted for FIGS. 11 and 12 with the exception that their series numbers have been incremented from 1100 or 1200 to 1300. A smaller diameter base configuration is provided at the upper portion 1301-U and lower portion 1301-L of the base 1301 with a central or middle portion 1301-M having a larger diameter such that insertion of modules or probes can occur from above or below an array structure while still providing full engagement while avoiding the disadvantage that could occur if right-side-up or upside-down probe loading inadvertently occurred. In some usage embodiments, a plurality of probes may be sandwiched between a lower and upper array structure where both structures may benefit from both of the upper and lower longitudinal and lateral alignment features of the probe base. In still other embodiments, precautions or configurational changes may limit the ability for inverted loading of modules.

Figure 14:
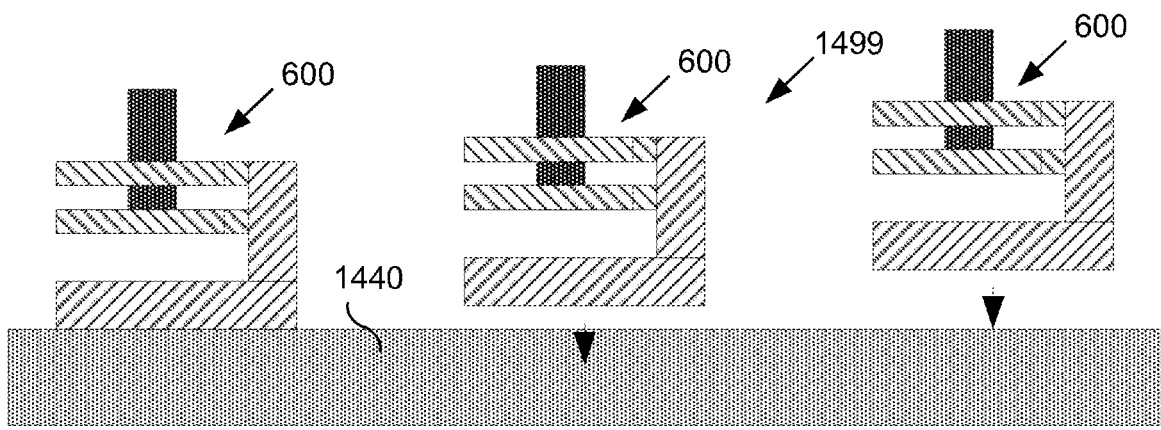
FIG. 14 illustrates a side view of three probes at different stages of mounting to an array plate where the array plate may be a dielectric, a conductor, a dielectric with conductive traces or conductive vias, or a conductive plate with dielectric regions that provide electrical isolation of selected probes.

FIG. 14 provides a side view of a partially formed array 1499 with three probes 600 of FIG. 6, at different stages of mounting to an array plate 1440 where the array plate may be a dielectric, a conductor, a dielectric with conductive traces or conductive vias (e.g. a space transformer), or a conductive plate with dielectric regions that provide electrical isolation or selected connection to individual or groups of probes. The probes may be mounted to the plate using an adhesive, solder, solder with regions of solder masking material, ultrasonic bonding, laser welding, brazing, or the like. Probes may be loaded onto the array plate one at a time or in groups. Modules may be formed with desired array spacings and temporarily or permanently held together by conductive tethers or dielectric tethers.

Figure 15:
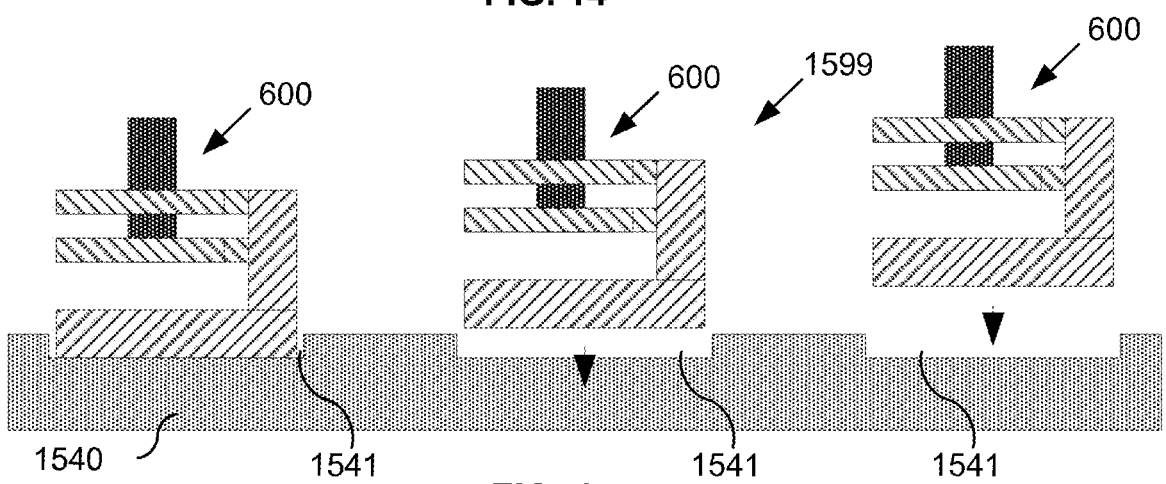
FIG. 15 is similar to that of FIG. 14 with the exception that the array structure is provided with recesses for receiving probe modules.

FIG. 15 is similar to that of FIG. 14 with the exception that the array 1599 includes an array structure 1540 that is provided with recesses 1541 for receiving probe modules 600. Such recesses may be useful in helping to ensure proper probe positioning and possibly rotational alignment if necessary. The recesses may be formed with vertical side walls, with sloped side walls, or a combination of the two to aid in insertion. In some embodiments, the bases of the probes may alternatively or additionally have sloped sidewalls to aid in insertion and alignment.

Figure 16:
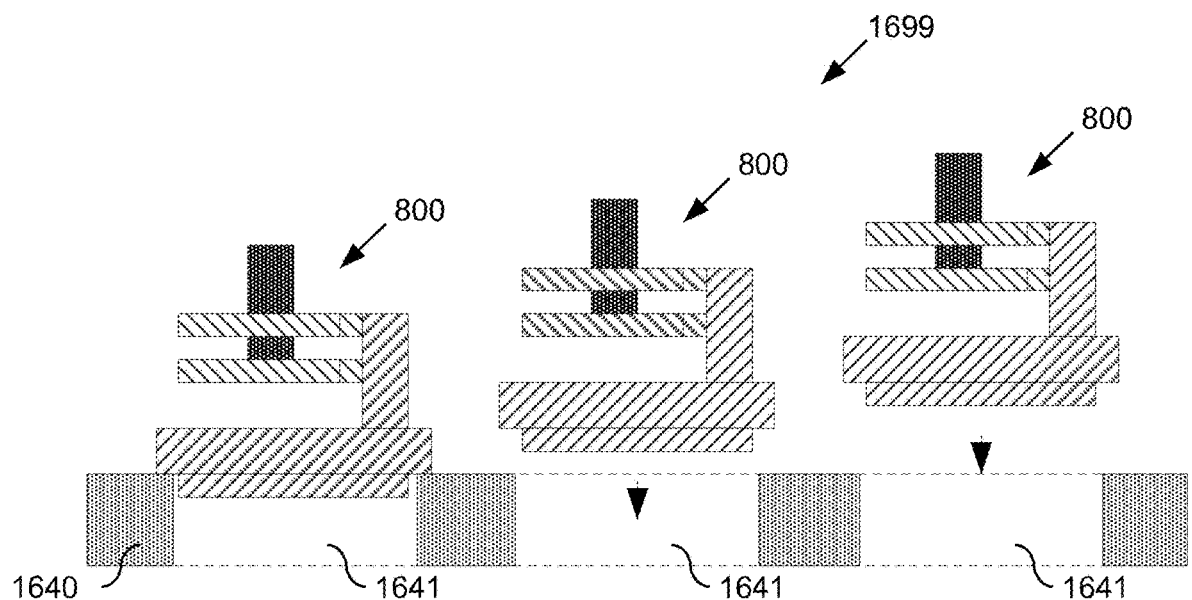
FIG. 16 provides a side view showing the loading of a plurality of probes like those of FIG. 8 into an array structure plate having through holes where three probes are shown at different stages of loading with the bottoms of their bases providing lateral alignment and the upper portion of their bases providing lower lips which rest against the upper surface of the array structure plate to provide vertical alignment.

FIG. 16 provides a side view of an array 1699 being formed with the loading of probes 800 of FIG. 8 into an array structure 1640 having through holes 1641 where three probes are shown at different stages of loading with the bottom of the base providing lateral alignment and the upper portion of the base providing a lower lip which rests against the upper surface of the array structure to provide longitudinal alignment or a longitudinal stop.

Figure 17:
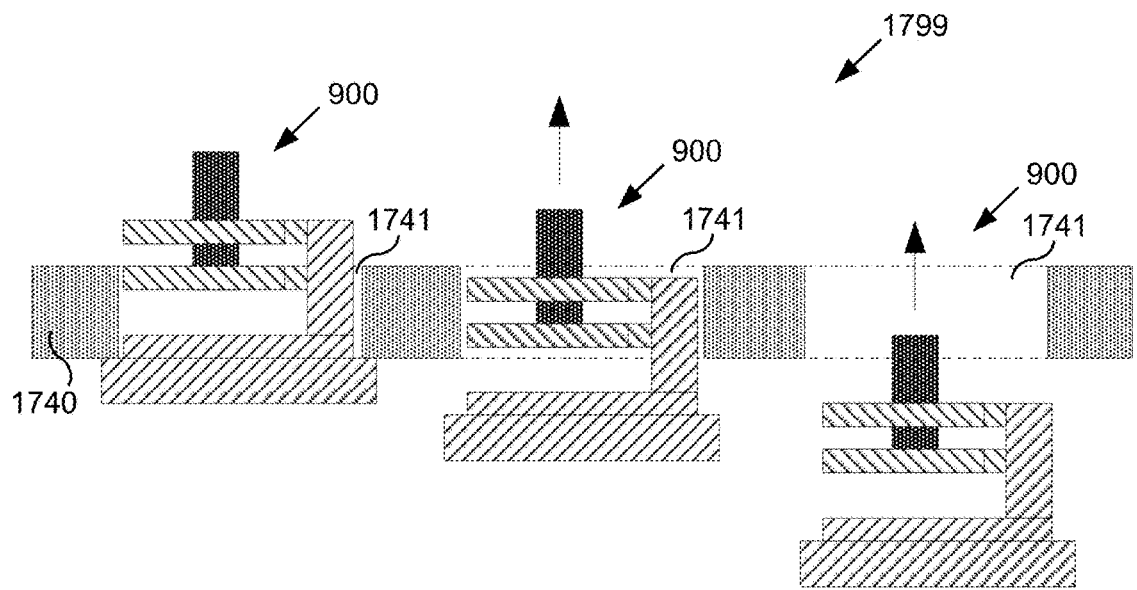
FIG. 17 provides a side view showing the loading of a plurality of probes like those of FIG. 9 into an array structure having through holes where three probes are shown at different stages of loading with the tops of their bases providing lateral alignment and the lower portions of their bases providing upper lips which rest against the lower surface of the array structure.

FIG. 17 provides a side view of an array 1799 being formed with the loading of probes 900 of FIG. 9 into an array structure 1740 having through holes 1741 into which three probes are shown at different stages of loading with the top of the base providing lateral alignment and the lower portion of the base providing an upper lip which rests against the lower surface of the array structure to provide longitudinal alignment or a longitudinal stop.

Figure 18A:
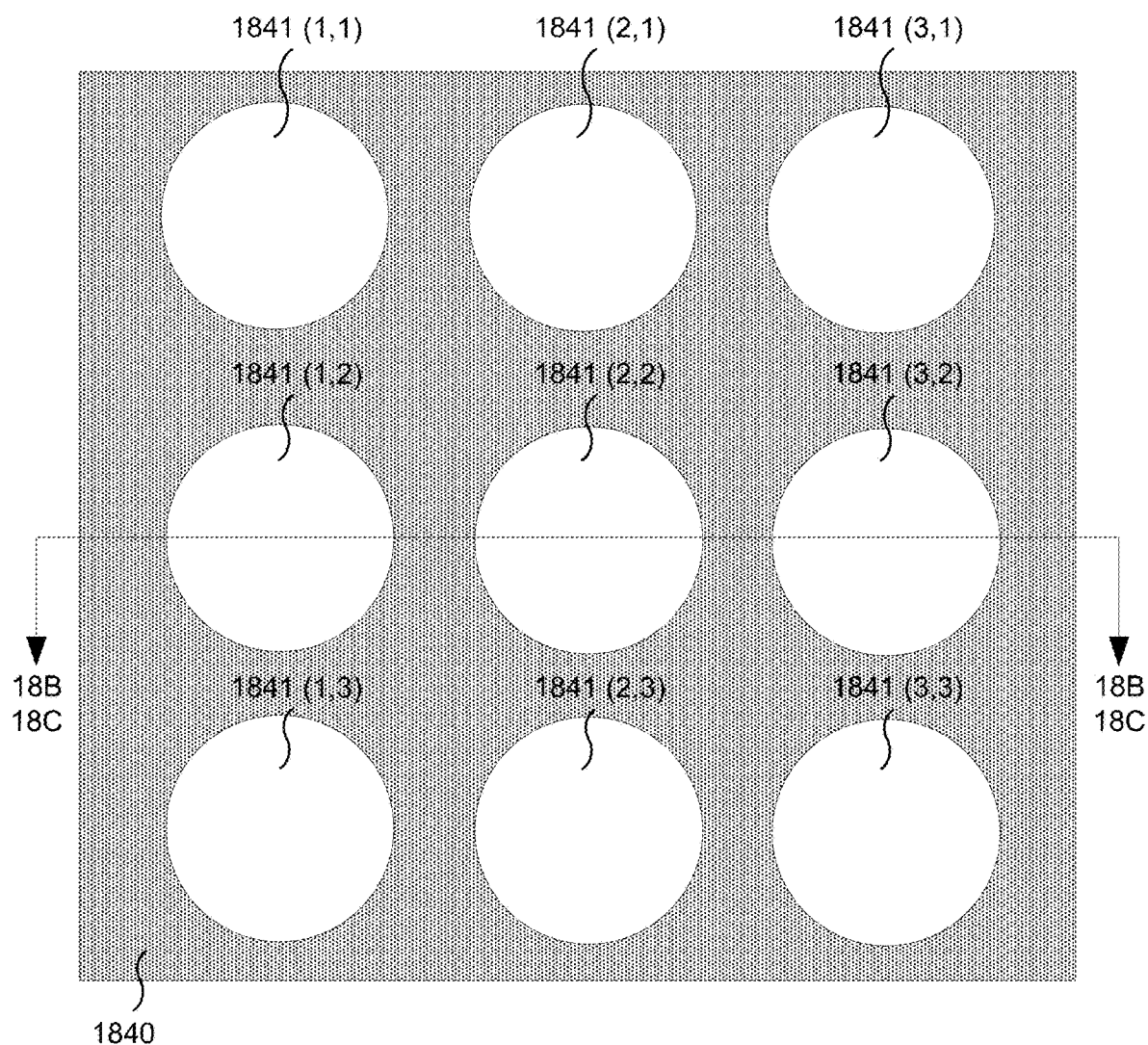
FIG. 18A provides a top view of the upper surface of an example three-by-three array structure plate with circular through holes.
Figure 18B:
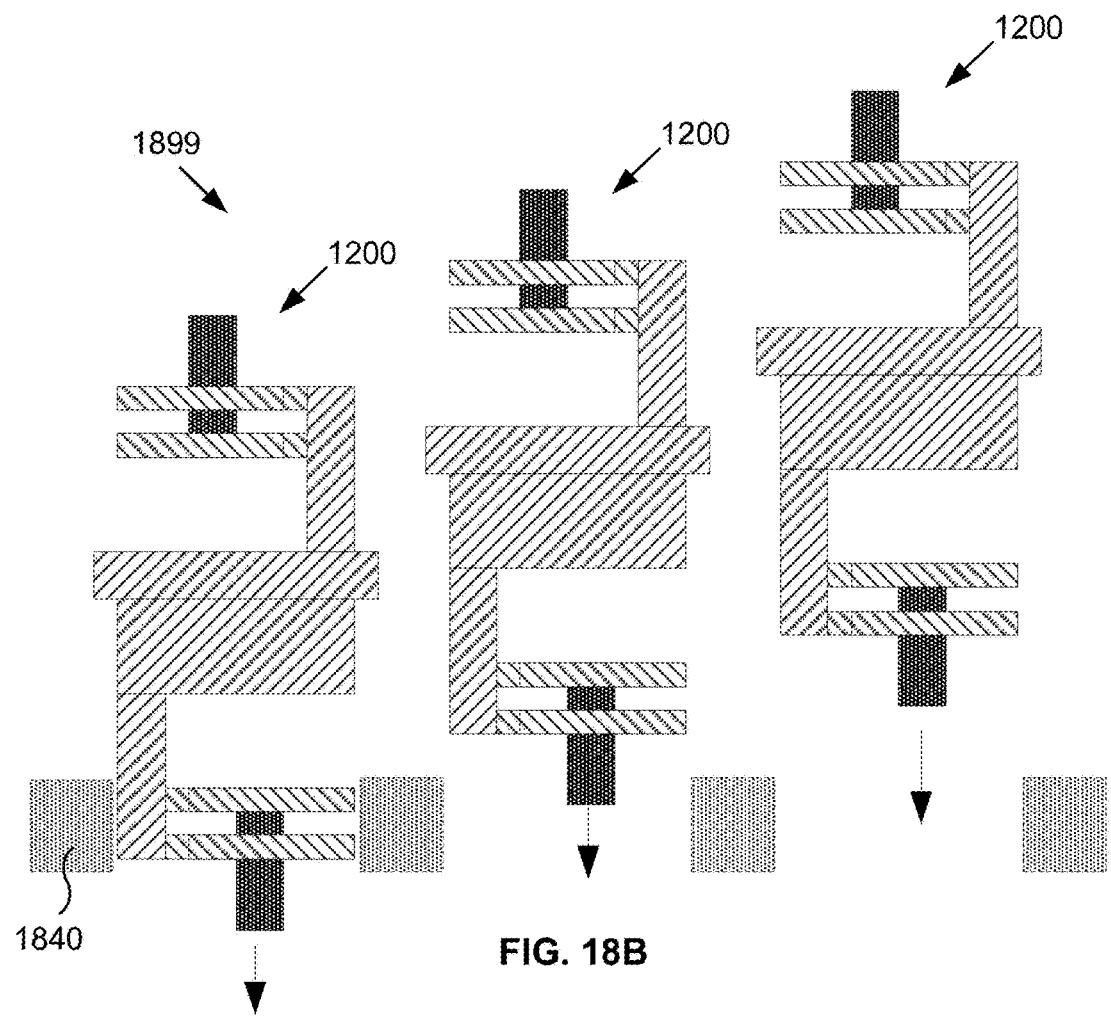
FIG. 18B provides a cut view of the array structure plate of FIG. 18A along line 18B/18C-18B/18C along with probes being loaded into the three openings at different stages of loading.
Figure 18C:
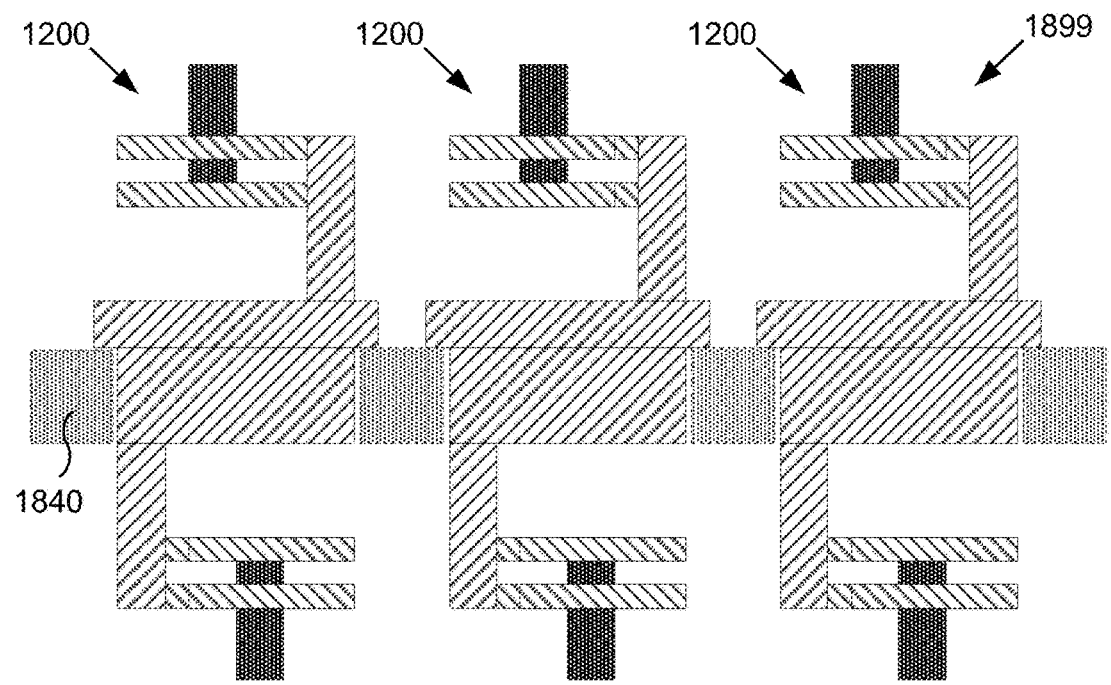
FIG. 18C shows a similar view to that of FIG. 18B with the three probes loaded into their respective openings and with the lower portion of the probe bases providing lateral alignment and the upper portion of the bases providing a lip which engages the upper surface of the array structure to provide longitudinal alignment.

FIG. 18A provides a view of the upper surface of an example three-by-three array structure 1840 with circular through holes 1841(1,1) to 1841(3,3) along with cut lines 18B-18B and 18C-18C that reflect cross-sectional positions or thin slices of the array plate and their viewing directions as shown in FIGS. 18B and 18C. In variations of this example, numbers of holes, diameters of holes, sizes of holes, hole shapes, hole positions, general array layout, and the like may be varied to match requirements for mating with a particular device or grid of devices to be tested (i.e. DUTS).

FIG. 18B provides a cut view of the array structure 1840 of FIG. 18A along cut line 18B-18B along with three probes 1200 (i.e., probes similar to those of FIG. 12) being loaded into the three openings at different stages of loading to provide a partially formed array 1899.

FIG. 18C shows a similar cut view of the array 1899 to that of FIG. 18B, along line 18C-18C, with the exception that the three probes 1200 have been loaded into their respective openings and with the lower portion of the probe bases providing lateral alignment and the upper portion of the bases providing a lip which engages the upper surface of the array structure 1840 to provide longitudinal alignment.

Figure 18D:
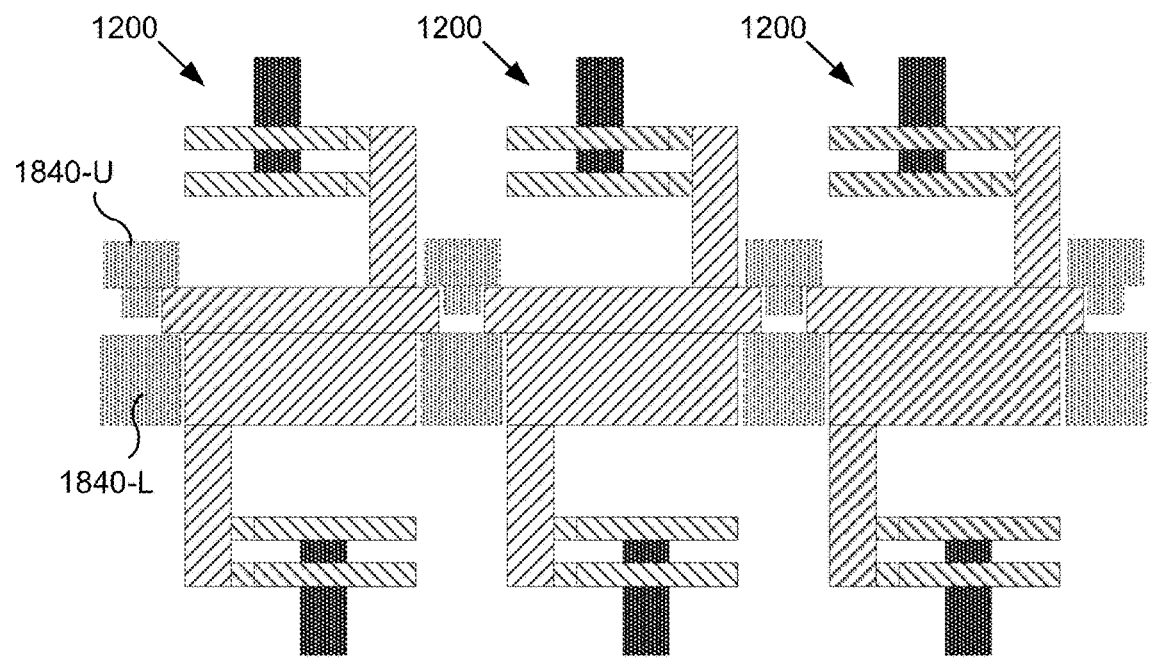
FIG. 18D illustrates an assembled array configuration similar to that of FIG. 18C with the exception that the array includes not only a lower array structure but also an upper array structure such that the probes are clamped between the structures from below and above.

FIG. 18D illustrates an assembled array configuration similar to that of FIG. 18C with the exception that the array includes not only a lower array structure 1840-L but an upper array structure 1840-U such that the probes 1200 are clamped between the structures from below and above.

Figure 18E:
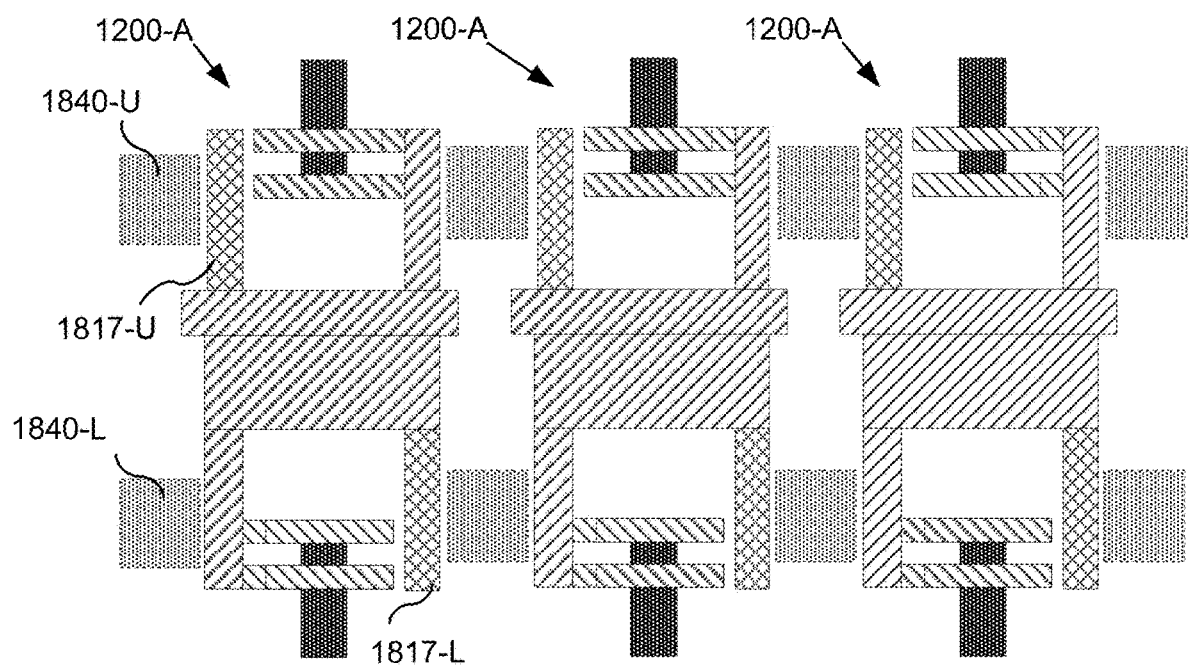
FIG. 18E illustrates an assembled array configuration that uses two array structures to hold probes with one of the array structures (e.g. a guide plate) engaging the probes near their lower ends while the other array structure (e.g. a guide plate) engages the probes near their upper ends wherein the probes include additional framing elements that effectively provide a frame or sheath structure through which the compliant element can deform during compression of the tips toward one another.

FIG. 18E illustrates an assembled array configuration that uses two array structures to hold probes 1200-A with one of the array structures (e.g. a guide plate) 1840-L engaging the probes near their lower ends while the other array structure (e.g. a guide plate) 1840-U engages the probes near their upper ends wherein the probes are a modified version of the probes 1200 of FIG. 12 wherein the modification includes the addition of probe structures 1817-L and 1817-U which are framing elements that effectively provide a frame or sheath structure through which the compliant element can deform during compression of the tips toward one another.

FIGS. 18F1 and 18F2 illustrate a group of three probes that are ready for assembly with an array structure (FIG. 18F1) and after such assembly has occurred (FIG. 18F2) wherein the probes 1200 are similar to that of FIG. 12 and where the array structure 1840-L includes retention or alignment spring structures 1840-S that compress upon insertion of lower portion 1801-L of the probe base 1801 into the openings in the array structure 1840-L yielding compressed spring retention structures 1840-CS to help hold the probes in position in their appropriate array locations. In alternative embodiments, spring-type retention or alignment structures may be formed as part of probes instead of part of an array structure. In still other embodiments, spring elements may be formed at multiple locations laterally around the probes or along the longitudinal length of the probes.

Modules and probes may be formed using only multi-layer, multi-material electrochemical methods as disclosed herein, partially using multi-layer, multi-material electrochemical methods as disclosed herein or using some other method that does not involve electrochemical fabrication methods. When formed using electrochemical methods, probes may be built up by deposition of material such that upon completion of deposition and separation of any sacrificial material, a resulting configuration occurs: (1) a fully assembled probe array is formed, (2) a partially assembled probe array is formed with all or a portion of the array elements formed as part of the same build up process or as part of a build substrate, e.g. with all elements positioned and aligned for final movement from build locations to working locations, or (3) individual components formed separately or together but unaligned which can thereafter undergo an automated or manual assembly into operational probes.

Figure 18G:
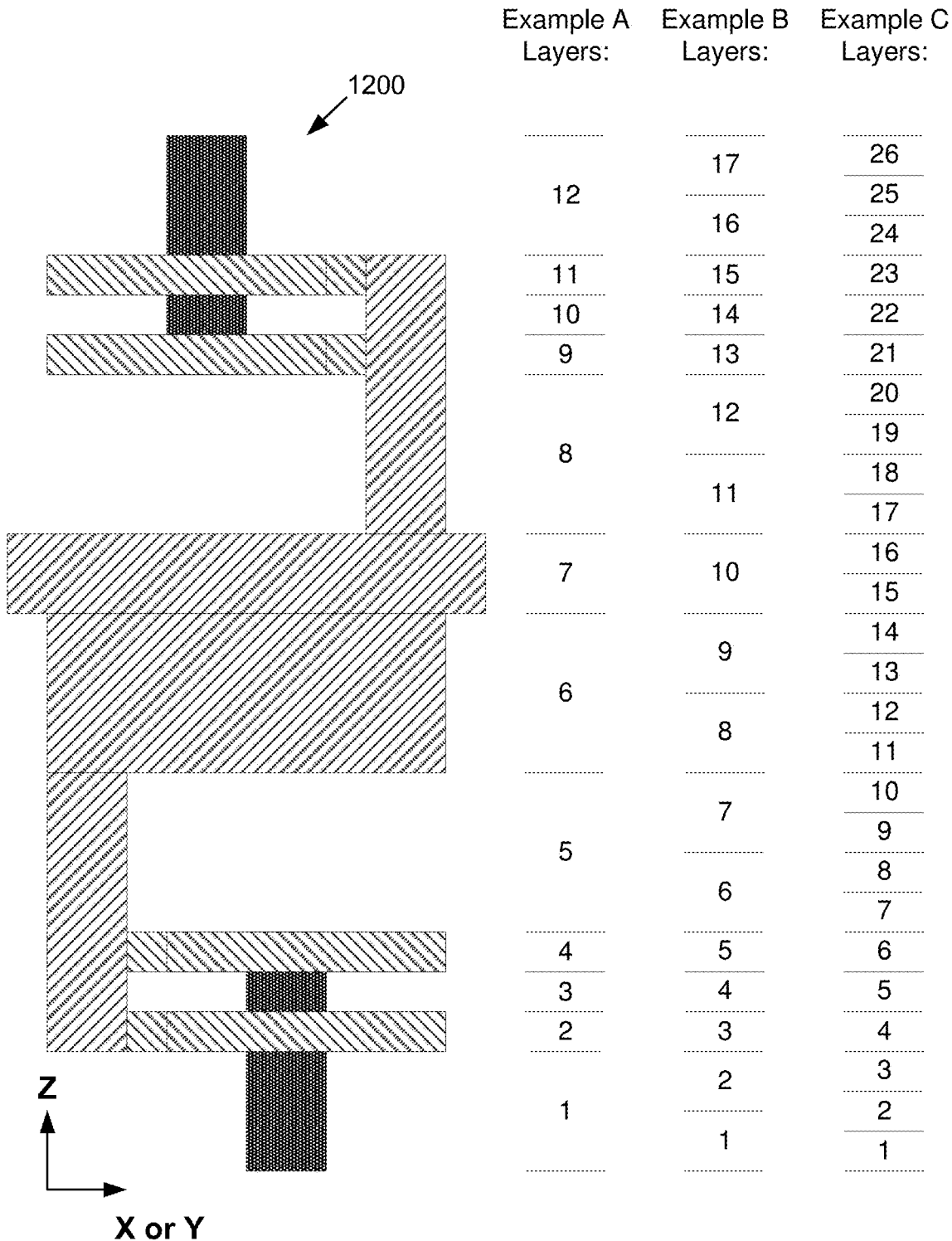
FIG. 18G provides a side cut view of a probe along with three example layer configurations (Examples A, B, and C) that may be used in forming the probe of FIG. 12.

FIG. 18G provides three example layer configurations (Examples A, B, and C) that may be used in forming the probe 1200 of FIG. 12. In Example A, the probe is formed from 12 layers with each formed with one or more structural materials, with the layers having different thickness, and with the layer levels dictated by longitudinal (z-direction) geometric changes that require different patterning for the successful formation of the probe structure. In Example B, the probe is formed with 17 layers with different build levels formed with multiple layers so that the layer thicknesses become more uniform. What were layers 1, 5, 6, 8, and 12 of Example A respectively become layers 1 & 2, 6 & 7, 8 & 9, 11 & 12, and 16 & 17 of Example B. In Example C, the probe is formed with 26 layers with each layer having the same thickness. For example, what were layers 1 & 2 of Example B are now formed as layers 1-3 and what were layers 6 & 7 of Example B are formed as layers 7-10 of Example C. In other embodiments, different layer numbers and configurations may be used.

Figure 19:
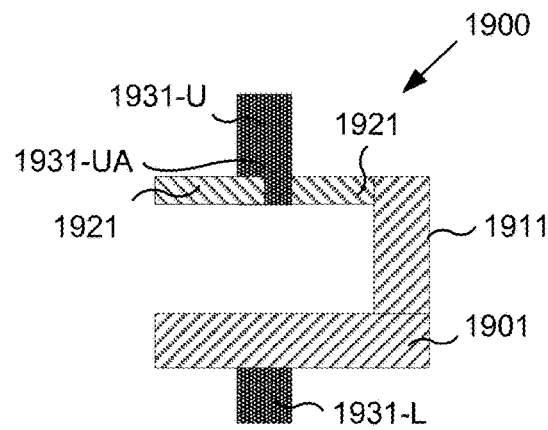
FIG. 19 provides a side view of a spring module similar to those of some of the previous embodiments, with the exception that the module includes not only a first upward facing tip attached to the compliant element but also a downward facing tip attached to a lower surface of the base of the module.

FIG. 19 provides a side view of a spring module 1900 similar to those of some of the previous embodiments (with like reference numbers representing similar features with the exception of updates to series numbers), with two primary exceptions: (1) the module has a single planar spring element 1921 (e.g. in the form of a spiral) and (2) a downward facing tip 1931-L that extends from a lower surface of the base of the module to provide a contact surface.

Figure 20:
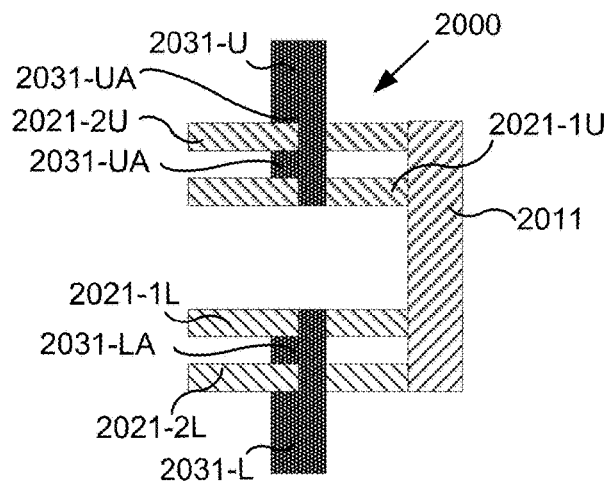
FIG. 20 provides a side view of a module according to another embodiment of the invention wherein the module does not include a base but instead has a lower set of compliant structures attached to the lower portion of the standoff and a downward facing tip attached to the central portion of the lower compliant elements.

FIG. 20 provides a side view of a module 2000 according to another embodiment of the invention wherein the module does not include a base but instead has a standoff 2011 that supports an upper compliant element having two longitudinally spaced planar spring elements 2021-1U and 2021-2U and a lower compliant element having two longitudinally spaced planar spring elements 2021-1L and 2021-2L that join to respective tip arms 2031-UA and 2031-LA which each in turn are coupled to respective tips 2031-U and 2031-L. In other alternative embodiments, other compliant element arrangements may be used to engage upper and lower tips, tips may or may not be centered, and tips may have different configurations to those shown. For example, tips may have (1) single points, (2) elongated structures, (3) open structures or multiple points (e.g., for stably engaging bumps), (4) structures with curved upper or lower surfaces, and (5) the like.

Figure 21A:
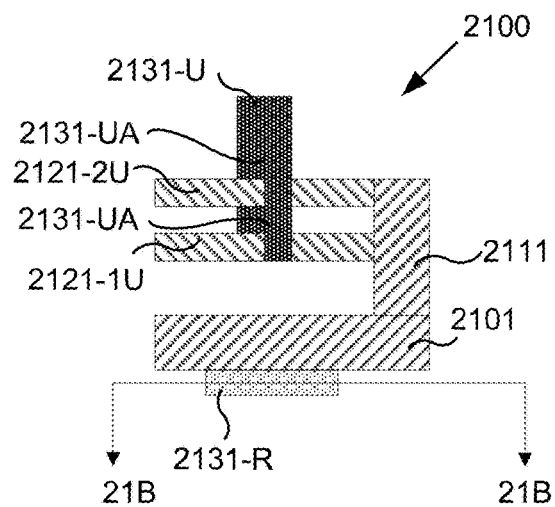
FIGS. 21A-21C provide, respectively, a side view of a module according to another embodiment of invention (FIG. 21A), a cut view through a down-facing engagement structure, e.g. a ring as shown (FIG. 21B) of the module, and a side view of two laterally aligned longitudinally stacked modules (FIG. 21C) that engage one another via the interior region of the ring on the lower surface of the upper module and a tip on the upper portion of the lower module such that even under deflection, the two modules will remain engaged with one another without excessive laterally slippage or misalignment occurring.
Figure 21B:
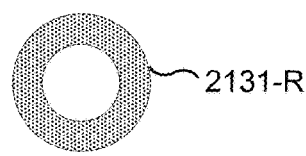
Figure 21C:
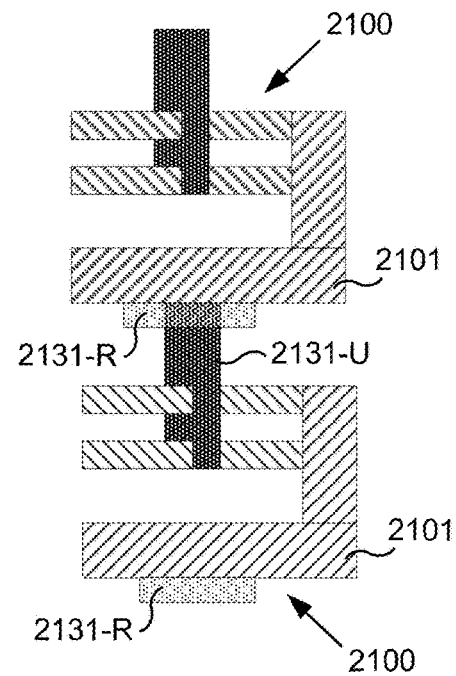

FIGS. 21A-21C provide, respectively, a sideview of a module 2100 according to another embodiment of invention (FIG. 21A), a cut view through a down-facing engagement or retention structure 2131-R, e.g. a ring as shown (FIG. 21B) of the module, and a side view of two laterally aligned longitudinally stacked modules (FIG. 21C) that engage one another via the base as laterally bounded by the interior region of the ring forming the lower surface of the upper module and a tip on the upper portion of the lower module such that even under deflection, the two modules will remain engaged with one another without excessive lateral slippage or misalignment occurring. In FIG. 21C, the retention structure 2131-R is shown as partially transparent such that the upper tip 2131-U of the lower module can be seen through the side of the retention structure 2131-R as it extends into the opening inside the ring configuration of the structure. With the exception of the ring-like retention structure 2131-R extending from the bottom of the base 2101, the module is similar to that of FIG. 10 with similar reference numbers being used to represent similar features with the exception of the series number being changed from 1000 to 2100. In other embodiments, different fully enclosed retention structure configurations may be used. In still other embodiments, the fully enclosed retention structure may be formed on a module tip while a base may have a structure extending therefrom that engages such fully enclosed retention structure. In still other alternative embodiments, the base may include a recess into which a tip of an adjacent module can be engaged.

Figure 21D:
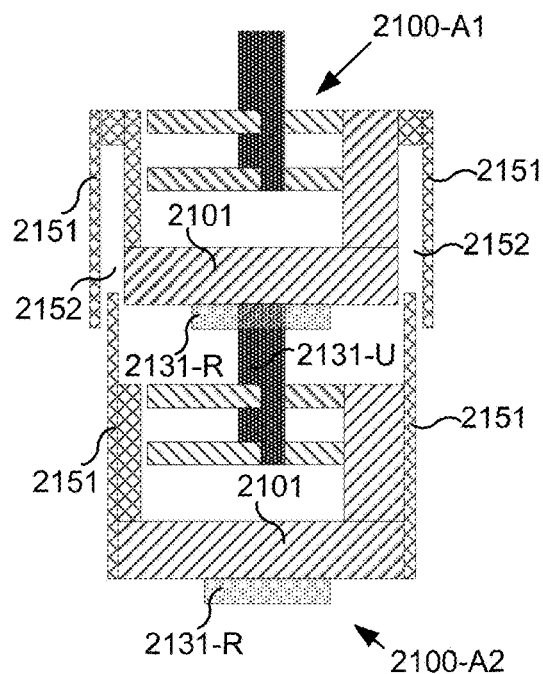
FIGS. 21D and 21E provide variations of the probe of FIG. 21C wherein the pair of probe modules that make up the probe of FIG. 21D have different configurations that provide exoskeletal structures and relative engagement so that the two probe modules can elastically move longitudinally while maintaining lateral alignment and orientation while the probe of FIG. 21D provides two modules that have different configurations that provide endoskeletal structures and relative engagement so that the two probe modules can elastically move longitudinally while maintaining lateral alignment and orientation.
Figure 21E:
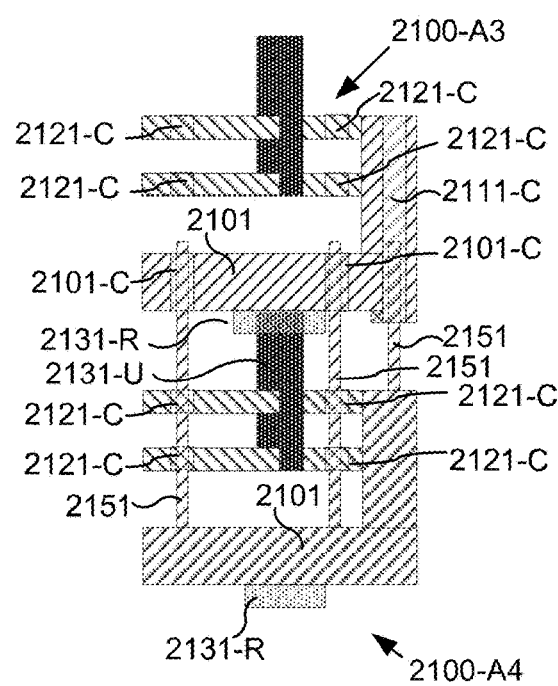

FIGS. 21D and 21E provide variations of the probe of FIG. 21C wherein the pair of probe modules 2100-A1 and 2100-A2 that make up the probe of FIG. 21D have different configurations from each other and different configurations from that of probe module 2100 of FIG. 21C. The variations provide exoskeletal or frame structures 2151 and openings 2152 that provide relative engagement so that the two probe modules can elastically move longitudinally while maintaining lateral alignment and orientation. The probe of FIG. 21E provides two modules 2100-A3 and 2100-A4 that have configurations different from each other and different from those of FIGS. 21A-21D and that provide endoskeletal or frame structures 2151 with openings 2101-C, 2111-C, and 2121-C that provide relative engagement so that the two probe modules can elastically move longitudinally while maintaining lateral alignment and orientation. Other reference numbers in FIGS. 21D and 21E have the same meaning as used in FIGS. 21A-21C and similar configurations, though some differences may exist that allow for the inclusion of the framing elements. Numerous alternative embodiments with endoskeletons and exoskeletons are possible and may include probes formed with more than two modules, modules that are identical to one another, or where some modules are the same and some are different. In some variations, the modules may include framing features not only on the probe sides as depicted in FIGS. 21D and 21E but framing features in the front and back as well. In some variations, a frame may provide a combination of endoskeletal and exoskeletal framing elements. In some embodiments, the probe modules may be formed with some or all framing elements while in other embodiments, some or all framing elements may be added in an assembly process after separate formation. In some embodiments, single framing elements may extend between more than two modules while in others, they may not.

FIGS. 22A-22C provide three views that are similar to those shown in FIGS. 21A-21C for another example module 2200 of the invention wherein the engagement or retention structure 2231-R extending from the bottom of the base 2201 of the present embodiment takes the form of an arc, instead of a full ring as in FIGS. 21A-21C. The opening of the arc faces toward the standoff with the direction of the opening selected so that the existing portion of the arc is positioned to block any anticipated excess lateral movement of a tip against the base in absence of a barrier to slippage that the arc provides. In other embodiments, the configuration of the open retention structure may take on other configurations with the open direction selected based on an anticipated direction of potential slippage between engaged modules. As in FIGS. 21A-21C, the retention structure is shown as being partially transparent so that the upper tip of the lower module can be seen extending to the base of the upper module to better illustrate the capturing of the tip by the arc configuration of the retention structure against leftward slippage of the tip 2231-U against the base 2201. The other reference numbers in FIGS. 22A-22C, with the exception numbers being in the 2200 series number, identify similar features to those identified with similar reference numbers as set forth in the other figures. In some variations, instead of a protruding engagement configuration, the base may include a recess for securely providing lateral engagement with an upper tip from a lower module. In still other variations, the base may have a hole through which a distal end of an upper tip extends while a wider portion of the tip (e.g. associated with a tip arm) may provide a longitudinal stop.

FIGS. 23A-23B provide a side view of a module 2300 with a lower tip 2331-L that includes a retention structure 2331-R that may be used to engage bumps of an electronic device that is to be contacted or that may be used to engage a tip 2331-U of another module as shown in the laterally aligned and longitudinally stacked modules of FIG. 23C wherein an upper tip 2331-U of the lower module engages lower tip 2331-L of the upper module and is laterally retained by the retention structure 2331-R of the lower tip 2331-L of the upper module so as to minimize slippage and misalignment risks during module stacking. An example of the retention structure 2331-R configuration is shown as being ring-like in the cross-section cut view shown in FIG. 23B which is taken along cut line 23B-23B of FIG. 23A. Following the examples of FIGS. 21A-21C and 22A-22C, the retention structure 2331-R is shown as being partially transparent so that the upper tip of the lower module can be seen extending to the tip 2331-L surface of the upper module to better illustrate the capturing of the tip 2331-U of the lower module by the ring configuration of the retention structure against slippage of the tip 2331-U against the base 2301. In other embodiments, the retention structure may function as a contact surface as well as a lateral retention structure. For example, the retention structure may take the form of three or more protruding surfaces that can engage the slopped portions of solder bumps that are to be contacted by the tip/retention structure. In other embodiments, the retention structure may take a polygonal form such as the square form of the lower tip of the probe of FIG. 4. The other reference numbers in FIGS. 23A-23B, with the exception numbers being in the 2300 series number, identify similar features to those identified with similar reference numbers as set forth in the other figures. In other embodiments, different retention structural configurations may be used, some may be closed, some may be open, some may involve complementary features on both of the surfaces that are to be engaged, and some may simply involve textured surfaces that provide enhanced friction and thus provide for reduced slippage as compared to smooth surfaces. In still other embodiments, retention configurations may be replaced by direct bonding of contact surfaces to one another.

Figure 24:
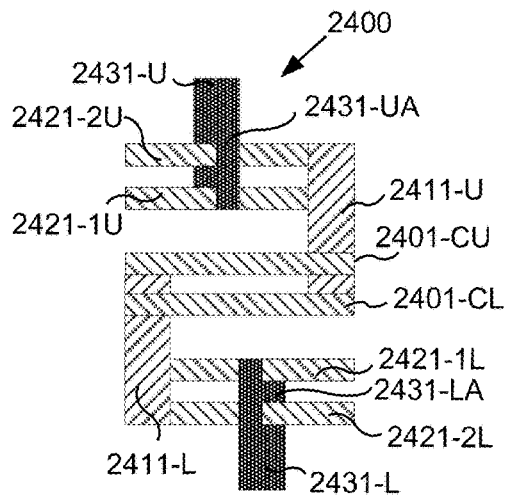
FIG. 24 provides a side view of a module according to another embodiment of the invention where the module does not include a rigid base but does include a pair of compliant intermediate elements that join two oppositely oriented standoffs and compliant pairs of proximal and distal tip supporting spring elements, and wherein the intermediate elements act as standoff elements in separating the proximal and distal spring elements.

FIG. 24 provides a side view of a module 2400 according to another embodiment of the invention where the module does not include a rigid base but does include a pair of compliant intermediate base elements 2401-CU and 2401-CL that join two oppositely oriented standoffs 2411-U and 2411-L and compliant pairs of upper and lower spring elements 2421-1U, 2421-2U, 2421-1L, and 2421-2L which in turn support tip arms 2431-UA and 2431-LA which join upper and lower tips 2431-U and 2431-L. In this embodiment, the intermediate elements 2401-CU and 2401-CL, in addition to connecting upper and lower independent standoffs, provide a standoff functionality of their own by providing additional longitudinal separation of the upper and lower springs. The other reference numbers used in the drawing, with the exception of the 2400 series number, are similar to the corresponding references used in the other figures and particularly to those of FIG. 11. The flexible base elements 2401-CU and 2401-CL may take on a variety of different forms which may or may not be similar to the tip arm supporting spring elements. For example, they may consist of thin discs, thin rings, pairs of inward rotating spirals that meet toward the lateral center of the probe or module, straight cantilever arms or bars. In some variations, the upper and lower base springs may be joined to one another by intermediate bridging elements.

Figure 25:
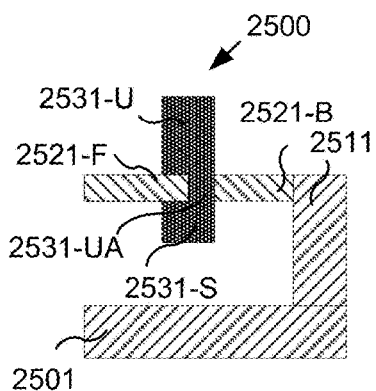
FIG. 25 provides a side view of a module with a single spring element supporting a tip where the tip includes a down-facing extension that can act as a movement stop in the event that an excessive compression force is applied between the tip and the base.

FIG. 25 provides a side view of module 2500 with a single spring element with front and back portions 2521-F and 2521-B supporting a tip 2531-U where the tip includes a down-facing tip arm stop 2531-S that can act as a longitudinal movement stop in the event that an excessive compression force is applied to compress the tip and the base toward one another. Other reference numbers provided in FIG. 25 use similar numbering for similar elements to those used in the previous figures but with the series number updated to 2500. In variations of the embodiment of FIG. 25, multiple longitudinally displaced springs may join the tip (or tip extension) to the standoff to provide a configuration that helps the tip maintain a more vertical or longitudinal orientation upon longitudinal compression of the tip and the base as well as to help tailor the spring force of the module.

Figure 26:
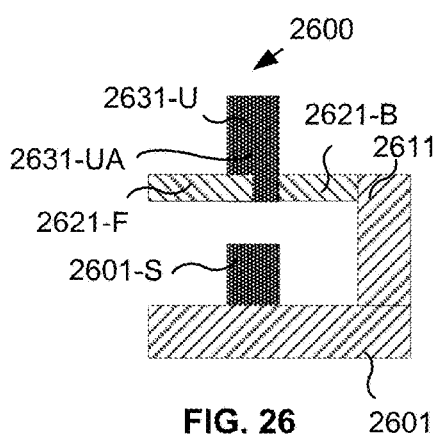
FIG. 26 provides a side view of a module with a single spring element supporting a tip and where a protruding stop structure extends upward from the base such that the lower portion of the tip will be engaged by the stop structure, in the event that an excessive compression force is applied between the tip and the base.

FIG. 26 provides a side view of module 2600 with a single spring element with front and back portions 2621-F and 2621-B supporting a tip 2631-U and where a longitudinally protruding stop structure 2601-S extends upward from the base such that the lower portion of the tip will be engaged by the stop structure in the event that an excessive compression force is applied to compress the tip and the base toward one another. Other reference numbers provided in FIG. 26 use similar numbering for similar elements to those used in the previous figures but with the series number updated to 2600. In other embodiments, stop elements may exist on both the moving tip as well as the base. In other embodiments, other stop structures may be used. An example of such alternative structures may include a standoff of one module being configured to contact a base of another module. As with other configurations, one or more additional spring elements may be mounted to the standoff and be longitudinally connected to the first spring element by a tip extension or tip arm.

Figure 27A:
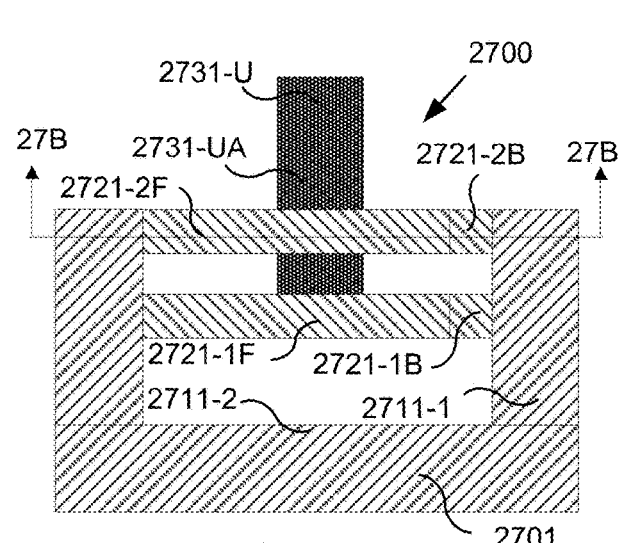
FIGS. 27A-27B provide a side view and a cut view of a module according to another embodiment of the invention where a base structure supports two laterally opposed standoffs which each in turn support a spiral compliant spring element such that a movable tip is supported on each side by spring elements with similar rotational directions such that any tilting bias that occurs upon compression of the tip structure is reduced.
Figure 27B:
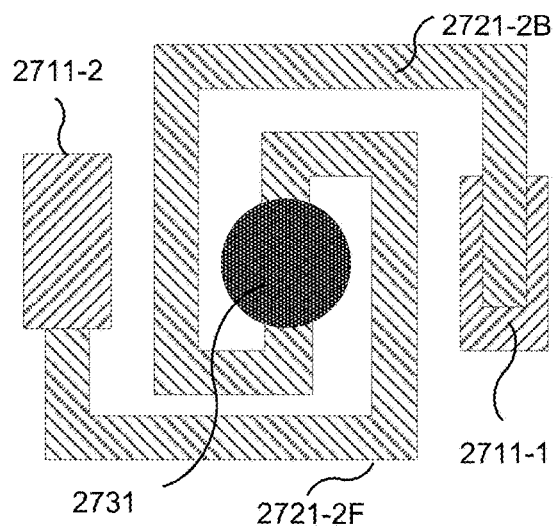

FIGS. 27A-27B provide a side view and a cut view of a module 2700 according to another embodiment of the invention where a base structure 2701 supports two laterally opposed standoffs 2711-1 and 2711-2 which each in turn support two spiral compliant spring elements 2721-1F and 2721-2F, starting on the left, and 2721-1B and 2721-2B, starting on the right, such that a movable central tip 2731-U, joined to tip arm 2731-UA, is supported on each side by a spring force such that any tilting bias upon compression of the tip structure is reduced. In other embodiments, different numbers of longitudinally spaced support springs may exist (e.g., 1 spring, 2 springs, or more), and different numbers of support springs per longitudinal level may be used with their connection points having an appropriate angular orientation (e.g., three elements separated by 120°, four elements separated by 90°, or the like). Different springs may have different thicknesses, different widths, or may vary in width or thickness from one end to another. In some embodiments, more than two standoffs may be used particularly when there are more than two spring elements per longitudinal level. In still other embodiment variations, the multiple standoffs may be joined to form a single standoff with a ring-like configuration with multiple springs extending therefrom at a given longitudinal height. In still other variations, a single spring (e.g. a spiral spring may extend from any given longitudinal height but with spring elements extending from different peripheral standoffs or from different lateral locations on a single standoff such that the central tip/tip arm is supported from different directions by two or more springs. In still other variations, multiple springs (e.g., 2 or more) may extend from different lateral locations of one or more standoffs at any given longitudinal level with two or more sets of springs extending from different lateral positions at different longitudinal levels. For example, with two sets of longitudinally separated spring pairs, a central probe tip may be supported from four different lateral standoff positions when peripheral starting points of the springs are at different lateral positions or with two sets of longitudinally separated spring triplets, a central probe tip may be supported from six different lateral standoff positions when peripheral starting points of the springs are at different lateral positions.

FIG. 28A provides a side view of a probe according to another embodiment of the invention where the probe is formed from two back-to-back (or base-to-base) modules similar to the module of FIGS. 27A-27B where the two modules share a common base that has an annular configuration. FIG. 28A provides a side view of spring module, or probe, 2800 that includes a common base structure 2801 that supports two upper, laterally opposed standoffs 2811-1 and 2811-2 along with two lower, laterally opposed standoffs 2812-1 and 2812-2 as well as providing a standoff functionality of its own by providing additional longitudinal separation of upper and lower spring elements. The upper standoffs each in turn support two spiral compliant spring elements 2821-1F and 2821-2F starting on the left and 2821-1B and 2821-2B starting on the right, such that a movable central tip arm 2831-UA and tip 2831-U is supported by a spring force from four springs originating at two longitudinal levels and from two opposing lateral positions such that any tilting bias upon compression of the tip structure 2831-U is reduced. Similarly, the lower standoffs each in turn support two spiral compliant spring elements 2822-1F and 2822-2F, starting on the left, and 2822-113 and 2822-2B, starting on the right, such that a movable central tip arm 2831-LA and tip 2831-L is supported on each side by a spring force such that any tilting bias upon compression of the tip structure 2831-L is reduced. In other embodiments, different numbers of longitudinally separated spring structures may exist on the top and the bottom, and the numbers may be different between the top and the bottom. For example, a single pair of springs at the same longitudinal level may support the upper tip or the lower tip. Three or more springs may support one or both of the lower tip and the upper tip. Different numbers of support springs at the same longitudinal level may be used with their connection points having an appropriate angular orientation (e.g., three elements separated by 120°). In still other embodiments, some amount of tilt or lateral movement of tip elements may be targeted so as to provide scrubbing to improve contact between tips and contact pads that they contact during use. Different springs may have different thicknesses, different widths, or may vary in width or thickness from one end to another. Springs at different longitudinal levels may have different rotational orientations relative to the longitudinal axis of the probe (e.g. some counterclockwise and some clockwise). At any given longitudinal level, the spring or springs may be supplied in different numbers or with different tip or standoff connection locations relative to such locations at another longitudinal level. Upper tips and lower tips may have tips that are laterally offset from one another or they may be vertically aligned in the center of the probe or shifted away from the longitudinal center of the probe. Tips may have different configurations than those shown and may be formed of the same material as the spring structures or may be formed of a different material. Upper and lower standoffs, springs, and tips may have different configurations and may include hard and/or soft stop elements that provide some protection against overloading via compression. In other variations, the probes may be provided with dielectric and/or conductive coatings or shielding to improve electrical isolation, controlled current flow paths, and/or high frequency operation.

FIGS. 28B-28N, respectively, provide top layer views of each of 13 cross-sectional configurations, or layers L1-L13, from which the probe or module 2800 can be formed using, for example, a multi-layer, multi-material electrochemical fabrication process. Each of FIGS. 28B-28N includes a dashed comparison feature 2809 which provides a figure-to-figure (i.e. layer-to-layer) stacking reference for lateral cross-sectional alignment purposes so that the reader can more confidentially see such alignment. More particularly, FIGS. 28B-28N provide cross-sectional views of successive layers of structural material of the probe of FIG. 28A with views of the tips, the springs, and the standoffs shown with different hatching patterns where upward movement of the lower tip biases the central portion of the lower (connected) springs upward, and downward movement of the upper tip biases the central portion of the upper (connected) springs downward. Features of FIGS. 28B-28N are identified using similar reference numbers as used in FIG. 28A and using identifiers that similar to those used with the other figures herein where the series number is set at 2800. In the embodiment of probe 2800, it can be seen that the proximal or interior upper and lower spring beams 2821-1B, 2821-1F, 2822-1B, and 2822-1F, having end portions 2821-E and 2822-E, are surrounded, enclosed, or encapsulated by standoff material from the sides as well as from above and below which may provide a junction of the beams and standoffs with a stronger bond particularly if the beams and the standoffs are made from different materials or are formed separately from one another and then attached. The ends of the more longitudinally distal or exterior spring beams 2821-2B, 2821-2F, 2822-2B, and 2822-2F are only partially encased in standoff material (i.e., on the sides and the interior portions not the exterior portions) though they may be more fully encased in other embodiments by covering the distal regions with standoff material as well. In other alternatives, it may be acceptable not to use such encapsulation on the ends of either the proximal spring beams or the distal spring beams (e.g., neither may held by widen regions of standoff material).

Figure 28D:
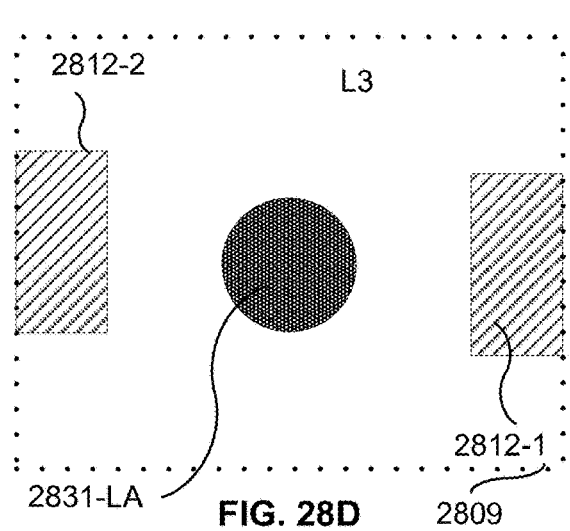
Figure 28E:
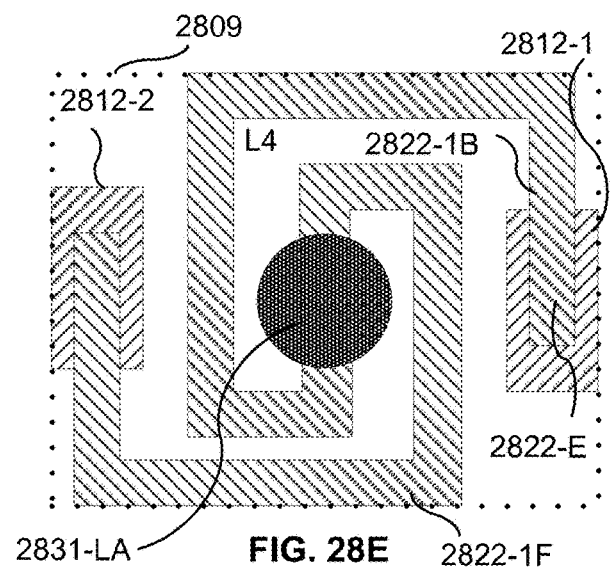
Figure 28F:
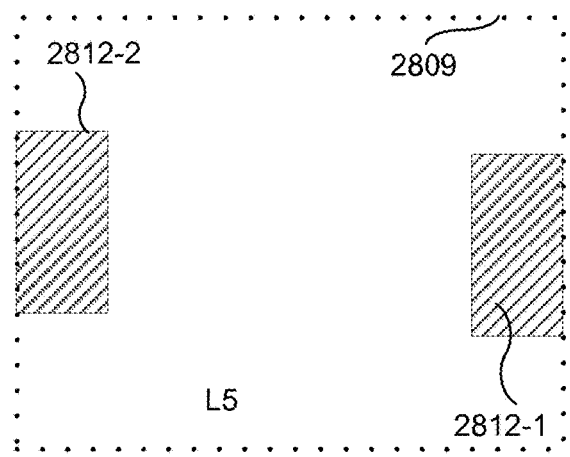
Figure 28G:
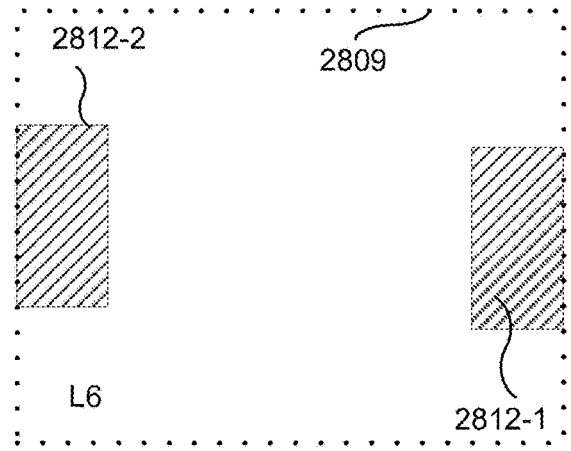
Figure 28H:
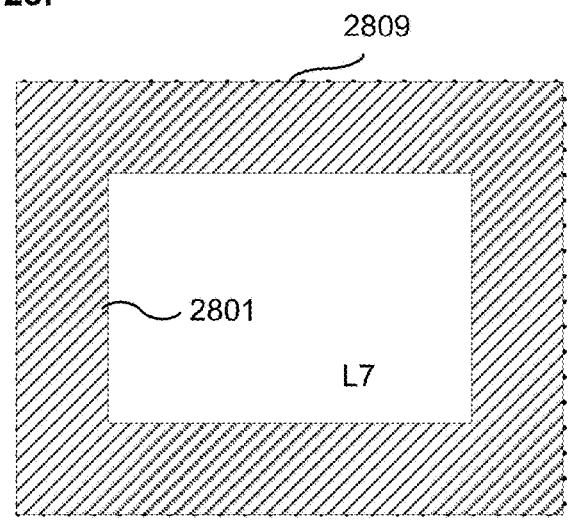
Figure 28I:
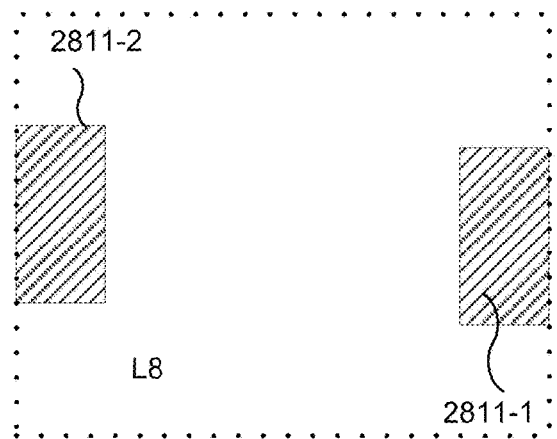
Figure 28J:
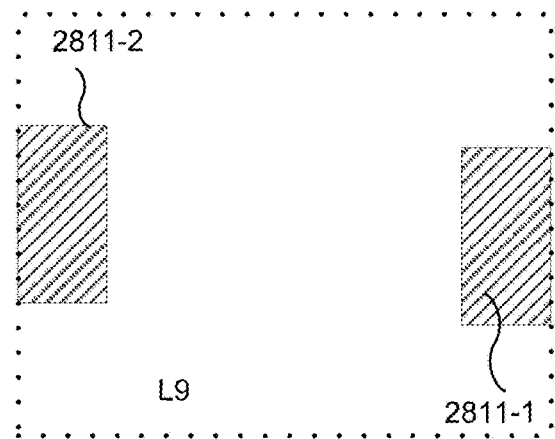
Figure 28K:
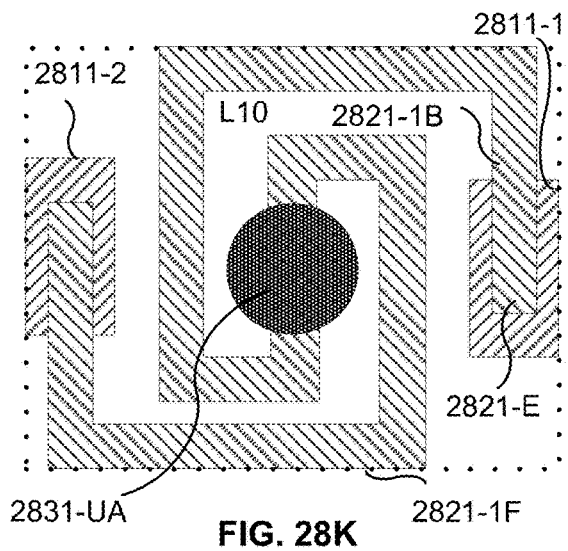
Figure 28L:
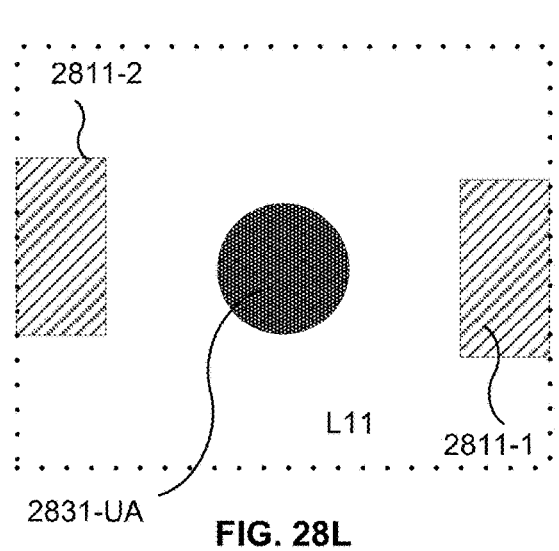
Figure 28M:
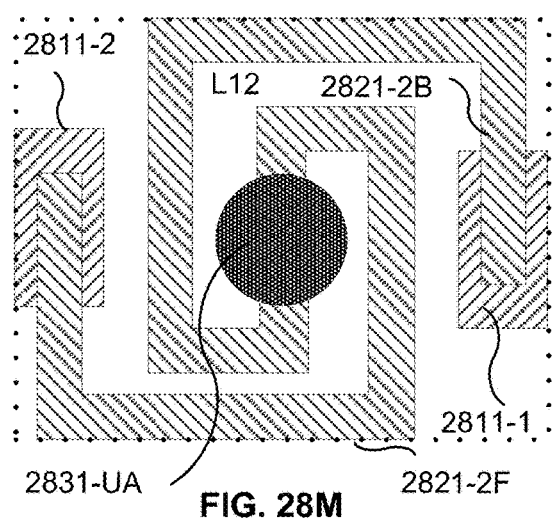
Figure 28N:
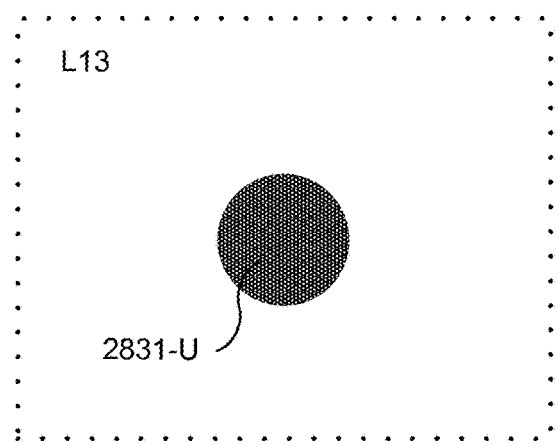

Numerous additional variations of the embodiment of FIGS. 28A-28N are possible and include, for example: (1) use of planar springs having different configurations than the inward counterclockwise rotating rectangular spirals as shown; (2) probes of different heights; (3) probes of different widths; (4) probes of similar lateral extents in both X and Y (e.g. with an aspect ratio of X/Y in the range of 5 to 1/5, in the range of 3 to 1/3, in the range of 2 to 1/2, in the range of 3/2 to 2/3, or even in the range of 1.1 to 0.9; (5) probes with similar heights and maximum lateral extents (aspect ratio of Z/X or Z/Y in the range of 5 to 1/5, in the range of 3 to 1/3, in the range of 2 to 1/2, in the range of 3/2 to 2/3, or even in the range of 1.1 to 0.9; (6) different numbers of longitudinally separate spring elements; (7) adding in features that provide for over travel stops to minimize risk of probe damage; (8) use of a single type of material for all elements including standoffs, springs, tip-arms, and tips; (9) use of at least two different materials for different functional portions of the probe; (10) inclusion of dielectrics; (11) inclusion of abrasion resistant materials as contact elements or in regions where abrasive rubbing and associated wear may be a problem; (12) inclusion of conductive shields to improve probe performance in certain applications; (13) formation using a different number of layers, e.g. using single layers to form L5 & L6 and/or L8 & L9 or using multiple layers to form one or both of L1 & L13; (14) providing a base having a different configuration and/or standoffs with different configurations; (15) providing the base with a configuration and central opening that is sufficient to allow spring movement into the opening such that the separate standoffs may be shortened in height or even eliminated in favor of a probe base that provides complete or partial standoff functionality; and/or (16) features mentioned with regard to other embodiments, their alternatives, and/or features of probes as set forth in the various patent applications incorporated herein by reference.

Figure 29B:
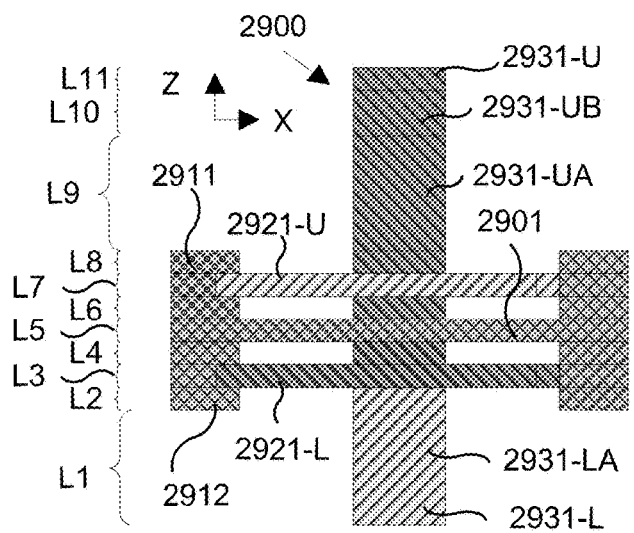
Figure 29B:
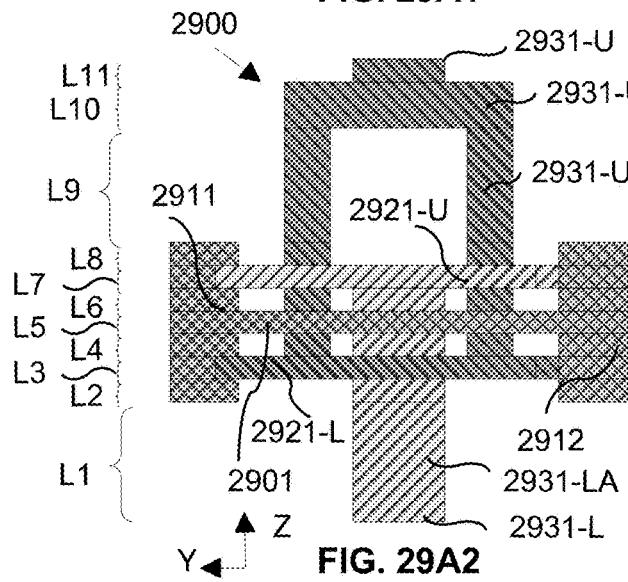
Figure 29B:
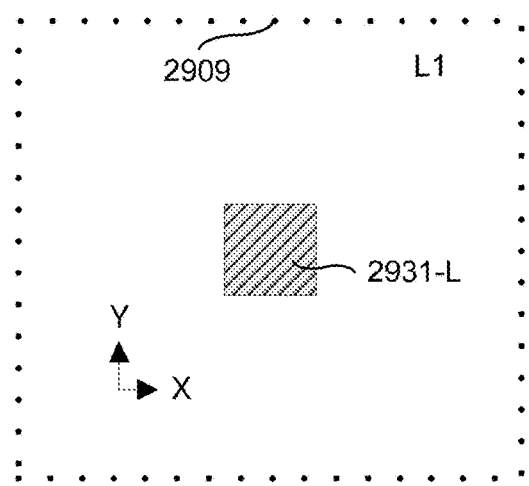

FIGS. 29A1-29A2 provide a pair of different side views along two different perpendicular axes that illustrate a probe 2900 according to another embodiment of the invention while FIGS. 29B-29L provide top views of eleven planar layers from which the probe of FIGS. 29A1 and 29A2 can be formed wherein the springs and tips of probe 2900 are oppositely, or cross, connected such that inner most portions of the upper and lower spring elements separate upon tip compression as opposed to moving closer together as was the case for probe 2800 of FIGS. 28A-28N. In the views of FIGS. 29A1 and 29A2, the longitudinal axis of the probe is the Z-axis and extends upward along the page while the horizontal or lateral axes of the probe are the X and Y axes.

The probe 2900 of FIGS. 29A1-29A2 includes: (1) a lower central contact tip 2931-L that joins a central upper spring element 2921-U via a tip extension or tip arm 2931-LA, (2) an upper contact tip element 2931-U that is connected to an upper bridge 2931-UB that in turn connects to a pair of tip extensions or tip arms 2931-UA that join to central portions of a pair of lower coplanar spring elements 2921-L, and (3) two upper standoffs 2911 and two lower standoffs 2912 that are joined to one another by a base or frame 2901 in the form of a central annular rectangular ring element and wherein the two upper standoffs and the two lower standoffs support the outermost ends of pairs of co-planar inward rotating, planar, spiral, upper and lower spring elements 2921-U and 2921-L. FIG. 29A1 provides a side view of the sample probe looking along the positive Y-axis (i.e. an X-Z plane view) while FIG. 29A2 provides a side view of the sample probe looking along the positive X-axis (i.e. a Y-Z plane view) with each figure also illustrating various portions, or layers L1-L11, of the probe that are shown in FIGS. 29B-29L using labels L1-L11 along with brackets showing the longitudinal extent of each layer. The bridge element 2931-UB and pair of tip arms 2931-UA are better seen in FIG. 29A2 as much of their configuration is masked or hidden in the view of FIG. 29A1. When probe 2900 is put to use, upward movement of the lower tip biases the central portion of the upper (connected) springs upward, and downward movement of the upper tip biases the central portion of the lower (connected) co-planar springs downward, thus causing a larger separation between the springs upon relative compression of the tips toward one another.

FIGS. 29B-29L, respectively, provide top layer views looking down along the Z-axis of each of 11 cross-sectional configurations, or layers L1-L11, from which the probe 2900 can be formed using, for example, a multi-layer, multi-material electrochemical fabrication process. Each of FIGS. 29B-29L include a dashed alignment element 2909 which provides a lateral reference that may be aligned from figure-to-figure, or layer-to-layer, for conceptual, lateral alignment or registration purposes. Features of FIGS. 29B-29L are identified using similar reference numbers as used in FIGS. 29A1 and 29A2.

Figure 29C:
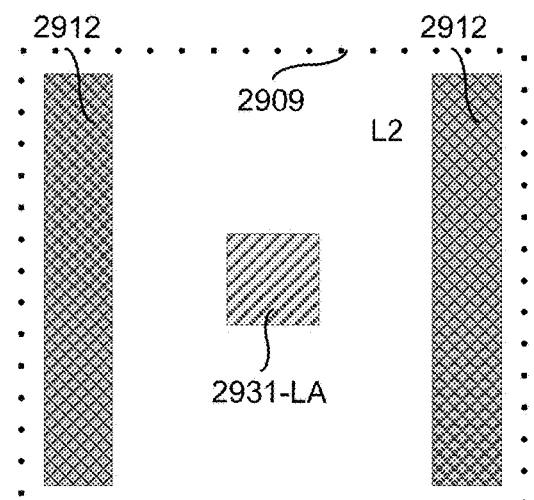
Figure 29D:
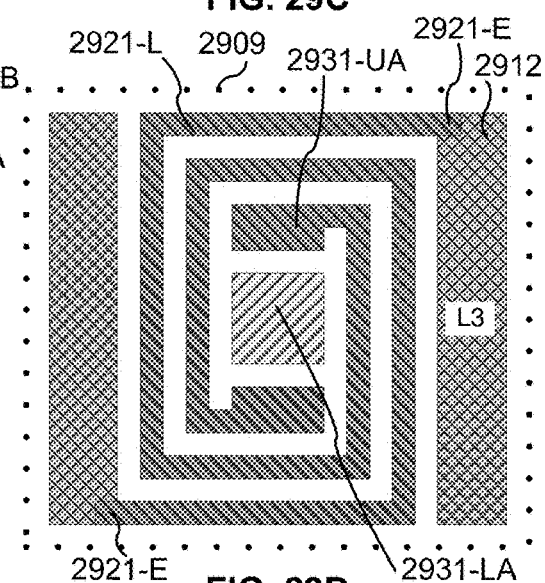
Figure 29E:
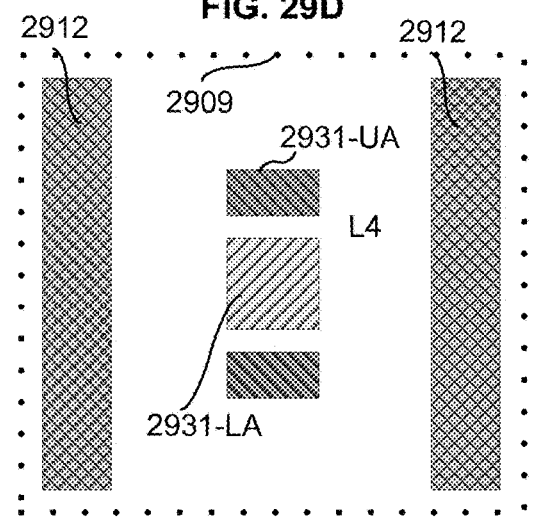
Figure 29F:
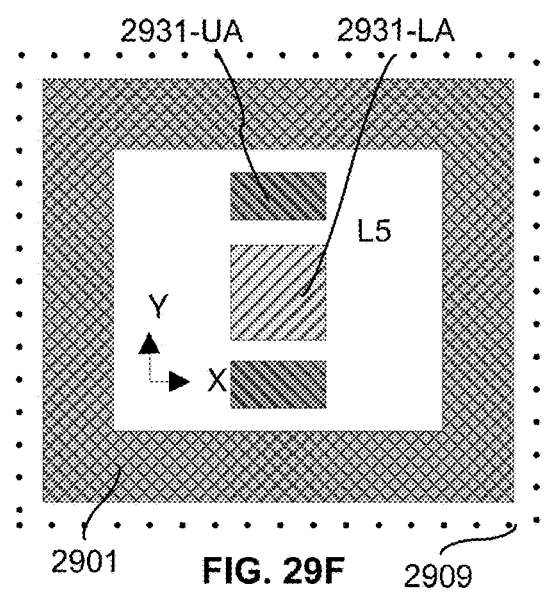
Figure 29I:
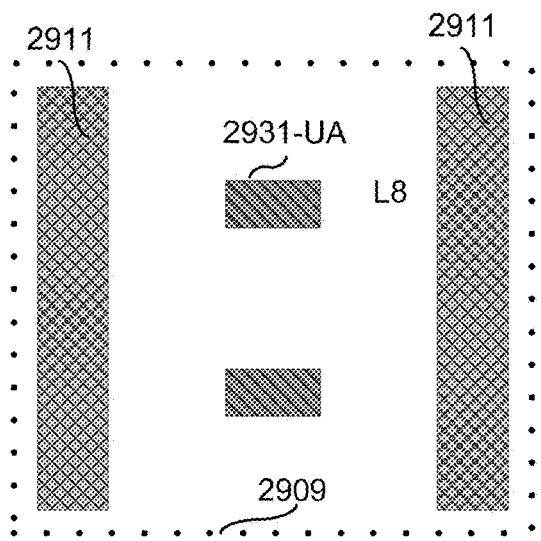
Figure 29G:
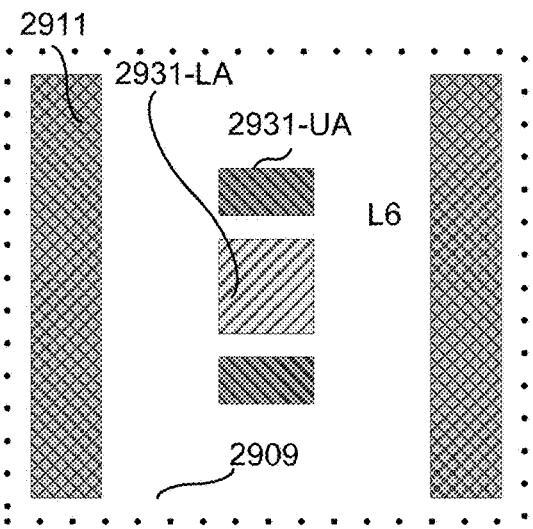
Figure 29J:
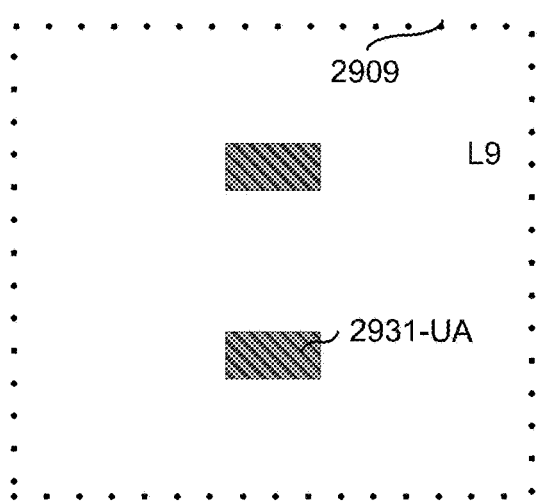
Figure 29H:
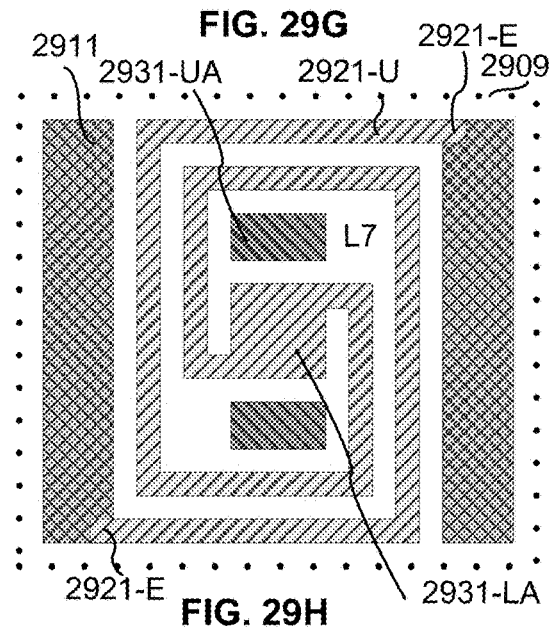
Figure 29K:
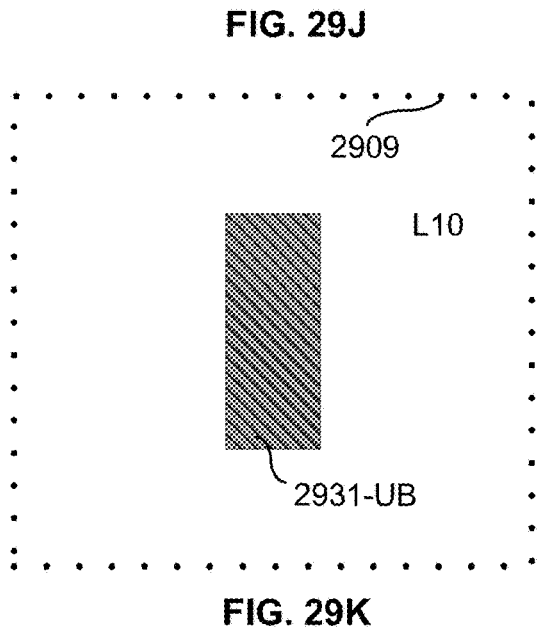

The first layer L1 of probe 2900 provides a lower length of a tip portion of the probe including a lower contact portion of the tip 2931-L (FIG. 29B). The second layer L2 provides an additional portion of the tip, i.e., a portion of a tip arm 2931-LA, along with a lower bounding portion of an optional pair of lower standoffs 2912 that help encapsulate the ends 2921-E of both lower spring elements 2921-L (shown in FIG. 29D) within a body of standoff material (FIG. 29C). The third layer L3 provides additional standoff material along with an opening in the standoff material that holds the outermost ends 2921-E of the two coplanar spiral spring elements 2921-L. The two spring elements 2921-L are shown as rotating in the same direction (counterclockwise from outer most lateral extents to inner most lateral extents) and whose inner ends are located at two separate locations for engaging with the two upper tip arm elements 2931-UA (FIG. 29D). The third layer L3 also includes a central region of lower tip arm material 2931-LA that extends through the spring elements uninterrupted. The fourth layer L4 includes a cross-section that provides additional regions of lower standoff material 2912, two separate regions of upper tip arm material 2931-UA, and a region of lower probe tip arm material 2931-LA (FIG. 29E). The fifth layer L5 includes a central rectangular, annular frame structure 2901 along with an opening for passing the two continuing regions of upper tip arm material 2931-UA and a central region of lower tip arm material 2931-LA (FIG. 29F). The sixth layer L6 provides a similar pattern of structural material to that of the fourth layer (FIG. 29G). The seventh layer L7 provides structural material in the form of two inward rotating, upper, spiral spring elements 2921-U that have outer portions that are embedded in upper standoff material 2911 (and are bounded from below by standoff material on that layer and will be bounded from above by additional standoff material so as to provide for their complete encapsulation) and inner portions that join an uppermost portion of the lower tip arm 2931-LA (FIG. 29H). The seventh layer L7 also provides two continuing regions of upper tip arm material 2931-UA. The eighth layer L8 provides two regions of upper standoff material 2911 that cap the standoff and outer portions of the upper spring elements 2921-U of the prior layer. The eighth layer L8 also provides two continuing regions of upper tip arm material 2931-UA (FIG. 29I). The ninth layer L9 provides an additional level of material for the two upper tip arms 2931-UA (FIG. 29J) while the tenth layer L10 provides a region of upper bridge material 2931-UB that joins the two upper tip arms 2931-UA (FIG. 29K). The eleventh, and final, layer L11 provides an upper length and contact portion of an upper tip 2931-U (FIG. 29L). During operation of probe 2900, involving the relative compression of the probe tips toward one another, the relative displacement of the inner portions of the upper and lower spring elements 2921-U and 2921-L becomes larger, not smaller, as was the case for the previous embodiments set forth herein. In some variations of the embodiment of FIGS. 29A1-29L, the standoffs may be replaced by an appropriately configured base structure that provides side-to-side lateral joining as well as sufficient longitudinal functionality to allow probe operation and monolithic probe formation (i.e. formation without assembly other than layer-to-layer build-up).

FIGS. 30A1-30J provide a pair of different side views (FIGS. 30A1-30A2) along with nine top layer views (FIGS. 30B-30J) of a probe according to another embodiment of the invention wherein the probe operates in a manner similar to that of the probe of FIGS. 29A1-29L but with the rectangular ring-like frame structure and the associated standoffs replaced with a central connecting structure, base, or standoff such that outermost portions of the springs move relative to one another in association with tip displacement as opposed to the inner most portions undergoing such movement. Like the operation of the probe 2900, portions of the lower and upper spring elements of the probe of the present embodiment separate during relative tip compression.

The example probe 3000 shown in the Y-Z plane side view of FIG. 30A1 and in the X-Z side view of FIG. 30A2 shows the probe with a vertical longitudinal axis (i.e. the Z-axis) and illustrates (1) a lower central contact tip element 3031-L that is connected to a lower bridge 3031-LB that joins laterally displaced portions of a pair of coplanar, upper spring elements 3021-U via two laterally displaced tip extensions or tip arms 3031-LA, (2) an upper contact tip element 3031-U that is connected to an upper bridge 3031-UB that in turn connects to a pair of tip extensions or tip arms 3031-UA that join laterally displaced portions of a pair of lower coplanar spring elements 3021-L, and (3) a central standoff 3011 that joins and supports the innermost ends of the coplanar pair of upper, outward rotating, planar, spiral, spring elements 3021-U and the coplanar pair of lower outward rotating, planar, spiral, lower spring elements 3021-L. The central standoff provides at least part of an internal frame structure. FIG. 30A1 provides a side view of the sample probe looking along the positive Y-axis while FIG. 30A2 provides a side view of the sample probe looking along the positive X-axis. The bridge elements can be seen in FIG. 30A1 but are masked by the tip arm elements (more like tip arm panels in this embodiment) in FIG. 30A2. When probe 3000 is put to use, upward movement of the lower tip biases the peripheral portions (i.e. the portions most remote from the central axis of the probe) of the upper coplanar springs upward, and downward movement of the upper tip biases the peripheral portions of the lower coplanar springs downward, thus causing a larger separation between the peripheral portion of springs upon tip compression. FIGS. 30A1 and 30A2 also provide brackets and references indicating the longitudinal extents of each of the nine layers (30B-30J) from which probe 3000, of the present example, is formed.

FIG. 30A3 provides a side view of a probe 3000-A which is a variation of probe 3000 illustrating six optional stop features that may be incorporated into the probe individually or in combination: (1) a horizontal stop feature 3031-UAHS attached to one or both of the bridged upper arms that moves with the lower spring that may act as a movement stop when it encounters the upper end of a lower bridged arm or an associated feature, (2) a horizontal stop feature 3031-UBS attached to the upper bridge that moves with the lower spring that may act as a movement stop when it encounters the upper end of a lower bridged arm or an associated feature, (3) a vertical stop feature 3031-UAVS attached to one or both of the lower portions of bridged upper arms that moves with the lower spring that may act as a movement stop when it encounters a feature associated with the lower bridge or one or both of the lower bridged arms, (4) a horizontal stop feature 3031-LAHS attached to the lower bridge that moves with the upper spring that may act as a movement stop when it encounters the lower ends of an upper bridged arm or an associated feature, (5) a horizontal stop feature 3031-LBS attached to the lower bridge that moves with the upper spring that may act as a movement stop when it encounters the lower end of an upper bridged arm or an associated feature, (6) a vertical stop feature 3031-LAVS attached to one or both of the upper portions of bridged lower arms that moves with the upper spring that may act as a movement stop when it encounters a feature associated with the upper bridge or one of the upper bridged arms. In some embodiments, all such stop features may be used while in others, less than all such features may be used or even no such features used. In still other alternatives, stop features may take on different configurations and/or be attached to different portions of the probe (e.g. features could extend vertically from the upper or lower portion of the base or from the central portion of the springs attached thereto or downward from the central portion of the upper bridge or upward from the central portion of the lower bridge to act as stops when they engage opposing features as tip-to-tip compression occurs).

FIGS. 30B-30J, respectively, provide top layer views of each of 9 cross-sectional configurations, or layers L1-L9, from which the probe 3000 can be formed using, for example, a multi-layer, multi-material electrochemical fabrication process. Each of FIGS. 30B-30J include a dashed alignment element 3009 which provides a conceptual, lateral stacking alignment or registration reference for the structural material of successive figures. More particularly, FIGS. 30B-30J provide cross-sectional views of successive layers of structural material of the probe 3000. Features of FIGS. 30B-30J are identified using similar reference numbers as used in FIGS. 30A1 and 30A2.

Figure 30B:
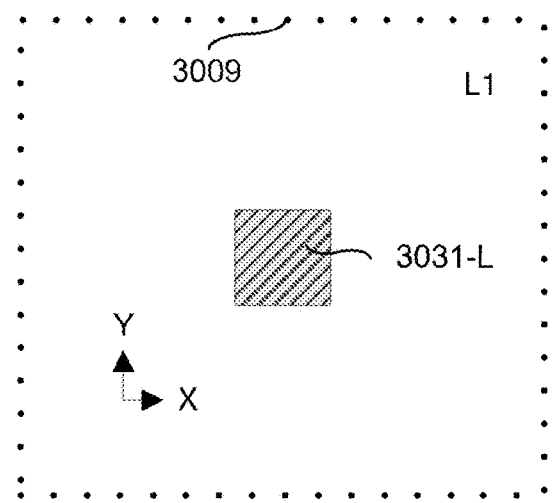
Figure 30C:
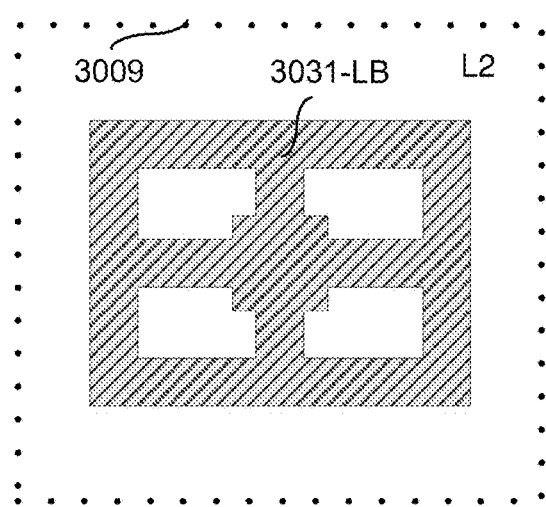
Figure 30E:
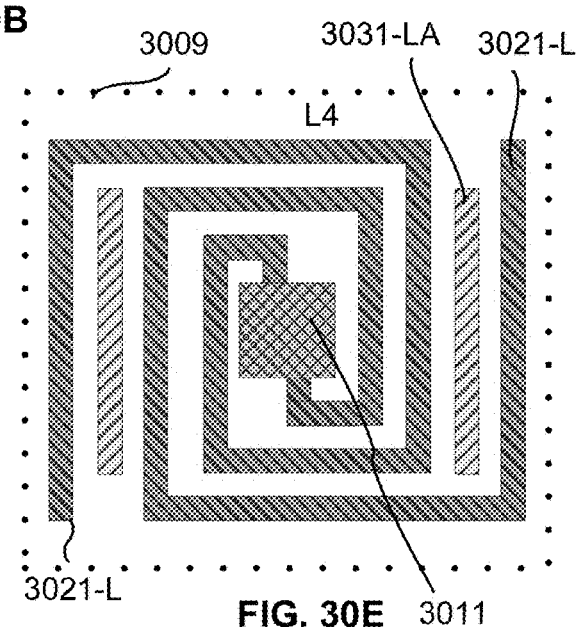
Figure 30D:
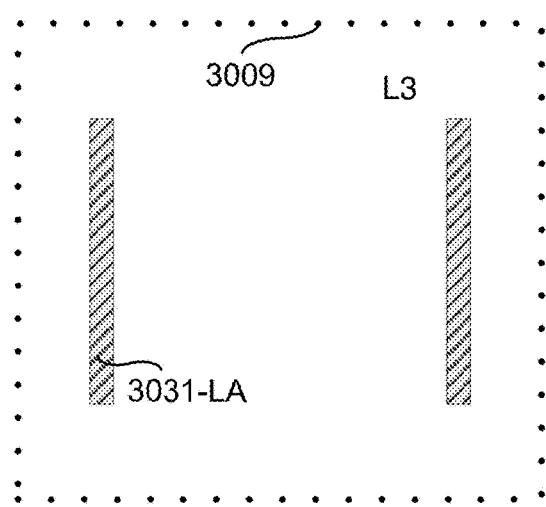
Figure 30F:
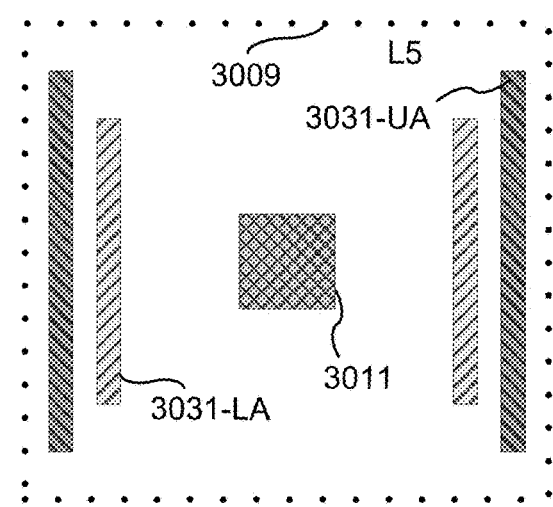
Figure 30G:
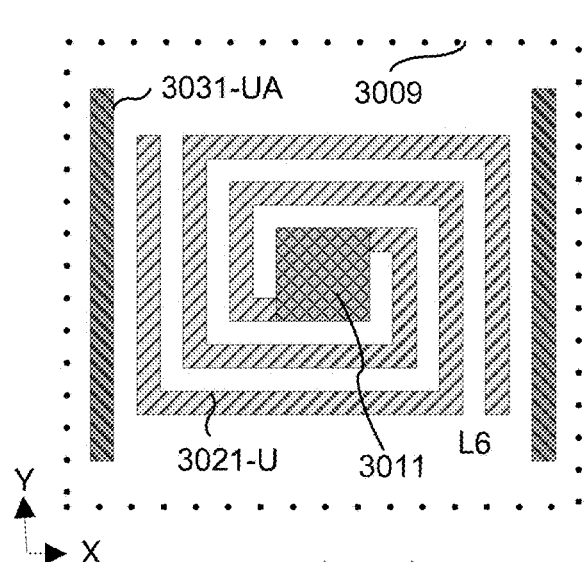
Figure 30I:
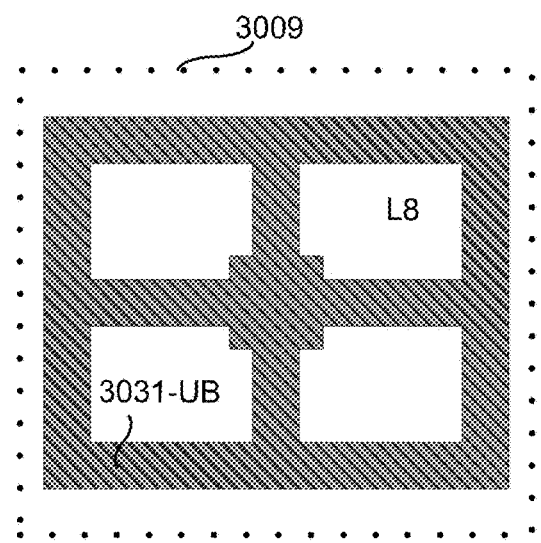
Figure 30H:
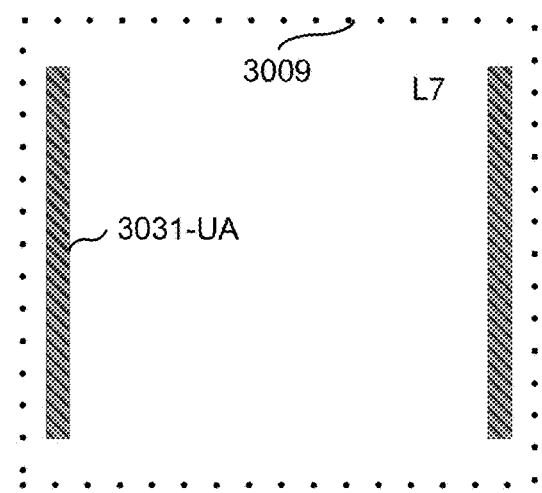
Figure 30J:
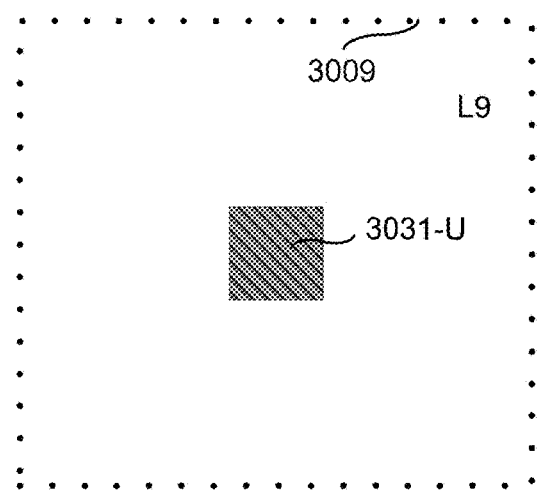

The first layer L1 provides a lower length of a tip portion of the probe including a lower contact portion of the tip 3031-L (FIG. 30B). The second layer L2 provides an additional portion of the probe tip in the form of an extended bridge element 3031-LB (FIG. 30C). The third layer L3 provides a pair of displaced lateral tip extension or tip arm elements 3031-LA that connect to the bridge 3031-LB of the prior layer (FIG. 30D). The fourth layer L4 continues to provide a pair of displaced lateral lower tip arm elements 3031-LA that connect to the arm elements on the prior layer. The fourth layer L4 also provides a first portion of a centrally located standoff 3011 that joins to the inner most portion of two lower outwardly rotating, interleaved coplanar spiral spring elements 3021-L that deflect in association with the displacement on an upper tip of the probe (FIG. 30E). The fifth layer L5 continues to provide a pair of displaced lateral, lower tip extension or tip arm elements 3031-LA that connect to the lower arm elements on the prior layer, a continuation of the central standoff 3011, and the beginning of a pair of displaced lateral, upper tip arm elements 3031-UA that connect to the laterally displaced ends of the lower coplanar spring elements 3021-L of the prior layer (FIG. 30F). The sixth layer L6 continues to provide the pair of displaced lateral upper probe tip arm elements 3031-UA that connect to the tip arm elements 3031-UA on the prior layer (FIG. 30G). It also provides a top portion of the central standoff 3011 which joins to the innermost portion of two outwardly rotating, co-planar, upper, interleaved, spiral spring elements 3021-U that deflect in association with the displacement of the lower tip of the probe. The seventh layer L7 continues to provide the pair of displaced lateral upper probe tip arm elements 3031-UA that connect to similar elements on the prior layer (FIG. 30H). The eighth layer L8 provides an additional portion of the upper probe tip in the form of an extended bridge element 3031-UB (FIG. 30I) that joins the laterally displaced upper arm elements 3031-UA of the prior layer to one another. The ninth layer L9 provides an upper length of an upper tip portion of the probe including an upper contact portion of the tip 3031-U (FIG. 30J). During operation of the probe that involves the compression of the probe tips toward one another, the relative displacement of the outer portions of the upper and lower spring elements becomes larger while the inner portions of the spring elements remain at a relatively fixed spacing. In some variations of the embodiment of FIGS. 30A1 to 30J, the standoff 3011 may be modified to provide lateral extensions, if necessary, to provide structural features (e.g. base like features) for interacting with array structures if the arm and bridging elements are insufficient to provide such functionality.

Numerous other variations of the embodiments of FIGS. 29A1-29L and FIGS. 30A1-30J are possible and include, for example: (1) variations in materials used in different portions of the probe including variations that range from a probe being formed from a single material type to probes being formed with different materials for at least two of the springs, contact portions of tips, tip arms, and tip bridges; (2)

variations in dimensions; (3) use of more than two tip arms that extend between compliant elements and tip bridge elements; (4) use of only a single tip arm for both upper and lower springs, (5) use of upper and lower contact elements that are not co-linear; (6) use of two tip arms for both upper and lower springs and tips; (7) use of only a single spring with a movable tip while an opposing tip, contact surface, or mounting location is hard mounted to a frame element; (8) use of springs, tip arms, bridge elements, and/or frame elements that result in relative displacement on an inner portion of a spring element in combination with a tip element that cause relative displacement of an outer portion of another spring element; (9) instead of using tip arm elements that have elongated linear configurations (like those in the figures), tip arm elements may include one or more features that extend from the linear element to provide greater stiffness in a direction perpendicular to the linear dimension, e.g. t-shaped structure, angled structures such as corner pieces, use of upper and lower springs where at least one of the springs includes a lateral extension that is larger than a corresponding lateral extension of the other spring such that larger springs may provide a stop structure when loading the spring into a guide plate or other array structure (e.g. where the springs have similar oblong shapes but where the shapes are rotated relative to one another about the longitudinal axis of the probe); (10) use of a frame element or elements, like annular rings, which are not centrally located but are displaced longitudinally somewhere between the top of the upper spring element and the bottom of the lower spring element; (11) embodiments where the probes function as modules and are actually components of probe assemblies having larger longitudinal lengths; (12) use of one or more additional longitudinally displaced spring or coplanar spring pairs as part of one or both of upper or lower spring structures, wherein the rotational orientations of adjacent springs may be the same or reversed or even include different numbers of spring elements at a given longitudinal level; (13) use of one or more probe tips that include a plurality of contact elements; (14) embedding of the central or interior ends of spring beam material into base material or in tip arm material to strengthen interconnections particularly when different materials are used; (15) use of different layer counts, different or even varying layer thicknesses, and/or (16) features or variations noted in the other embodiments or aspects set forth herein, mutatis mutandis.

Figure 31:
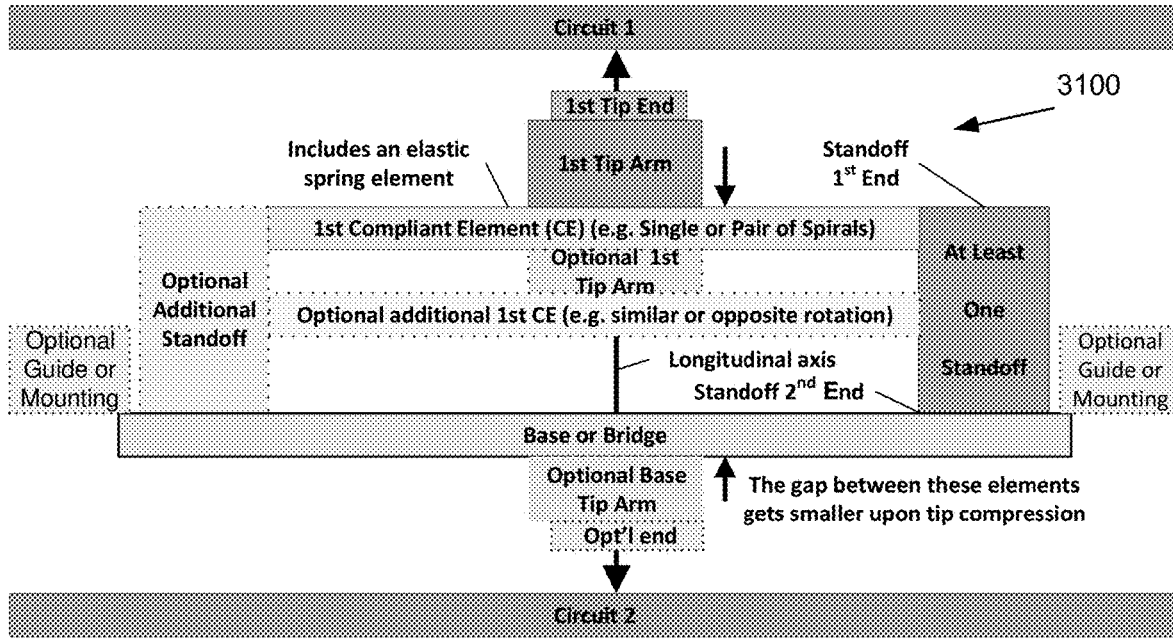
FIG. 31 provides a schematic representation of a compression-type spring probe/module according to a generalized embodiment of the invention having a single compliant structure and a first compliant element along with additional optional elements or features.

FIG. 31 provides a schematic representation of a compression-type spring probe/module 3100 according to a generalized embodiment of the invention. The probe includes a single compliant structure with a first compliant element. It also includes an option of having the at least one standoff implemented as two separate standoffs, the option of having the first compliant element include a second longitudinally displaced biasing spring or spring set, the option of having a base tip arm and/or tip end, and the option of having or engaging a guide or mounting structure that can also engage other probes/modules as part of an array. In still further generalizations, more than two standoffs may be used, the first compliant element may include even more than two longitudinally displaced biasing springs, positioning of standoffs may be closer to the probe axis while tip arm extensions may be further displaced from the probe axis, the probe tips or tips may be along the probe axis, displaced from the probe axis or in the case of multiple tips, they may be non-co-linear, and a base or mounting structure may be joined to the probe at any longitudinal position, not just near the longitudinal center of the probe. Numerous other variations are also possible which will be apparent to those of skill in the art upon review of the present disclosure and may for example include a feature or multiple features from the various embodiments and aspects set forth herein.

Figure 32:
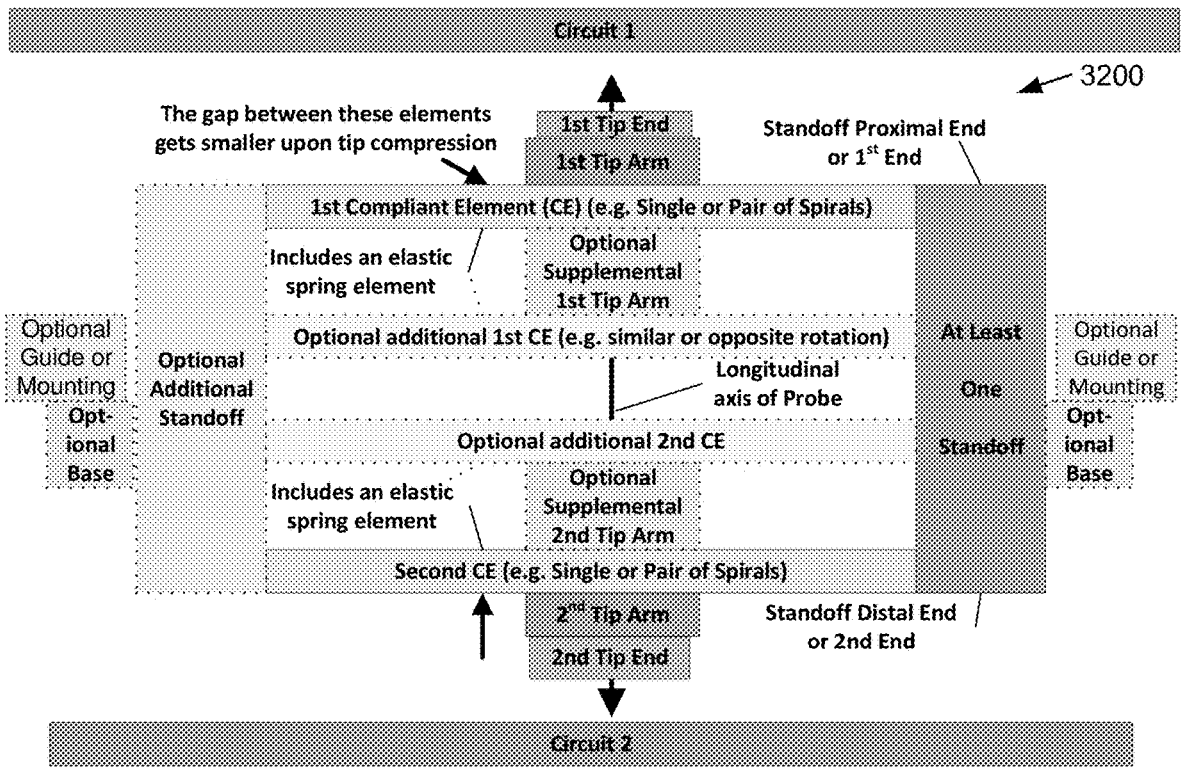
FIG. 32 provides a schematic representation of a compression-type spring probe according to another generalized embodiment of the invention having a single compliant structure with first and second oppositely facing compliant elements.

FIG. 32 provides a schematic representation of a compression-type spring probe 3200 according to another generalized embodiment of the invention having a single compliant structure with first and second oppositely facing compliant elements with an option of having the at least one standoff implemented as two separate standoffs, with the option of having a base solid or hollow (e.g. annular base), the option of having the first and second compliant elements include a second longitudinally displaced biasing spring or spring set, and the option of having or engaging a guide or mounting structure that can also engage other probes as part of an array. The additional variations noted for FIG. 31 also apply to this generalized embodiment.

Figure 33:
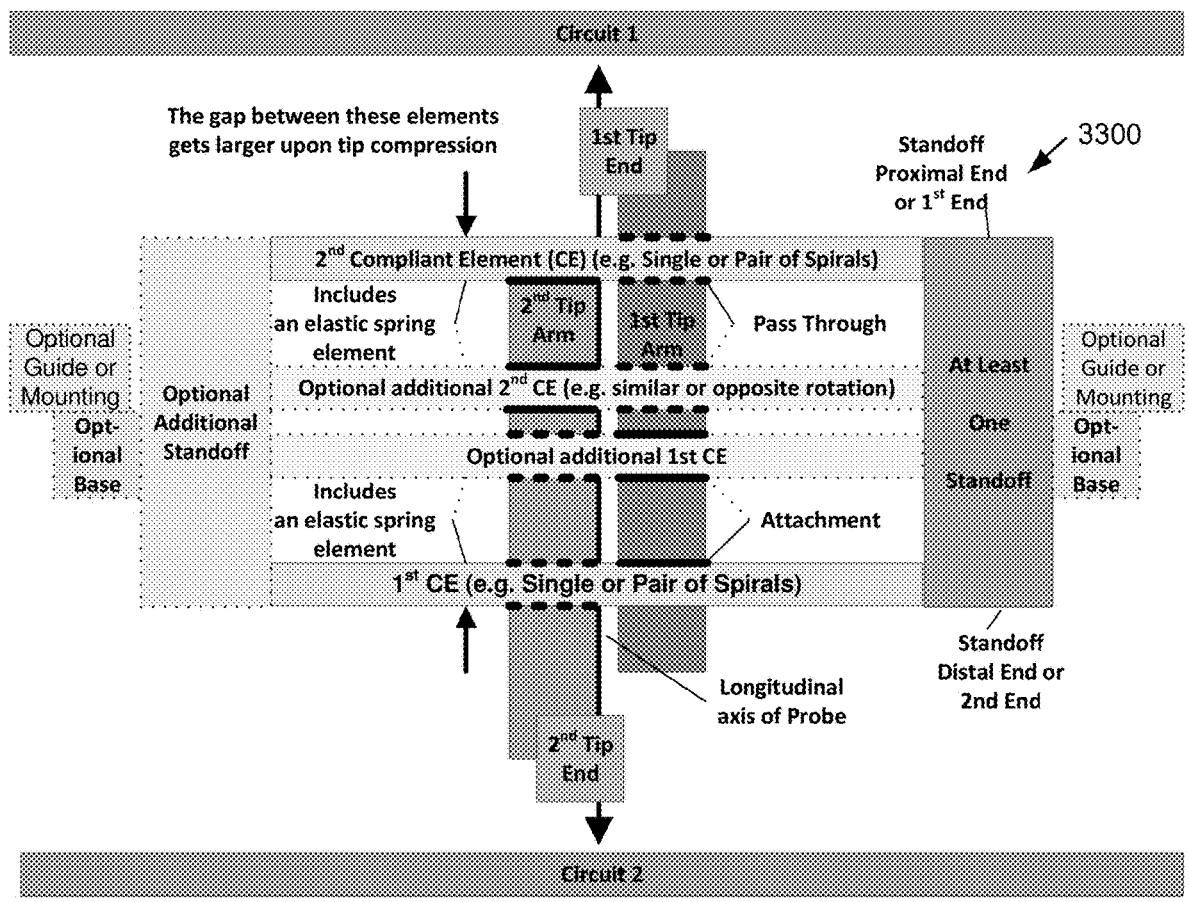
FIG. 33 provides a schematic representation of an expansion-type spring probe according to another generalized embodiment of the invention having a single compliant structure with first and second compliant elements.

FIG. 33 provides a schematic representation of an expansion-type spring probe 3300, according to another generalized embodiment of the invention, having a single compliant structure with first and second oppositely facing compliant elements with an option of having the at least one standoff implemented as two separate standoffs, with the option of having a base, the option of having the first compliant element including a second longitudinally displaced biasing spring or springs, and the option of having or engaging a guide or mounting structure that can also engage other probes as part of an array. The $1^{st}$ and $2^{nd}$ tip arms and tip ends are shown as being laterally displaced to illustrate their distinctness, though this might not be the case in all implementations which may or may not also include tip arm bridging elements to promote tip placement and/or placement of tip arms for passing through spring elements. In some variations, the single upward and downward pointing tip arms may each be replaced by multiple tip arms. In some variations, a single tip arm may point in one direction while multiple tip arms may point in the opposite direction and form a substantially concentric structure around the opposite tip arm. The central portions of the springs attached to oppositely directed tips move apart from one another during tip compression. In alternative embodiments, the central portion of the springs may have a longitudinally fixed relationship, when the standoff elements are moved to the central region of the probes wherein the peripheral regions of the springs may separate upon tip compression. The additional variations noted for FIGS. 31 and 32 also apply to this generalized embodiment.

FIGS. 34A-34D4 provide various views of a probe 3400, or of portions of such a probe, according to another embodiment of the invention where the probe has some similarities to the probe of FIG. 28A but where the probe includes a number of distinct features: (1) an annular base or frame 3401 that holds an upper spiral spring array 3421-UC and a lower spiral spring array 3421-LC by their outermost lateral extents to provide basic standoff functionality between the upper and lower spring arrays wherein the base or frame 3401 has a circular exterior with an interior opening that has opposing arcuate sides 3401-A and narrower opposing flat sides 3401-F wherein upper and lower surfaces joining the flat sides provide attachment regions for joining with upper and lower supports or standoffs 3411-1, 3411-2, 3412-1, and 3412-2 that in turn support the ends of the spiral spring elements while the arcuate regions provide gaps over which outermost cantilever portions of the springs can reside (prior to deformation), where the thickness of the base acts as a standoff spacer in which portions of the spiral springs can deflect during compression of probe tips toward one another; (2) each of the upper and lower spring arrays start their inward path from opposing pairs of standoffs as two longitudinally separated co-planar pairs of winding spiral cantilevers 3421-1U and 3421-2U above the base and 3421-1L and 3421-2L below the base with each cantilever of each element dividing into two longitudinally spaced cantilevers partway through their inward treks such that four upper cantilever elements UC1-UC4 join each side of an upper tip arm 3431-UA while four lower cantilever elements LC1-LC4 join either side of a lower tip arm 3431-LA that in turn respectively support contact or bonding tips 3431-U and 3431-L; (3) the rotational orientations of the spiral spring elements joining the upper contact tip have opposite rotational orientations relative to the spiral spring elements joining the lower contact tip; and (4) the standoffs 3411-1, 3411-2, 3412-1, and 3412-2 provide only intermediate standoff functionality between multiple beams of the upper spiral array and between the multiple spiral beams of the lower spiral array but not standoff functionality between the two spring groups as that function is provided directly by the base 3401.

FIGS. 34A, 3461, and 34132, respectively, provide side, upper isometric, and lower isometric views of probe 3400 where different features of the probe can be seen. FIG. 34B1 provides a view of the uppermost pair of spiral springs of the upper spring section of the probe while FIG. 34132 provides a view of the lowermost pair of spiral springs of the lower spring section of the probe. Each of FIGS. 34A, 3461, and 34132 provides a view of the upper and lower tips 3431-U and 3431-L along with the central base 3401. FIGS. 34A, 34B1 and 34132 also provide views of upper standoffs 3411-1 and 3411-2 as well as lower standoffs 3412-1 and 3412-2, as well as views of the outer portions of the longitudinally separated upper cantilever elements 3421-1U and 3421-2U and lower cantilever elements 3421-1L and 3421-2L. The interleaved paths of the pairs of coplanar cantilever elements can also be seen to propagate inward from their respective standoffs to meet at their respective central tips.

FIGS. 34C1 and 34C2, respectively, provide exploded isometric views of probe 3400 from upper and lower perspectives so that not only can the bottom of the lower cantilever elements and the top of the upper cantilever elements be seen but also so that the top of the lower cantilever elements and the bottom of the upper cantilever elements can be seen as well as the interior of the annular base 3401 including the flat and arcuate side walls 3401-F and 3401-A. In FIGS. 34C1 and 34C2, the upper spring section or upper compliant element 3421-UC of the probe is separated from the central frame or base element 3401 which is in turn separated from the lower spring section or lower compliant element 3421-LC of the probe. The upper tip 3431-U can be seen in FIG. 34C1 along with the tops of the upper and lower spring sections and the top of the central frame element. The lower tip 3431-L: can be seen in FIG. 34C2 along with the bottoms of the upper and lower spring sections 3421-UC and 3421-LC and the bottom of the central frame element 3401. As can be seen by the dashed lines connecting the exploded elements, the central frame element 3401 supports the outermost lateral extents of the upper and lower spring sections, and more particularly, the standoffs 3411-1, 3411-2, 3412-1, and 3412-2 that support those cantilever elements.

FIGS. 34D1-34D4 provide four different cut views of probe 3400 with progressively larger portions of a side of the probe cut away so as to reveal the interior structure of the probe such that cantilever changes can be more readily seen and understood. As the spiral elements rotate inward toward laterally centered tip elements, the cantilever elements undergo transition from two longitudinally separated cantilever elements 3421-2U and 3421-1U above the base 3401 and two longitudinally separated cantilever elements 3421-1L and 3421-2L below the base 3401 to four longitudinally separated cantilever elements UC1-UC4 above the base and four longitudinally separated elements LC1-LC4 below the base where the beams reach their respectively longitudinally moveable tip arm elements 3431-UA and 3431-LA (best seen in FIG. 34D3) which in turn join or become tips 3431-U and 3431-L respectively.

FIG. 34E1 provides a side view of the probe 3400 similar to that of FIG. 34A but with 17 sample layer levels L1 to L17 identified with each layer having the identified thickness along the longitudinal axis of the probe (i.e. the Z-axis as shown) from which the probe can be fabricated, e.g., via a multi-layer fabrication process such as a multi-layer, multi-material electrochemical fabrication process using a single or multiple structural materials (along with a sacrificial material) and using a build axis or layer stacking axis corresponding to the longitudinal axis of the probe. In such formation embodiments, though probes may be formed one at a time, generally it is preferred to form the probes in batch with hundreds or even thousands of probes formed simultaneously by successive layer-upon-layer build up.

FIGS. 34E2-A to 34E9-B illustrate cross-sectional configurations shown in both top views (the -A figures) and in isometric views (the -B figures) for the eight unique configurations of layers L1-L17.

FIGS. 34E2-A and 34E2-B illustrate views of layers L1 and L17 wherein a tip can be seen which is the lower tip 3431-L for L1 and the upper tip 3431-U for layer L17.

FIGS. 34E3-A and 34E3-B illustrate views of L2, L4, L6, and L8 which provide portions of planar spring spirals 3421-1L, 3421-2L as well as their innermost regions that form cantilever sections LC1 to LC4 (not labeled), portions of the lower central tip arm 3431-LA, and portions of the lower standoffs 3412-1 and 3412-2 wherein double, interlaced spiral configurations can be seen.

FIGS. 34E4-A and 34E4-B illustrate views of L3 and L7 where incomplete spiral elements 3421-1L, 3421-2L and standoffs 3412-1 and 3412-2 (similar to the features of FIGS. 34E3-A and 34E3-B but with the LC1-LC4 portions missing) can be seen. The spiral portions reflected in these figures, in combination with the overlaying and underlying portions of 34E3-A and 34E3-B, form thickened spiral sections in the outer most lateral portions of the springs where the lower compliant element 3421-LC includes only two thickened cantilever elements as opposed to the four thinner cantilever elements LC1-LC4 that join the tip arm at the innermost lateral portions of the springs.

FIGS. 34E5-A and 34E5-B illustrate views of L5 that include a portion of lower tip arm 3431-LA and portions of standoffs 3412-1 and 3412-2 which provide a connection between the 3421-1L and 3421-2L cantilever spring portions.

FIGS. 34E6-A and 34E6-B illustrate views of L9 which include ring-like base 3401 that separates and connects the upper and lower compliant elements 3421-UC and 3421-LC via two portions of the base that act as standoffs where some lateral portions of the base are aligned with and engage the springs in their standoff regions 3411-1, 3411-2, 3412-1 and 3412-2. The actual beginning of the inward rotating spirals of probe 3400 depend on how the features of L8 interface with those of L9 and likewise how the features of L9 interface with those of L10. In the present embodiment, the interfaces are not perpendicular to local length of the winding spiral (e.g. such that a minimum width interface is provided) but are formed at an angle such that an outer portion of the spiral beam(s) that interface with the base are supported along their lengths by a different amount than are the inner portions. In some variations, interfaces may be provided in a manner such that the interface is provided perpendicular to the local length of the beam such that support provided by the base (or other standoff regions) provide laterally perpendicular or substantially perpendicular transitions between supported and unsupported beam regions. In the present embodiment, perpendicular transitions are provided in other beams to stand off regions as can be seen in the interfaces formed by L4 and L5, L5 and L6, L12 and L13, and L13 and L14 and in other beam splitting regions such as L2 to L3, L3 to L4, L6 to L7, L7 to L8, L10 to L11, L11 to L12, L14 to L15 and L15 to L16 where the beams transition extends along a lateral line that is substantially perpendicular to immediate or local length of the beam. Such perpendicular interfacing and non-perpendicular interfacing and their consistent or varying usage may be used in tailoring the probe performance or operational properties. In the present embodiment, due to the non-perpendicular interfacing with the base and due to interfacing provided by and between other beams of the cantilever, the outer portions of the cantilevers are provided as a single thick beam while the inner portion of the cantilever structure begins as two beams of intermediate thickness with the endings of the cantilevers at the probe arm as four thinner beams. In some variations, the initial cantilever structures (as they laterally depart from the base) may start as single thick beams or multiple beams throughout their widths. Other transitions along the beam length may also be set to provide clean or perpendicular transitions or may be set to provide variable or non-perpendicular transitions.

FIGS. 34E7-A and 34E7-B illustrate views of L10, L12, L14, and L16 which provide (1) portions of upper planar spring spirals 3421-1U and 3421-2U as well as their innermost extensions that form cantilever portions UC1 to UC4 (not labeled), (2) portions of the upper central tip arm 3431-UA, and portions of the upper standoffs 3411-1 and 3411-2 wherein double, interlaced spiral configurations can be seen. These are upper compliant element counterparts to the lower compliant element features shown in FIGS. 34E3-A and 34E3-B. A comparison of these figures shows that the rotational orientation of the spirals of the upper and lower compliant elements have reversed rotational orientations. This reversal of orientations may be considered beneficial in some embodiments and unnecessary or even detrimental in others. Upon compression of the spring elements, the tips may tend to rotate in a direction opposite the inward rotation of the spiral elements which may cause a scrubbing or scraping effect which may help break through oxide coating or cause damage to surfaces that are contacted. Reversal of scrubbing orientation between lower and upper probe tips may or may not be desirable and thus may be taken into consideration during initial probe design. Similarly, reversal of relative orientation of the separated upper spring elements is possible and as is the reversal of orientation of the separated lower spring elements.

FIGS. 34E8-A and 34E8-B illustrate views of layers L11 and L15 where incomplete spiral elements 3421-1U and 3421-2U as well as connecting regions of standoffs 3411-1 and 3411-2 can be seen that bridge portions of the spirals of FIGS. 34E7-A and 34E7-B to form thickened spiral sections in the outer most lateral portions of the springs where the upper compliant element 3421-UC includes only two thickened elements as opposed to the four thinner elements that join the tip arm 3431-UA at the innermost lateral regions of the spirals. FIGS. 34E8-A and 34E8-B provide upper compliant element counterparts to the lower compliant elements shown in 34E4-A and 34E4-B.

FIGS. 34E9-A and 34E9-B illustrate views of layer L13 that includes a portion of upper tip arm 3431-UA and portions of standoffs 3411-1 and 3411-2 which provide a connection between the cantilevers 3421-1U and 3421-2U. FIGS. 34E9-A and 34E9-B provide images of portions of upper compliant elements that are counterparts to lower compliant element counterparts found in FIGS. 34E5-A and 34E5-B.

Numerous additional variations of the embodiment of FIGS. 34A-34E9-B are possible and will be apparent to those of skill in the art upon review of the teachings herein and include, for example: (1) variations in materials; (2) variations in configurations including the number of rotations or partial rotation that each spring element incorporates, the number of interleaved springs that are used at each longitudinal level, the number of longitudinally spaced springs that are used (e.g. even numbers, odd numbers, and the like), the numbers of, and locations of, longitudinal beam transitions that occur along the length of the spirals, the direction of rotation that successive spirals take (e.g. CW-CCW-CW-CCW-CW, CW-CCW-CW-CCW-CW, and the like), the shapes of the tip, the width and thickness of the cantilever beams; (3) the use of standoffs that space one or both of the upper and lower spring modules from the annular frame, (4) the use of standoffs that are closer to the central portion of the probes as opposed to the outer perimeter of the probes; (5) the use of different types of frame or base structures and/or opening in such frame and base structures; (6) use of spring structures that are not pairs of coplanar interlaced spirals supported by different standoffs but are single spirals on a given longitudinal level or more than two interlaced spirals on a given longitudinal level and (7) variations taken from features of other embodiments and aspects set forth herein and from their variations.

FURTHER COMMENTS AND CONCLUSIONS

Numerous embodiments have been presented above, but many additional embodiments are possible without deviating from the spirit of the invention. Some of these additional embodiments may be based on a combination of the teachings herein with various teachings incorporated herein by reference. Some fabrication embodiments may use multi-layer electrochemical deposition processes while others may not. Some embodiments may use a combination of selective deposition and blanket deposition processes while others may use neither, while still others may use a combination of different processes. For example, some embodiments may not use any blanket deposition process and/or they may not use a planarization process in the formation of successive layers. Some embodiments may use selective deposition processes or blanket deposition processes on some layers that are not electrodeposition processes. Some embodiments, for example, may use nickel (Ni), nickel-phosphorous (Ni—P), nickel-cobalt (NiCo), gold (Au), copper (Cu), tin (Sn), silver (Ag), zinc (Zn), solder, rhodium (Rh), rhenium (Re), beryllium copper (BeCu), tungsten (W), rhenium tungsten (ReW), aluminum copper (AlCu), palladium (Pd), palladium cobalt (PdCo), platinum (Pt), molybdenum (Mo), manganese (Mn), steel, P7 alloy, brass, chromium (Cr), chrome, chromium copper (CrCu), other palladium alloys, copper-silver alloys, as structural materials or sacrificial materials while other embodiments may use different materials. Some of the above materials may, for example, be preferentially used for their spring properties while others may be used for their enhanced conductivity, for their wear resistance, for their barrier properties, for their thermal properties (e.g. yield strength at high temperature or high thermal conductivity), while some may be chosen for their bonding characteristics, for their separability from other materials, and even chosen for other characteristics of interest in a desired application or usage. Other embodiments may use different materials or different combinations of materials including dielectrics (e.g. ceramics, plastics, photoresist, polyimide, glass, ceramics, or other polymers), other metals, semiconductors, and the like as structural materials, sacrificial materials, or patterning materials. Some embodiments, for example, may use copper, tin, zinc, solder, photoresist or other materials as sacrificial materials. Some embodiments may use different structural materials on different layers or on different portions of single layers. Some embodiments may remove a sacrificial material while other embodiments may not. Some embodiments may form probe structures while other embodiments may use the spring modules of the present invention for non-probing purposes (e.g. to bias other operational devices with a desired spring force or compliant engagement).

The patent applications and patents referenced herein above and in the below table are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, and the like.

| U.S patent application No., Filing Date<br>U.S application Pub No., Pub Date<br>U.S patent No., Pub Date | First Named Inventor, Title |
|---|---|
| 10/271,574-Oct. 15, 2002<br>2003-0127336-Jul. 10, 2003<br>7,288,178-Oct. 30, 2007 | Cohen, "Methods of and Apparatus for Making High Aspect Ratio Microelectromechanical Structures" |
| 10/434,289-May 7, 2003<br>2004-0065555-Apr. 8, 2004 | Zhang, "Conformable Contact Masking Methods and Apparatus Utilizing In Situ Cathodic Activation of a Substrate" |
| 10/434,295-May 7, 2003<br>2004-0004001-Jan. 8, 2004 | Cohen, "Method of and Apparatus for Forming Three-Dimensional Structures Integral With Semiconductor Based Circuitry"; |
| 10/434,315-May 7, 2003<br>2003-0234179-Dec. 25, 2003<br>7,229,542-Jun. 12, 2007 | Bang, "Methods of and Apparatus for Molding Structures Using Sacrificial Metal Patterns" |
| 10/607,931-Jun. 27, 2003<br>2004-0140862-Jul. 22, 2004<br>7,239,219-Jul. 3, 2007 | Brown, et al., "Miniature RF and Microwave Components and Methods for Fabricating Such Components" |
| 10/677,556-Oct. 1, 2003<br>2004-0134772-jul. 15, 2004 | Cohen, et al., "Monolithic Structures Including Alignment and/or Retention Fixtures for Accepting Components". |
| 10/697,597-Oct. 29, 2003<br>2004-0146650-Jul. 29, 2004 | Lockard, "EFAB Methods and Apparatus Including Spray Metal or Powder Coating Processes" |
| 10/830,262-Apr. 21,2004<br>2004-0251142-Dec. 16, 2004<br>7,198,704-Apr. 3, 2007 | Cohen, "Methods of Reducing Interlayer Discontinuities in Electrochemically Fabricated Three-Dimensional Structures" |
| 10/841,006-May 7, 2004<br>2005-0067292-Mar. 31, 2005 | Thompson, et al., "Electrochemically Fabricated Structures Having Dielectric or Active Bases and Methods of and Apparatus for Producing Such Structures"; |
| 10/841,300-May 7, 2004<br>2005-0032375-Feb. 10, 2005 | Lockard et al., "Methods for Electrochemically Fabricating Structures Using Adhered Masks, Incorporating Dielectric Sheets, and/or Seed Layers that are Partially Removed Via Planarization" |
| 10/841,347-May 7, 2004<br>2005-0072681-Apr. 7, 2005 | Cohen, "Multi-step Release Method for Electrochemically Fabricated Structures" |
| 10/841,378-May 7, 2004<br>2005-0023146-Feb. 3, 2005<br>7,527,721-May 5, 2009 | Lembrikov et al., "Electrochemical Fabrication Method for Producing Multi-layer Three-Dimensional Structures Structures on a Porous Dielectric; |
| 10/841,384-May 7, 2004<br>2005-0029109-Feb. 10, 2005 | Zhang, et al., "Method of Electrochemically Fabricating Multilayer Structures Having Improved Interlayer Adhesion" |
| 10/949,744-Sep. 24, 2004<br>2005-0126916-Jun. 16, 2005<br>7,498,714-Mar. 3, 2009 | Lockard, "Multi-Layer Three-Dimensional Structures Having Features Smaller Than a Minimum Feature Size Associated with the Formation of Individual Layers" |
| 10/995,609-Nov. 22, 2004<br>2005-0202660-Sep. 15, 2005 | Cohen, et al., "Electrochemical Fabrication Process Including Process Monitoring, Making Corrective Action Decisions, and Taking Appropriate Actions" |
| 11/028,957-Jan. 3, 2005<br>2005-0202667-Sep. 15, 2005 | Cohen, "Electrochemical Fabrication Methods Incorporating Dielectric Materials and/or Using Dielectric Substrates"; |
| 11/029,216-Jan. 3, 2005<br>2005-0230261-Oct. 20, 2005 | Cohen,et al., "Electrochemical Fabrication Methods Incorporating Dielectric Materials and/or Using Dielectric Substrates" |

| U.S patent application No., Filing Date U.S application Pub No., Pub Date U.S patent No., Pub Date | First Named Inventor, Title |
|---|---|
| 11/139,262-May 26, 2005 2006-0011486-Jan. 19, 2006 7,501,328-Mar. 10, 2009 | Lockard et al., "Methods for Electrochemically Fabricating Structures Using Adhered Masks, Incorporating Dielectric Sheets, and/or Seed Layers that are Partially Removed Via Planarization" |
| 11/325,405-Jan. 3, 2006 2006-0226015-Oct. 12, 2006 12/345,624-Dec. 29, 2008 — 8,070,931-Dec. 6, 2011 | Smalley, "Method of Forming Electrcally Isolated Structures Using Thin Dielectric Coatings"; Cohen, "Electrochemical Fabrication Method Including Elastic Joining of Structures" |
| 14/194,564-Feb. 28, 2014 2014-0238865-Aug. 28, 2014 9,540,233-Jan. 10, 2017 | Kumar, "Methods of Forming Three-Dimensional Structures Having Reduced Stress and/or Curvature" |
| 14/720,719-May 22, 2015 — 9,878,401-Jan. 30, 2018 | Veeramani, "Methods of Forming Parts Using Laser Machining" |
| 14/872,033-Sep. 30, 2015 — — | Le, "Multi-Layer, Multi-Material Microscale and Millimeter Scale Batch Part Fabrication Methods Including Disambiguation of Good Parts and Defective Parts" |

It will be understood by those of skill in the art that additional operations may be used in implementing the above presented embodiments or used in variations of the above presented embodiments. These additional operations may, for example, provide: (1) surface cleanings, (2) surface activations, (3) heat treatments (e.g. to improve interlayer adhesion, to improve properties of selected materials or features of the probes, such as yield strength, spring constant and the like), (4) provide conformal coatings, (5) provide surface smoothing, roughening, or other surface conditioning, (6) provide surface texture, (7) provide doping of primary materials with secondary materials to provide improved material properties, and/or to provide (8) process monitoring, testing, and/or measurements to ensure that fabrication occurs according to specifications or other requirements (which may be set by customers, users, quality standard testing, or process standards defined by the process operator itself) as part of ensuring that manufactured parts or products that are supplied to customers or end users are fully functional and meet all requirements.

It will also be understood that the probe elements of some aspects of the invention may be formed with processes which are very different from the processes set forth herein, and it is not intended that structural aspects of the invention need to be formed by only those processes taught herein or by processes made obvious by those taught herein.

Though various portions of this specification have been provided with headers, it is not intended that the headers be used to limit the application of teachings found in one portion of the specification from applying to other portions of the specification. For example, alternatives acknowledged in association with one embodiment are intended to apply to all embodiments to the extent that the features of the different embodiments make such application functional and do not otherwise contradict or remove all benefits of the adopted embodiment.

It is intended that any aspects of the invention set forth herein represent independent invention descriptions which Applicant contemplates as full and complete invention descriptions that Applicant believes may be set forth as independent claims without need of importing additional limitations or elements, from other embodiments or aspects set forth herein, for interpretation or clarification other than when explicitly set forth in such independent claims once written. It is also understood that any variations of the aspects set forth herein represent individual and separate features that may form separate independent claims, be individually added to independent claims, or added as dependent claims to further define an invention being claimed by those respective dependent claims should they be written.

In view of the teachings herein, many further embodiments, alternatives in design and uses of the embodiments of the instant invention will be apparent to those of skill in the art. As such, it is not intended that the invention be limited to the particular illustrative embodiments, alternatives, and uses described above but instead that it be solely limited by the claims presented hereafter.

We claim:

1. A probe for making contact between two electronic circuit elements, comprising:
 (a) at least one compliant structure, comprising:
  (i) at least one standoff having a first end and a second end that are longitudinally separated;
  (ii) at least one first compliant element comprising a two-dimensional substantially planar spring when not biased, wherein the first compliant element provides compliance in a direction substantially perpendicular to a planar configuration, wherein a first portion of the first compliant element functionally joins the at least one standoff and a second portion of the first compliant element functionally joins a first tip arm that can elastically move relative to the at least one standoff, wherein the first tip arm directly or indirectly holds a first tip end that extends longitudinally beyond the first end of the at least one standoff when the first compliant element is not biased;
  (iii) at least one second compliant element comprising a spring, wherein the second compliant element provides compliance in a direction substantially perpendicular to the planar configuration, wherein a first portion of the second compliant element functionally joins the at least one standoff and a second portion of the second compliant element functionally joins a second tip arm that can elastically move relative to the at least one standoff, wherein the second tip arm directly or indirectly holds a second tip end that extends longitudinally beyond the second end of the at least one standoff when the second compliant element is not biased; and (iv) an annular base holding the first compliant element and the second compliant element by their outermost lateral extents;

wherein the first portion of the first compliant element and the first portion of the second compliant element are longitudinally spaced from one another by the at least one standoff and by the annular base, wherein upon biasing of at least one of the first and second tip ends toward the other, the second portion of the first compliant element and the second portion of the second compliant element move longitudinally closer together, and wherein the first compliant element begins at a portion of the at least one standoff as a beginning number of first cantilevers wherein the beginning number is selected from the group consisting of: (a) at least one first planar cantilever, and (b) at least two first planar cantilevers that are longitudinally separated, and wherein the beginning number of cantilevers ends at the first tip arm as a first plurality of longitudinally separated cantilevers where the first plurality comprises the beginning number plus N where N is at least one.

2. The probe of claim 1 wherein the first portion of the first compliant element is located closer to the first end of the at least one standoff than is the first portion of the second compliant element and the first portion of the second compliant element is located closer to the second end of the at least one standoff than is the first portion of the first compliant element.

3. The probe of claim 2 wherein the spring of the second compliant element has a two-dimensional substantially planar configuration, when not biased, that is substantially parallel to the planar configuration of the planar spring of the first compliant element.

4. The probe of claim 1 wherein the first compliant element comprises at least two co-planar cantilever springs at a same longitudinal height that are laterally interleaved with one another and are attached to the first tip arm and with each being attached to laterally displaced locations on the at least one standoff.

5. The probe of claim 4 wherein the laterally displaced locations are located on two laterally separated portions of the at least one standoff that are in turn functionally and rigidly connected to one another via at least one laterally extending bridge element.

6. The probe of claim 5 wherein at least one bridge functions as at least a portion of the at least one standoff as it provides at least a portion of a longitudinal separation between the first and second compliant elements and wherein the at least one first compliant element comprises at least one first planar spiral that extends, at least in part, from the at least one standoff to the first tip arm.

7. The probe of claim 6 wherein the at least one first planar spiral has a configuration selected from the group consisting of: (i) an inward rotating circular spiral, (ii) an inward rotating rectangular spiral, (iii) an inward rotating hexagonal spiral, (iv) an inward rotating octagonal spiral, (v) an inward rotating counterclockwise spiral as observed looking from the first tip end toward the second tip end, and (vi) an inward rotating clockwise spiral as observed looking from the first tip end toward the second tip end.

8. The probe of claim 7 wherein at least one first planar spiral has a rotational extent selected from the group consisting of: (i) at least 180°, (ii) at least 360°, (iii) at least 540°, and (iv) at least 720°.

9. The probe of claim 8 wherein the at least one second compliant element comprises at least one second planar spiral that extends from the at least one standoff to the second tip arm.

10. The probe of claim 9 wherein the at least one second planar spiral of the second compliant element has a configuration selected from the group consisting of: (i) an inward rotating circular spiral, (ii) an inward rotating rectangular spiral, (iii) an inward rotating hexagonal spiral, (iv) an inward rotating octagonal spiral, (v) an inward rotating counterclockwise spiral as observed looking from the second tip end toward the first tip end, and (vi) an inward rotating clockwise spiral as observed looking from the second tip end toward the first tip end.

11. The probe of claim 10 wherein at least one second spiral of the second compliant element has a rotational extent selected from the group consisting of: (i) at least 180°, (ii) at least 360°, (iii) at least 540°, and (iv) at least 720°.

12. The probe of claim 11 wherein the at least one compliant structure further comprises a base located longitudinally between the first and second compliant elements and forms part of the at least one standoff wherein the base has at least some lateral extents that are larger than those of at least one of the first compliant element or the second compliant element.

13. The probe of claim 12 wherein the base has an annular configuration.

14. The probe of claim 13 wherein the planar spring of at least one of the at least one first compliant element has a first rotational orientation and the spring of at least one of the at least one second compliant element is planar and has a second rotational orientation wherein the first rotational orientation and second rotational orientation are selected from the group consisting of: (1) the same orientation, and (2) different orientations.

15. The probe of claim 14 wherein N is selected from the group consisting of at least 2, 3, 4, 5, 6, 7, and 8.

16. The probe of claim 1 wherein the second compliant element begins at a portion of the at least one standoff as a beginning number of second cantilevers wherein the beginning number of second cantilevers is selected from the group consisting of: (1) at least one second planar cantilever, and (2) at least two second planar cantilevers that are longitudinally separated, and wherein the beginning number of the second cantilevers ends at the second tip arm as a second plurality of longitudinally separated cantilevers where the second plurality of comprises the beginning number plus P where P is at least one.

17. The probe of claim 16 wherein N is selected from the group consisting of at least 2, 3, 4, 5, 6, 7, and 8 and wherein P is selected from the group consisting of at least 2, 3, 4, 5, 6, 7, and 8.

18. The probe of claim 1 wherein the annular base has a circular exterior with an interior opening that has opposing arcuate sides and narrower opposing flat sides as well as upper and lower surfaces joining the flat sides and providing attachment regions for the at least one standoff, in turn supporting the ends of the first and second compliant elements and the arcuate sides providing gaps over which outermost portions of the first and second compliant elements can reside, prior to any deformation.

19. The probe of claim 18 wherein the first and second compliant elements comprise respective first and second spiral spring elements having first ends supported by the at least one standoff and outermost portions that can reside in the gaps provided by the arcuate sides of the interior opening of the annular base.

20. The probe of claim 19 wherein the first spiral spring elements of the first compliant element start an inward path from a first standoff above the annular base and the second spiral spring elements of the second compliant element start an inward path from a second standoff below the annular base, the first and second standoffs being an opposing pairs of standoff and the first and second compliant elements being longitudinally separated co-planar pairs of winding spiral cantilevers.

21. The probe of claim 20 wherein the first spiral spring elements of the first compliant element have rotational orientations opposite to rotational orientations of the second spiral spring elements of the second compliant element.

22. The probe of claim 20 wherein the spiral cantilevers of each compliant element divide into a plurality of longitudinally spaced cantilevers partway through their inward treks such that a plurality of first cantilever elements join each side of the first tip arm and a plurality of second cantilever elements join either side of the second tip arm that in turn respectively support the first and second probe tips.

23. The probe of claim 1 wherein the first portion of the first compliant element is located closer to the first end of the at least one standoff than is the first portion of the second compliant element and the first portion of the second compliant element is located closer to the second end of the at least one standoff than is the first portion of the first compliant element.

24. The probe of claim 1 wherein the annular base is a rigid annular base.

25. The probe of claim 1 wherein the annular base and the at least one standoff are directly in contact or made integral one another.

* * * * *